(12) United States Patent
Miyazaki et al.

(10) Patent No.: US 12,178,123 B2
(45) Date of Patent: Dec. 24, 2024

(54) ORGANIC ELECTROLUMINESCENCE DEVICE AND COMPOUND FOR ORGANIC ELECTROLUMINESCENCE DEVICE

(71) Applicants: Samsung Display Co., LTD., Yongin-si (KR); KYUSHU UNIVERSITY, NATIONAL UNIVERSITY CORPORATION, Fukuoka (JP)

(72) Inventors: Yuuki Miyazaki, Yokohama (JP); Yuji Suzaki, Yokohama (JP); In Seob Park, Fukuoka (JP); Takuma Yasuda, Fukuoka (JP); Jong Uk Kim, Fukuoka (JP); Hyukgi Min, Fukuoka (JP)

(73) Assignees: SAMSUNG DISPLAY CO., LTD., Yongin-si (KR); KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 553 days.

(21) Appl. No.: 17/179,837

(22) Filed: Feb. 19, 2021

(65) Prior Publication Data
US 2021/0351361 A1    Nov. 11, 2021

(30) Foreign Application Priority Data

Apr. 29, 2020  (KR) .................. 10-2020-0052327

(51) Int. Cl.
*H01L 51/00*   (2006.01)
*H10K 50/12*   (2023.01)
(Continued)

(52) U.S. Cl.
CPC ........... *H10K 85/656* (2023.02); *H10K 50/12* (2023.02); *H10K 85/40* (2023.02); *H10K 85/6572* (2023.02); *H10K 85/6574* (2023.02)

(58) Field of Classification Search
CPC ............................ H10K 85/322; H10K 85/40
See application file for complete search history.

(56) References Cited

U.S. PATENT DOCUMENTS 10,333,085 B2   6/2019  Nakano et al.
10,374,166 B2   8/2019  Hatakeyama et al.
(Continued)

FOREIGN PATENT DOCUMENTS

CN      108774258      11/2018
KR   10-2018-0007727    1/2018
(Continued)

OTHER PUBLICATIONS

UCAR—Center for Science Education, "Wavelength of Blue and Red Ligh", pp. 1-2.*
(Continued)

*Primary Examiner* — Alexander C Kollias
(74) *Attorney, Agent, or Firm* — KILE PARK REED & HOUTTEMAN PLLC

(57) ABSTRACT

An organic electroluminescence device exhibiting high light emission efficiency is provided, which includes a first electrode, a second electrode, and an emission layer disposed between the first electrode and the second electrode. The emission layer may include a compound represented by Formula 1.

(Continued)

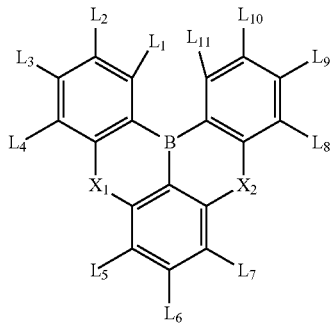

[Formula 1]

19 Claims, 2 Drawing Sheets

(51) Int. Cl.
*H10K 85/40* (2023.01)
*H10K 85/60* (2023.01)

(56) References Cited

U.S. PATENT DOCUMENTS

| | | | |
|---|---|---|---|
| 10,651,395 B2 | 5/2020 | Iijima et al. | |
| 2006/0113907 A1* | 6/2006 | Im | H10K 50/858 |
| | | | 313/512 |
| 2015/0236274 A1* | 8/2015 | Hatakeyama | H10K 85/322 |
| | | | 548/405 |
| 2018/0019415 A1 | 1/2018 | Nakano et al. | |
| 2019/0312210 A1 | 10/2019 | Akashi et al. | |
| 2020/0028084 A1* | 1/2020 | Song | C07C 211/61 |
| 2020/0176679 A1 | 6/2020 | Jeong et al. | |
| 2020/0403158 A1 | 12/2020 | Yamatani | |
| 2021/0053998 A1* | 2/2021 | Kim | H10K 85/6572 |

FOREIGN PATENT DOCUMENTS

| | | |
|---|---|---|
| KR | 10-1876763 | 7/2018 |
| KR | 10-1886773 | 8/2018 |
| KR | 10-1976556 | 5/2019 |
| KR | 10-2019-0117038 | 10/2019 |
| KR | 10-2020-0145945 | 12/2020 |
| KR | 10-2021-0088445 | 7/2021 |
| WO | 2017/018326 | 2/2017 |

OTHER PUBLICATIONS

Dongdong Song et al., "Asymmetric thermally activated delayed fluorescence (TADF) emitters with 5,9-dioxa-13b-boranaphtho[3,2,1-de]anthracene (OBA) as the acceptor and highly efficient blue-emitting OLEDs", Journal of Materials Chemistry C, Sep. 3, 2019, pp. 11953-11963, vol. 7.

Guoyun Meng et al., "Isomeric Bright Sky-Blue TADF Emitters Based on Bisacridine Decorated DBNA: Impact of Donor Locations on Luminescent and Electroluminescent Properties", Advanced Optical Materials, Mar. 25, 2019, pp. 1-14, vol. 7, No. 1900130.

Hiroki Hirai et al., "One-Step Borylation of 1,3-Diaryloxybenzenes Towards Efficient Materials for Organic Light-Emitting Diodes", Angewandte Chemie International Edition, Sep. 18, 2015, pp. 13581-13585, vol. 54.

* cited by examiner

ORGANIC ELECTROLUMINESCENCE DEVICE AND COMPOUND FOR ORGANIC ELECTROLUMINESCENCE DEVICE

CROSS-REFERENCE TO RELATED APPLICATION(S)

This application claims priority to and benefits of Korean Patent Application No. 10-2020-0052327 under 35 U.S.C. § 119, filed on Apr. 29, 2020 in the Korean Intellectual Property Office, the entire contents of which are incorporated herein by reference.

BACKGROUND

1. Technical Field

The disclosure relates to a compound used as a luminescence material and an organic electroluminescence device including the same.

2. Description of the Related Art

Recently, active development is being conducted for an organic electroluminescence display as an image display device. In contrast to liquid crystal display devices and the like, the organic electroluminescence display is a so-called self-luminescent display device in which holes and electrons injected from a first electrode and a second electrode recombine in an emission layer, and thus a luminescent material including an organic compound in the emission layer emits light to implement display.

In the application of an organic electroluminescence device to a display device, there is a continuous demand for an organic electroluminescence device having a low driving voltage, high light emission efficiency, and a long service life, and for the development of materials for an organic electroluminescence device that is capable of stably attaining such characteristics.

In order to implement a highly efficient organic electroluminescence device in recent years, technologies pertaining to phosphorescence emission using triplet state energy or delayed fluorescence using triplet-triplet annihilation (TTA) in which singlet excitons are generated by collision of triplet excitons are being developed, and thermally activated delayed fluorescence (TADF) materials using delayed fluorescence phenomenon are being developed.

SUMMARY

The disclosure provides an organic electroluminescence device exhibiting excellent light emission efficiency.

The disclosure also provides a compound which is a material for an organic electroluminescence device emitting deep-blue light and having high efficiency characteristics.

An embodiment of the inventive concept provides a compound represented by Formula 1:

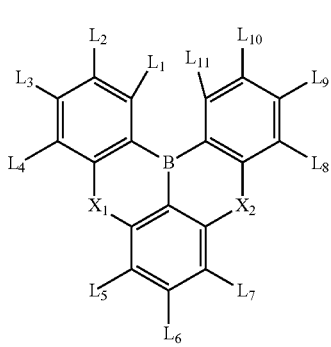

[Formula 1]

In Formula 1, $X_1$ and $X_2$ may each independently be O or S, and at least one of $L_1$ to $L_{11}$ may be a substituent represented by Formula 2-a or Formula 2-b, the remainder of $L_1$ to $L_{11}$ may each independently be a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

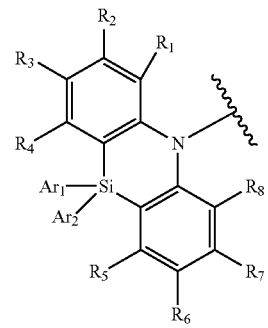

[Formula 2-a]

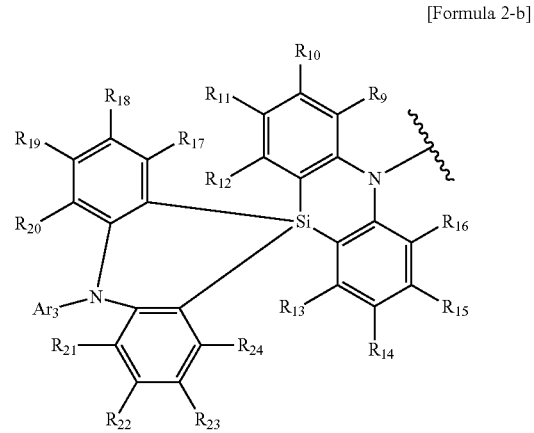

[Formula 2-b]

In Formula 2-a and Formula 2-b, $R_1$ to $R_{24}$ may each independently be a hydrogen atom, a deuterium atom, a halogen atom, a cyano group, a substituted or unsubstituted amine group, a substituted or unsubstituted silyl group, a substituted or unsubstituted boron group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ and $Ar_2$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Ar_3$ may be a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or a substituent represented by Formula 1. When $Ar_3$ is a substituent represented by Formula 1, $L_1$ to $L_{11}$ in $Ar_3$ may each independently be a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, Formula 1 may be represented by one of Formula 1-1 to Formula 1-3:

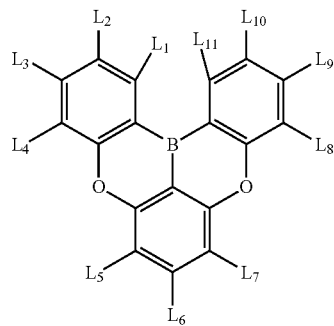

[Formula 1-1]

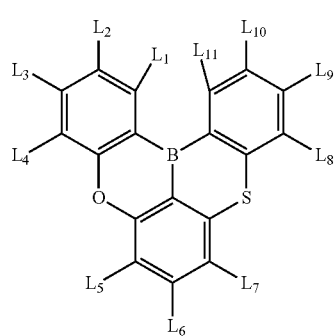

[Formula 1-2]

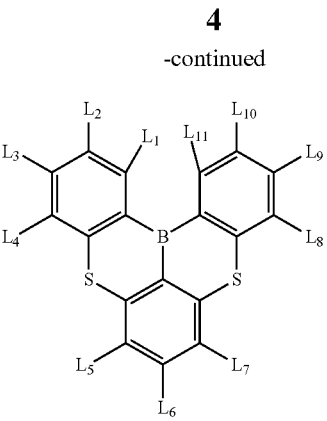

[Formula 1-3]

In Formula 1-1 to Formula 1-3, $L_1$ to $L_{11}$ may be the same as defined in Formula 1.

In an embodiment, Formula 1 may be represented by one of Formula 1A to Formula 1E:

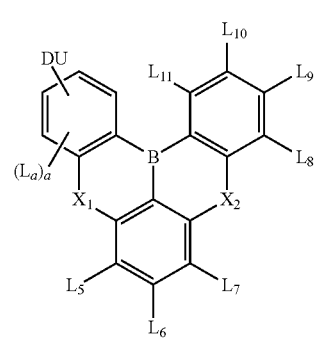

[Formula 1A]

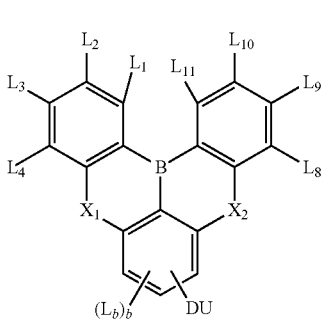

[Formula 1B]

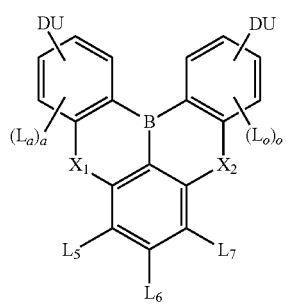

[Formula 1C]

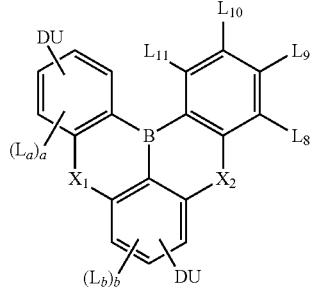

[Formula 1D]

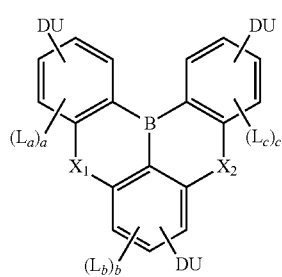

[Formula 1E]

In Formula 1A to Formula 1E, a to c may each independently be an integer from 0 to 3, $X_1$ and $X_2$ may be the same as defined in Formula 1, $L_a$ to $L_c$ and $L_1$ to $L_{11}$ may each independently be a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and DU may be represented by Formula 2-a or Formula 2-b.

In an embodiment, Formula 1 may be represented by Formula 1F:

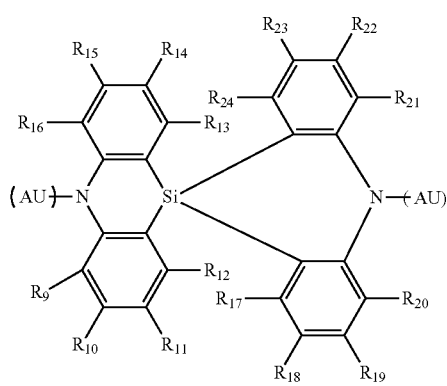

[Formula 1F]

In Formula 1F, $R_9$ to $R_{24}$ may be the same as defined in Formula 2-b, AU may be a substituent represented by Formula 1, except that AU may not be substituted with a substituent represented by Formula 2-a or Formula 2-b.

In an embodiment, Formula 1 may be represented by one of Formula 1F-1 to Formula 1F-3:

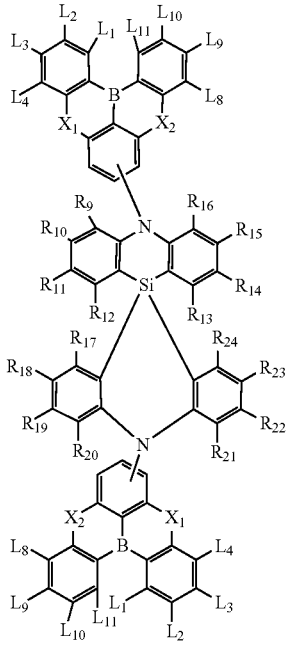

[Formula 1F-1]

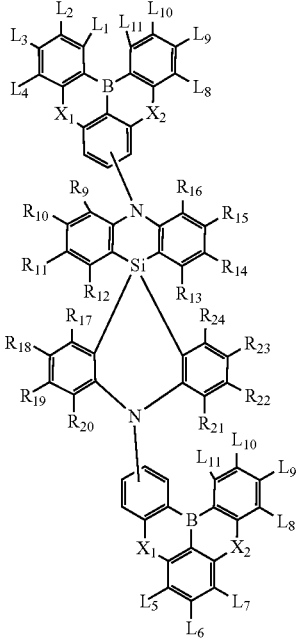

[Formula 1F-2]

[Formula 1F-3]

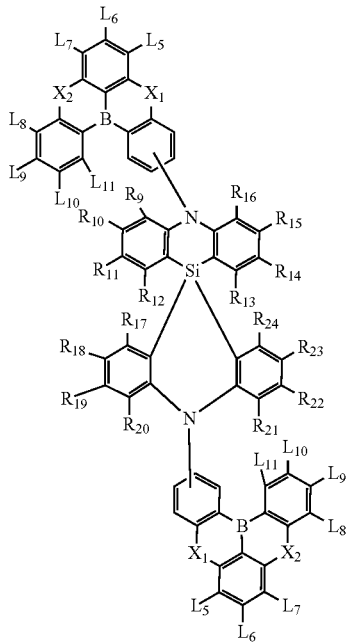

In Formula 1F-1 to Formula 1F-3, $L_1$ to $L_{11}$ may each independently be a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $X_1$ and $X_2$ may be the same as defined in Formula 1, and $R_9$ to $R_{24}$ may be the same as defined in Formula 2-b.

In an embodiment, in Formula 1, at least one hydrogen atom may be substituted with a deuterium atom.

In an embodiment, in Formula 1, $Ar_1$ and $Ar_2$ may each independently be an unsubstituted phenyl group, a phenyl group substituted with a deuterium atom, an unsubstituted biphenyl group, an unsubstituted naphthyl group, or an unsubstituted dibenzothiophene group.

In an embodiment, the compound represented by Formula 1 may be a blue luminescent material.

In an embodiment, the compound represented by Formula 1 may be a thermally activated delayed fluorescence emitting material.

Another embodiment of the inventive concept provides an organic electroluminescence device including a first electrode, a second electrode disposed on the first electrode, and an emission layer disposed between the first electrode and the second electrode.

The emission layer may include a compound represented by Formula 1.

In an embodiment, the organic electroluminescence device may further include a capping layer disposed on the second electrode, and the capping layer may have a refractive index of greater than or equal to about 1.6.

In an embodiment, the emission layer may be a delayed fluorescence emission layer containing a host and a dopant, and the dopant may include the compound represented by Formula 1.

In an embodiment, the emission layer may emit blue light having a center wavelength in a range of about 430 nm to about 490 nm.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
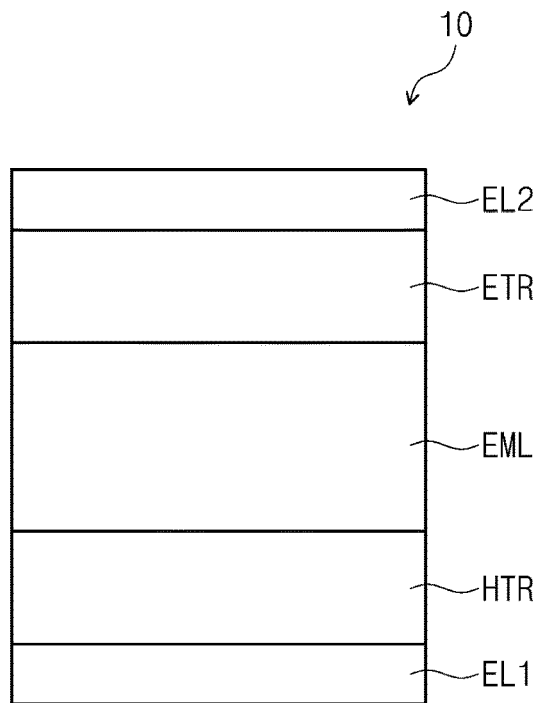
FIG. 1 is a schematic cross-sectional view illustrating an organic electroluminescence device according to an embodiment of the inventive concept.

The inventive concept may have various modifications and may be embodied in different forms, and example embodiments will be explained in detail with reference to the accompanying drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

In the description, it will be understood that when an element (a region, a layer, a section, or the like) is referred to as being "on", "connected to" or "coupled to" another element, it can be directly on, connected or coupled to the other element, or an intervening third element may be disposed therebetween.

Like reference numerals refer to like elements throughout the specification. In the drawings, the thickness, the ratio, and the dimensions of elements may be exaggerated for an effective description of technical contents.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B, and C" may indicate only A, only B, only C, both A and B, both A and C, both B and C, all of A, B, and C, or variations thereof.

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept. The terms of a singular form may include plural forms unless the context clearly indicates otherwise.

The terms "below," "lower," "above," "upper," and the like are used to describe the relationship of the configurations shown in the drawings. The terms are used as a relative concept and are described with reference to the direction indicated in the drawings.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within +20%, 10%, or 5% of the stated value.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprises," "comprising," "includes," "including," "have," "having," "contains," and/or "containing" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the inventive concept and a compound of an embodiment included therein will be described with reference to the accompanying drawings.

FIGS. 1 to 4 are schematic cross-sectional views illustrating organic electroluminescence devices according to embodiments of the inventive concept. Referring to FIGS. 1 to 4, in each of organic electroluminescence devices 10 according to embodiments, a first electrode EL1 and a second electrode EL2 are disposed to face each other and an emission layer EML may be disposed between the first electrode EL1 and the second electrode EL2.

Each of the organic electroluminescence devices 10 of the embodiments may further include functional layers between the first electrode EL1 and the second electrode EL2 in addition to the emission layer EML. The functional layers may include a hole transport region HTR and an electron transport region ETR. For example, each of the organic electroluminescence devices 10 according to embodiments may include the first electrode EL1, the hole transport region HTR, the emission layer EML, the electron transport region ETR, and the second electrode EL2 that may be sequentially stacked. The organic electroluminescence device 10 of an embodiment may include a capping layer CPL disposed on the second electrode EL2.

The organic electroluminescence device 10 of an embodiment may include a compound according to an embodiment described below in the emission layer EML disposed between the first electrode EL1 and the second electrode EL2. However, embodiments are not limited thereto, and the organic electroluminescence device 10 of an embodiment may include a compound according to an embodiment described below in the hole transport region HTR or the electron transport region ETR which is one of the functional layers disposed between the first electrode EL1 and the second electrode EL2, as well as in the emission layer EML.

Figure 2:
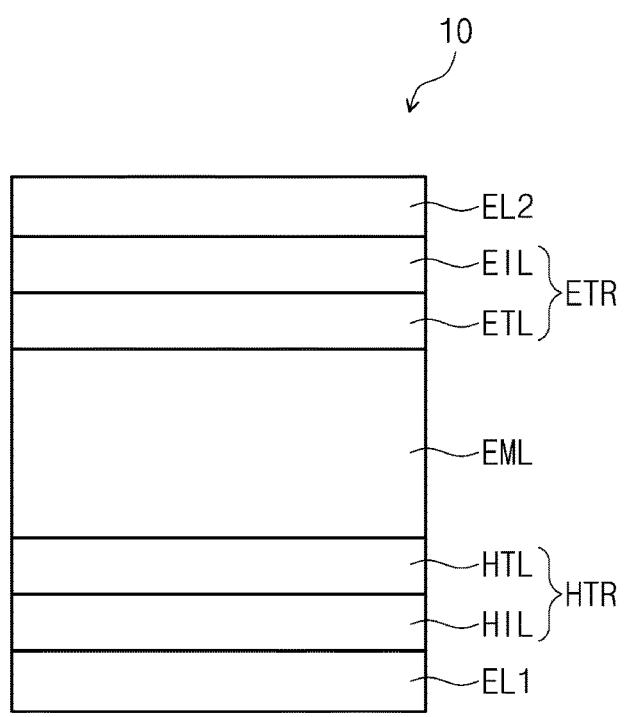
FIG. 2 is a schematic cross-sectional view illustrating an organic electroluminescence device according to an embodiment of the inventive concept.
Figure 3:
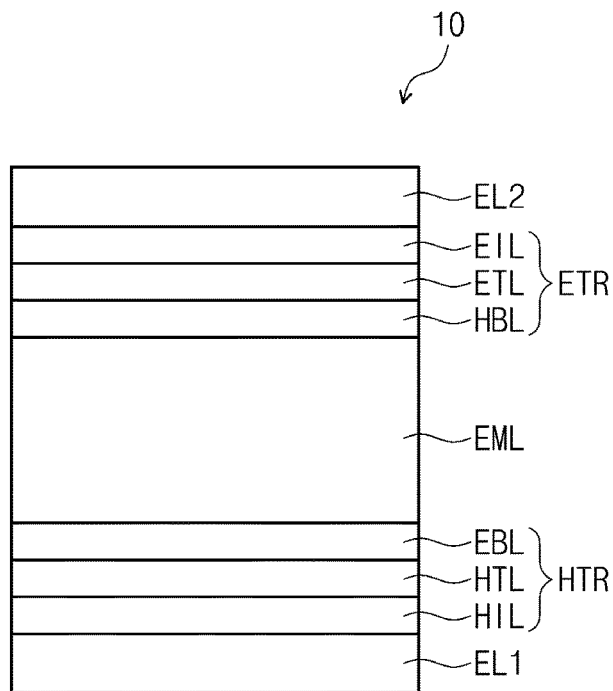
FIG. 3 is a schematic cross-sectional view illustrating an organic electroluminescence device according to an embodiment of the inventive concept.
Figure 4:
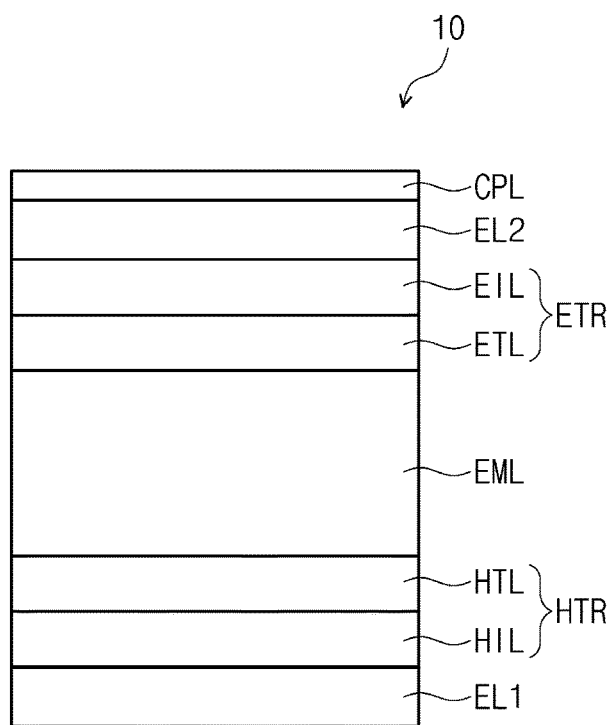
FIG. 4 is a schematic cross-sectional view illustrating an organic electroluminescence device according to an embodiment of the inventive concept.

In comparison to FIG. 1, FIG. 2 illustrates a schematic cross-sectional view of an organic electroluminescence device 10 of an embodiment, in which a hole transport region HTR includes a hole injection layer HIL and a hole transport layer HTL, and an electron transport region ETR includes an electron injection layer EIL and an electron transport layer ETL. In comparison to FIG. 1, FIG. 3 illustrates a schematic cross-sectional view of an organic electroluminescence device 10 of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 2, FIG. 4 illustrates a schematic cross-sectional view of an organic electroluminescence device 10 of an embodiment including a capping layer CPL disposed on the second electrode EL2.

The first electrode EL1 has a conductivity. The first electrode EL1 may be formed of a metal alloy or a conductive compound. The first electrode EL1 may be an anode. The first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide, such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In other embodiments, the first electrode EL1 may have a multilayer structure including a reflective layer or a transflective layer formed of the above-described materials, and a transparent conductive layer formed of ITO, IZO, ZnO, ITZO, etc. For example, the first electrode EL1 may have a three-layer structure of ITO/Ag/ITO, but is not limited thereto. The thickness of the first electrode EL1 may be in a range of about 1,000 Å to about 10,000 Å. For example, the thickness of the first electrode EL1 may be in a range of about 1,000 Å to about 3,000 Å.

The hole transport region HTR may be provided on the first electrode EL1. The hole transport region HTR may include at least one of a hole injection layer HIL, a hole transport layer HTL, a hole buffer layer (not shown), or an electron blocking layer. The thickness of the hole transport region HTR may be, for example, in a range of about 50 Å to about 15,000 Å.

The hole transport region HTR may have a single layer formed of a single material, a single layer formed of different materials, or a multilayer structure including layers formed of different materials.

For example, the hole transport region HTR may have a single layer structure of a hole injection layer HIL or a hole transport layer HTL, and may have a single layer structure formed of a hole injection material and a hole transport material. The hole transport region HTR may have a single layer structure formed of different materials, or it may have a structure in which a hole injection layer HIL/hole transport layer HTL, a hole injection layer HIL/hole transport layer HTL/hole buffer layer (not shown), a hole injection layer HIL/hole buffer layer (not shown), a hole transport layer HTL/hole buffer layer, or a hole injection layer HIL/hole transport layer HTL/electron blocking layer EBL are stacked in order from the first electrode EL1, but an embodiment is not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine](m-MTDATA), 4,4',4"-tris(N,N-diphenylamino)triphenylamine (TDATA), 4,4',4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f. 2',3'-h]quinoxaline-2,3,6,7,10,11-hexacarbonitrile (HAT-CN), etc.

The hole transport layer HTL may include, for example, carbazole derivatives such as N-phenyl carbazole and polyvinyl carbazole, fluorene derivatives, N4,N4'-di(naphthalen-1-yl)-N4,N4'-diphenyl-[1,1'-biphenyl]-4,4'-diamine (α-NPD), N,N'-bis(3-methylphenyl)-N,N'-diphenyl-[1,1-biphenyl]-4,4'-diamine (TPD), triphenylamine derivatives such as 4,4',4"-tris(N-carbazolyl)triphenylamine (TCTA), N,N'-di(naphthalenyl)-N,N'-diphenyl-benzidine (NPB), 4,4'-cyclohexylidene bis[N,N-bis(4-methylphenyl]benzenamine](TAPC), 4,4'-bis[N,N'-(3-tolyl)amino]-3,3'-dimethylbiphenyl (HMTPD), 1,3-bis(N-carbazolyl)benzene (mCP), etc.

The electron blocking layer EBL may include, for example, 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The thickness of the hole transport region HTR may be in a range of about 50 Å to about 10,000 Å. For example, the thickness of the hole transport region HTR may be in a range of about 100 Å to about 5,000 Å. The thickness of the hole injection layer HIL may be, for example, in a range of about 30 Å to about 1,000 Å, and the thickness of the hole transport layer HTL may be in a range of about 30 Å to about 1,000 Å. For example, the thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without a substantial increase in driving voltage.

The hole transport region HTR may further include a charge generating material to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, but is not limited thereto. For example, non-limiting examples of the p-dopant may include, but are not limited to, quinone derivatives such as tetracyanoquinodimethane (TCNQ) and 2,3,5,6-tetrafluoro-7,7,8,8-tetracyanoquinodimethane (F4-TCNQ), metal oxides such as tungsten oxides and molybdenum oxides.

As described above, the hole transport region HTR may further include at least one of a hole buffer layer (not shown) or an electron blocking layer EBL in addition to the hole injection layer HIL and the hole transport layer HTL. The hole buffer layer (not shown), may compensate a resonance distance according to the wavelength of light emitted from an emission layer EML and may increase light emission efficiency. Materials which may be included in the hole transport region HTR may be used as materials which may be included in the hole buffer layer (not shown). The electron blocking layer EBL is a layer that serves may serve to prevent electrons from being injected from the electron transport region ETR to the hole transport region HTR.

The emission layer EML is provided on the hole transport region HTR. The thickness of the emission layer EML may be in a range of about 100 Å to about 1000 Å. For example, the thickness of the emission layer EML may be in a range of about 100 Å to about 300 Å. The emission layer EML may have a single layer formed of a single material, a single layer formed of different materials, or a multilayer structure having layers formed of different materials.

The emission layer EML in the organic electroluminescence device 10 of an embodiment may include a compound of an embodiment.

The compound according to an embodiment may include at least one azasiline unit and at least one condensed cyclic unit containing a boron atom (B). In the compound according to an embodiment, the condensed cyclic unit may include two heteroatoms selected from among an oxygen atom (O) and a sulfur atom (S) in addition to the boron atom. In the compound of an embodiment, the condensed cyclic unit may have a structure in which five hexacyclic rings are condensed, and the heteroatom may include a boron atom.

In the compound of an embodiment, the azasiline unit may include one azasiline moiety, or may have a spiro structure in which two azasiline moieties are bonded.

The compound of an embodiment may include a condensed cyclic unit containing a boron atom as an electron acceptor, and an azasiline unit as an electron donor. The compound of an embodiment may have a structure in which at least one electron acceptor and at least one electron donor are bonded.

In the description, the term "substituted or unsubstituted" may indicate that one is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boryl group, a phosphine oxide group, a phosphine sulfide group, an alkyl group, an alkenyl group, an alkynyl group, an alkoxy group, a hydrocarbon ring group, an aryl group, and a heterocyclic group. Each of the substituents described above may be substituted or unsubstituted. For example, a biphenyl group may be interpreted as an aryl group or a phenyl group substituted with a phenyl group.

In the description, examples of the halogen atom may include a fluorine atom, a chlorine atom, a bromine atom, and an iodine atom.

In the description, the alkyl group may be a linear, branched or cyclic type. The number of carbons in the alkyl group is 1 to 50, 1 to 30, 1 to 20, 1 to 10, or 1 to 6. Examples of the alkyl group may include, but are not limited to, methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-heneicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, an aryl group means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., but are not limited thereto.

In the description, the heteroaryl group may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidyl, pyrido pyrazinyl, pyrazino pyrazinyl, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophenyl, thienothiophene, benzofuranyl, phenanthroline, thiazolyl, isooxazolyl, oxadiazolyl, thiadiazolyl, phenothiazolyl, phenothiazinyl, dibenzosilole, dibenzofuranyl, etc., but are not limited thereto.

In the description, the silyl group includes an alkyl silyl group and an aryl silyl group. Examples of the silyl group may include, but are not limited to, trimethylsilyl, triethylsilyl, t-butyldimethylsilyl, propyldimethylsilyl, triphenylsilyl, diphenylsilyl, phenylsilyl, etc.

In the description, the number of carbon atoms in an amine group is not specifically limited, but may be 1 to 30. The amine group may include an alkyl amine group and an aryl amine group. Examples of the amine group may include, but are not limited to, methylamine group, dimethylamine group, phenylamine group, diphenylamine group, naphthylamine group, 9-methyl-anthracenylamine group, triphenylamine group, etc.

In the description, the boron group includes an alkyl boron group and an aryl boron group. Examples of the boron group may include, but are not limited to, trimethylboron, triethylboron, t-butyldimethylboron, triphenylboron, diphenylboron, phenylboron, etc.

In the description, the alkyl group in the alkylaryl group, the alkyl boron group, the alkyl silyl group, and the alkyl amine group is the same as examples of the alkyl group described above.

In the description, the aryl group in the aryl boron group, the aryl silyl group, and the aryl amine group is the same as examples of the aryl group described above.

In the description, -$\frac{1}{2}$- refers to a binding site to a neighboring atom.

The emission layer EML in the organic electroluminescence device 10 of an embodiment may include a compound represented by Formula 1.

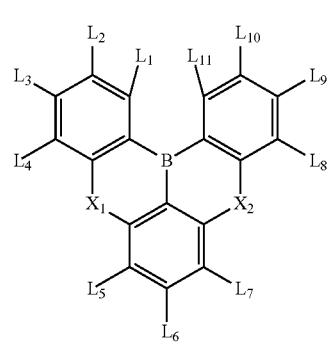

[Formula 1]

In Formula 1, $X_1$ and $X_2$ may each independently be O or S. For example, both $X_1$ and $X_2$ may be O, both $X_1$ and $X_2$ may be S, or one among $X_1$ and $X_2$ may be O, and the other may be S.

In Formula 1, at least one of $L_1$ to $L_{11}$ may be a substituent represented by Formula 2-a or Formula 2-b. For example, in Formula 1, one selected from $L_1$ to $L_{11}$, two selected from $L_1$ to $L_{11}$, or three selected from $L_1$ to $L_{11}$ may be a substituent represented by Formula 2-a or Formula 2-b.

In the case where one of $L_1$ to $L_{11}$ is a substituent represented by Formula 2-a or Formula 2-b, and the remainder of $L_1$ to $L_{11}$ may each independently be a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

For example, in Formula 1, in the case where one of $L_1$ to $L_{11}$ is a substituent represented by Formula 2-a or Formula 2-b, the remainder of $L_1$ to Ln may each independently be a hydrogen atom, a deuterium atom, a fluorine atom, a cyano group, an aryl amine group, an aryl silyl group, an aryl boron group, a linear alkyl group, a branched alkyl group, an unsubstituted aryl group, an aryl group substituted with a deuterium atom, or an unsubstituted heteroaryl group. However, the embodiments are not limited thereto. The case where $L_1$ to $L_{11}$ are cyclic alkyl groups may be excluded.

In the compound represented by Formula 1 of an embodiment, at least one of $L_1$ to $L_{11}$ may be represented by Formula 2-a or Formula 2-b:

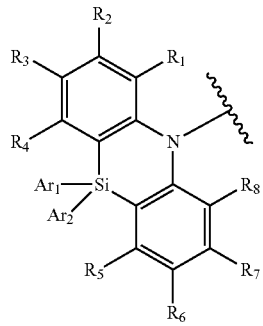

[Formula 2-b]

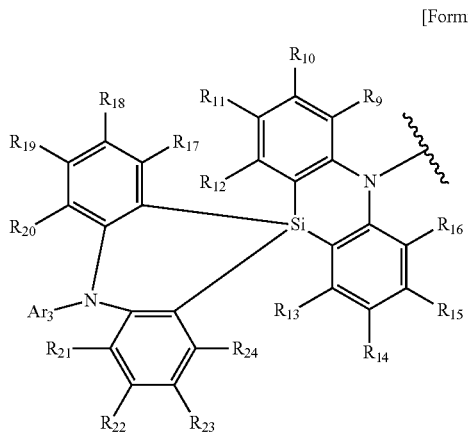

[Formula 2-b]

In Formula 2-a and Formula 2-b, $R_1$ to $R_{24}$ may each independently be a hydrogen atom, a deuterium atom, a halogen atom, a cyano group, a substituted or unsubstituted amine group, a substituted or unsubstituted silyl group, a substituted or unsubstituted boron group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, in Formula 2-a and Formula 2-b, $R_1$ to $R_{24}$ may each independently be a hydrogen atom, a deuterium atom, a fluorine atom, a cyano group, an aryl amine group, an aryl silyl group, an aryl boron group, a linear alkyl group, a branched alkyl group, an unsubstituted aryl group, an aryl group substituted with a deuterium atom, or an unsubstituted heteroaryl group, etc. However, the embodiments are not limited thereto.

In Formula 2-a, $Ar_1$ and $Ar_2$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $Ar_1$ and $Ar_2$ may each independently be an unsubstituted phenyl group, a phenyl group substituted with a deuterium atom, an unsubstituted biphenyl group, an unsubstituted naphthyl group, or an unsubstituted dibenzothiophene group. $Ar_1$ and $Ar_2$ may be the same as or different from each other. However, the embodiments are not limited thereto.

In Formula 2-b, $Ar_3$ is a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or a substituent represented by Formula 1.

In Formula 2-b, when $Ar_3$ is a substituent represented by Formula 1 as described above, the case where $L_1$ to $L_{11}$ in $Ar_3$ are azasiline units represented by Formula 2-a or Formula 2-b may be excluded. For example, in Formula 2-b, when $Ar_3$ is a substituent represented by Formula 1 as described above, $L_1$ to $L_{11}$ in $Ar_3$ may each independently be a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula 2-b, $Ar_3$ may be a substituted or unsubstituted phenyl group. For example, $Ar_3$ may be a substituent represented by Formula 1 as described above, or an unsubstituted phenyl group.

In the compound of an embodiment, at least one hydrogen atom may be substituted with a deuterium atom. For example, all the hydrogen atoms in the compound of an embodiment may be substituted with deuterium atoms. For example, a substituent represented by Formula 2-a or Formula 2-b in the compound represented by Formula 1 of an embodiment may be excluded, and all the other hydrogen atoms may be substituted with deuterium atoms. For example, all the hydrogen atoms in a substituent represented by Formula 2-a or Formula 2-b bonded to Formula 1 may be substituted with deuterium atoms.

The compound represented by Formula 1 of an embodiment may be represented by one of Formula 1-1 to Formula 1-3. Formula 1-1 to Formula 1-3 represent examples according to the combination of heteroatoms contained in the condensed cyclic unit. For example, the compound of an embodiment may include the condensed cyclic unit containing oxaborine or thiaborine as represented by Formula 1-1 to Formula 1-3 below:

[Formula 1-1]

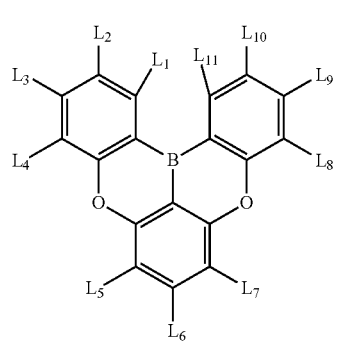

[Formula 1-2]

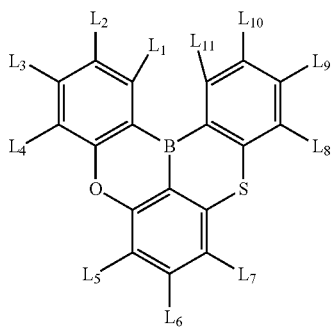

[Formula 1-3]

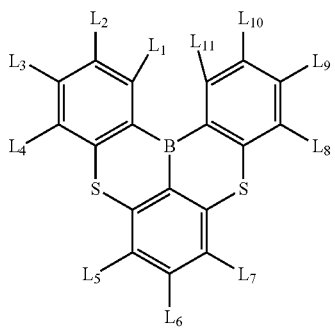

In Formula 1-1 to Formula 1-3, $L_1$ to $L_{11}$ may be the same as defined in Formula 1.

The compound of an embodiment may include, as an electron acceptor, the condensed cyclic unit containing oxaborine or thiaborine.

The compound represented by Formula 1 of an embodiment may be represented by one of Formula 1A to Formula 1E. In Formula 1A to Formula 1E, DU may be represented by Formula 2-a or Formula 2-b as described above. Formula 1A to Formula 1E show embodiments according to the azasiline unit's bonding site represented by DU and the number of the bonded azasiline units.

[Formula 1A]

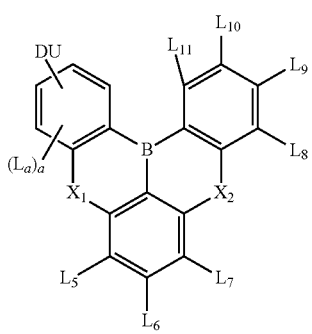

[Formula 1B]

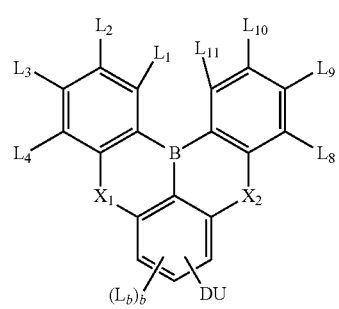

[Formula 1C]

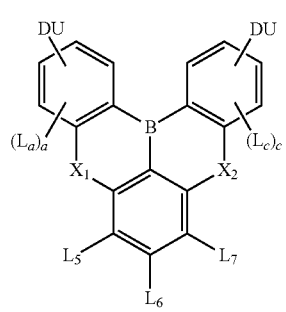

[Formula 1D]

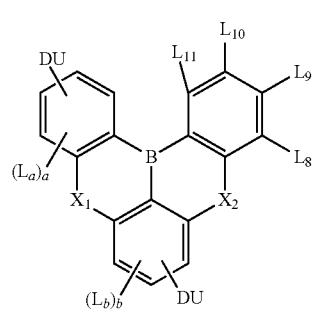

[Formula 1E]

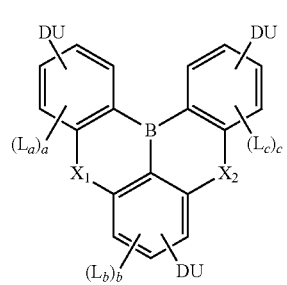

In Formula 1A to Formula 1E, a to c may each independently be an integer from 0 to 3. In Formula 1A to Formula 1E, $X_1$ and $X_2$ may be the same as defined in Formula 1. In Formula 1A to Formula 1E, $L_a$ to $L_e$ and $L_1$ to $L_{11}$ may each independently be a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In the compound represented by Formula 1A to Formula 1E of an embodiment, the case where $L_a$ to $L_c$ and $L_1$ to $L_{11}$ are represented by Formula 2-a or Formula 2-b is excluded.

For example, in the compound represented by Formula 1A to Formula 1E of an embodiment, $L_a$ to $L_c$ and $L_1$ to $L_{11}$ may each independently be a hydrogen atom, a deuterium atom, a fluorine atom, a cyano group, an aryl amine group, an aryl silyl group, an aryl boron group, a linear alkyl group, a branched alkyl group, an unsubstituted aryl group, an aryl group substituted with a deuterium atom, or an unsubstituted heteroaryl group, etc.

The compound represented by Formula 1 of an embodiment may be represented by Formula 1F:

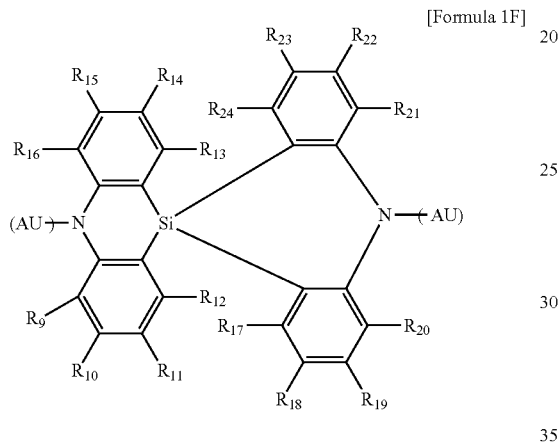

[Formula 1F]

In Formula 1F, $R_9$ to $R_{24}$ may be the same as defined in Formula 2-b, AU is a substituent represented by Formula 1, and the case where AU is substituted with a substituent represented by Formula 2-a or Formula 2-b above is excluded. For example, AU is not substituted with a substituent represented by Formula 2-a or Formula 2-b. For example, in the compound represented by Formula 1F of an embodiment, $R_9$ to $R_{24}$ may each independently be a hydrogen atom, a deuterium atom, a fluorine atom, a cyano group, an aryl amine group, an aryl silyl group, an aryl boron group, a linear alkyl group, a branched alkyl group, an unsubstituted aryl group, an aryl group substituted with a deuterium atom, or an unsubstituted heteroaryl group, etc. However, the embodiments are not limited thereto.

Formula 1F shows an embodiment having a structure containing the azasiline unit represented by Formula 2-b and the condensed cyclic unit represented by Formula 1. The compound represented by Formula 1F of an embodiment may have a structure containing two electron acceptor units which may be represented by Formula 1 and one electron donor unit which may be represented by Formula 2-b.

The compound represented by Formula 1 of an embodiment may be represented by one of Formula 1F-1 to Formula 1F-3. Formula 1F-1 to Formula 1F-3 show embodiments having a structure containing the azasiline unit represented by Formula 2-b and the condensed cyclic unit represented by Formula 1. Formula 1F-1 to Formula 1F-3 show embodiments having different bonding sites of the condensed cyclic units bonded to the azasiline units.

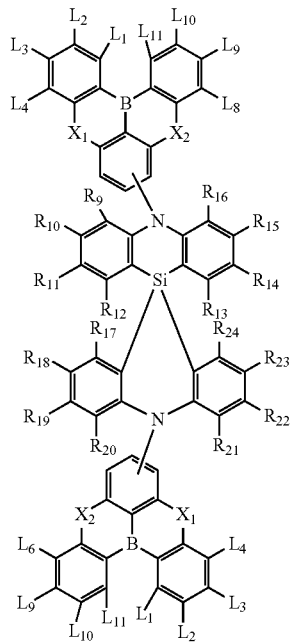

[Formula 1F-1]

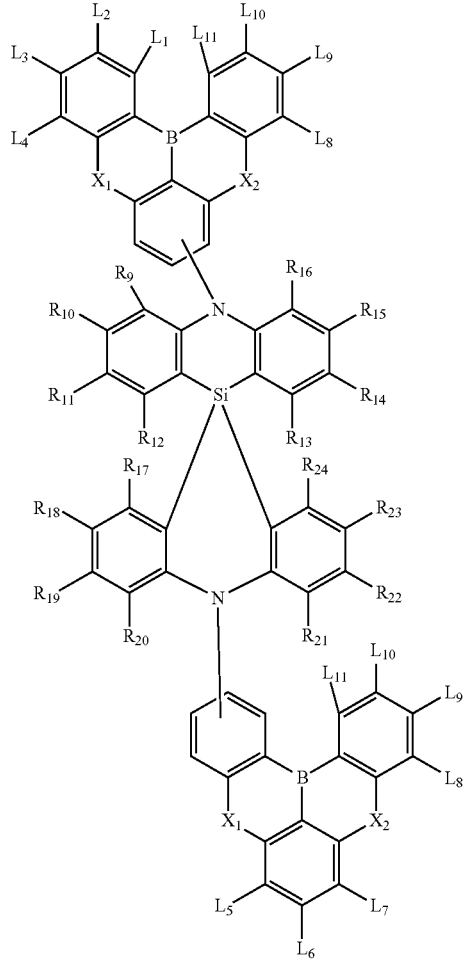

[Formula 1F-2]

-continued

[Formula 1F-3]

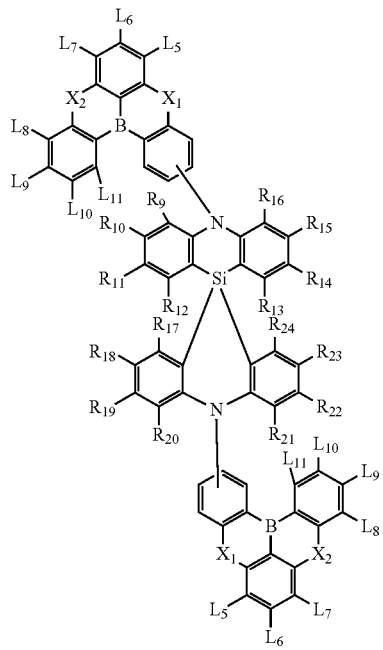

In Formula 1F-1 to Formula 1F-3, $L_1$ to $L_1$ may each independently be a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula 1F-1 to Formula 1F-3, $X_1$ and $X_2$ may be the same as defined in Formula 1, and $R_9$ to $R_{24}$ may be the same as defined in Formula 2-b.

The compound of an embodiment as described above has a molecular structure in which a condensed cyclic unit containing a boron atom and an azasiline unit are bonded, and thus a charge separation state in a molecule may be maintained at an appropriate level to facilitate reverse intersystem crossing. Therefore, the compound of an embodiment may have small $\Delta E_{ST}$ values to exhibit improved fluorescence efficiency. For example, if the compound according to an embodiment is used as an emission layer material of the organic electroluminescence device, a light emission efficiency characteristic of the organic electroluminescence device may be improved.

The compound of an embodiment has a compound molecular structure in which the reverse intersystem crossing easily occurs by bonding at least one electron acceptor and at least one electron donor, and thereby may be used as a thermally activated delayed fluorescence (TADF) material. For example, the compound of an embodiment may be used as a TADF dopant material emitting blue light. The compound represented by Formula 1 of an embodiment may be a luminescent material having a luminescence center wavelength ($\lambda_{max}$) in a wavelength region of less than or equal to about 490 nm. For example, the compound represented by Formula 1 of an embodiment may be a luminescent material having a luminescence center wavelength in a wavelength region in a range of about 430 nm to about 490 nm. The compound represented by Formula 1 of an embodiment may be a blue thermally activated delayed fluorescence dopant. For example, the compound of an embodiment may be used as a TADF material emitting deep blue light.

The compound of an embodiment may be selected from one of the compounds represented by Compound Group 1, which includes Compounds 1 to 234. The electroluminescence device 10 of an embodiment may include at least one compound represented by Compound Group 1 in the emission layer EML. In the compounds represented by Compound Group 1, "ph" represents a phenyl group.

[Compound Group 1]

1

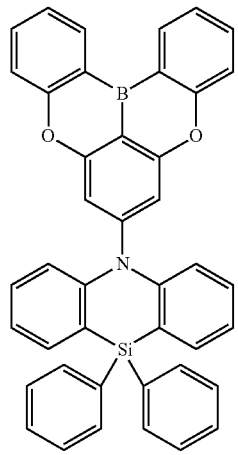

2

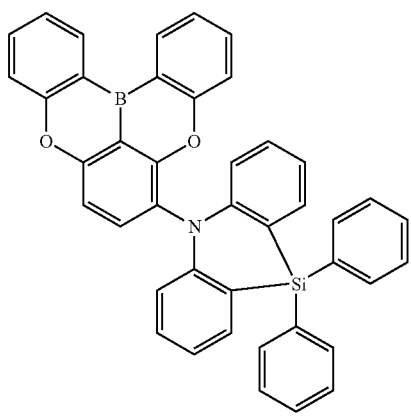

3

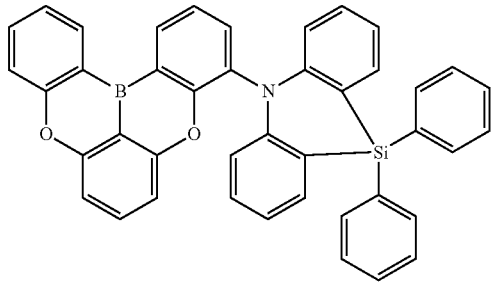

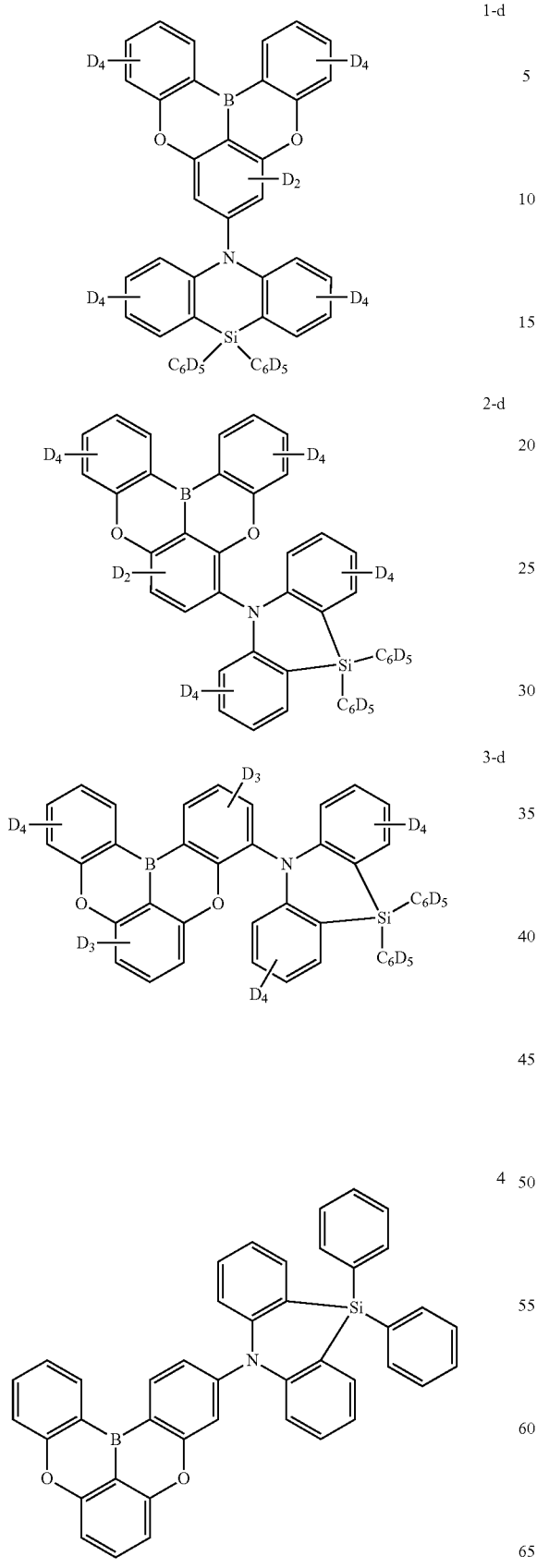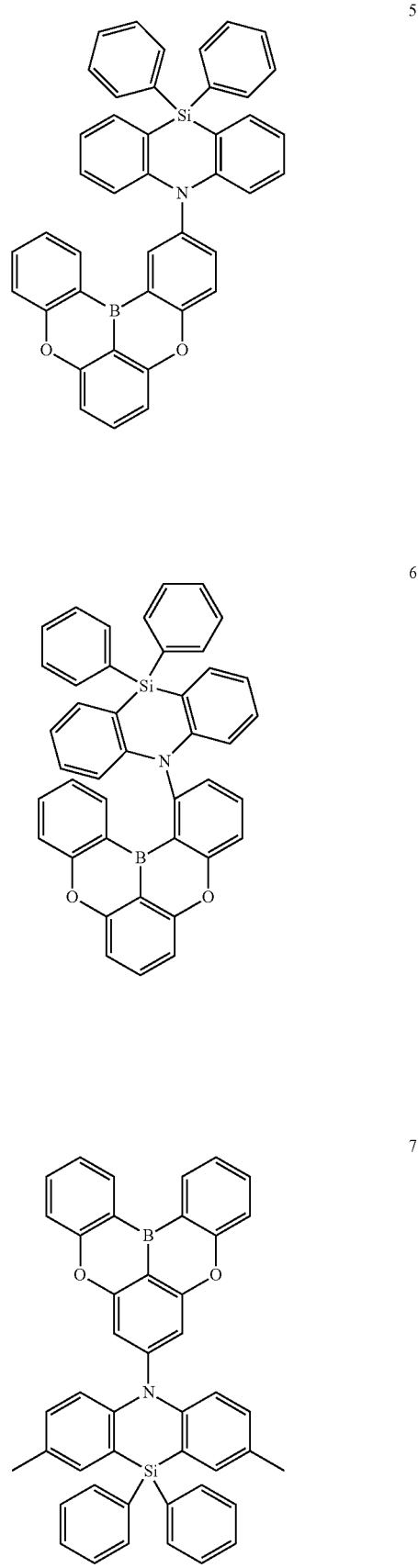

-continued
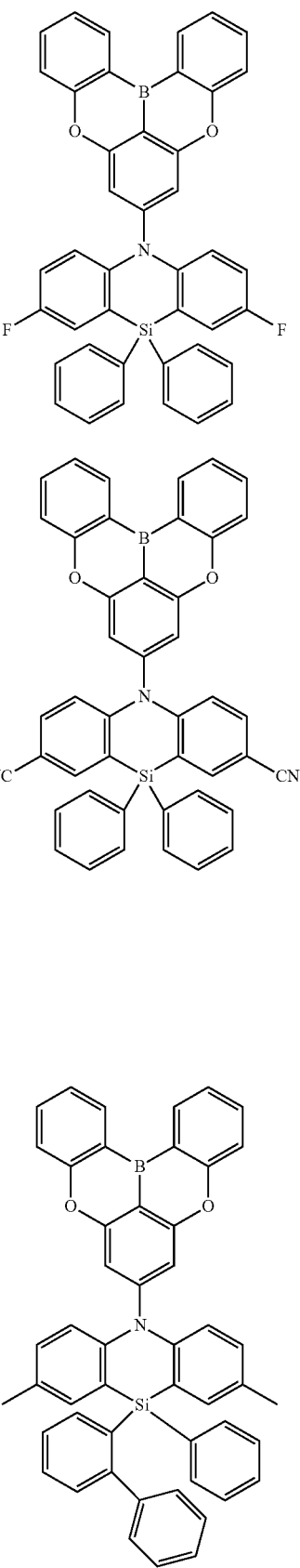
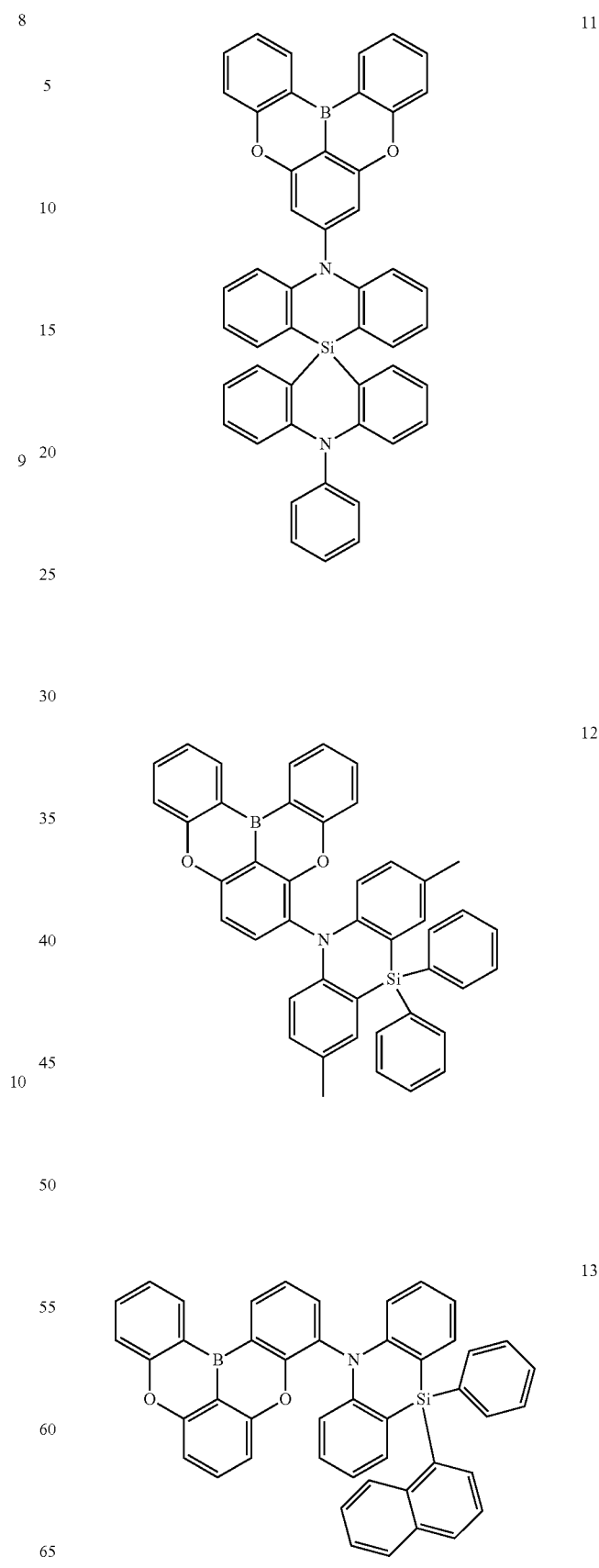

-continued
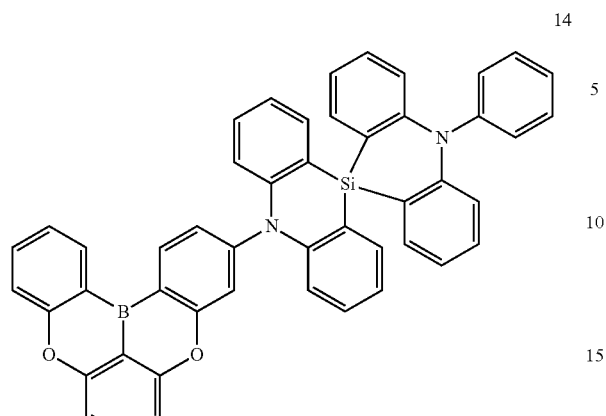
14
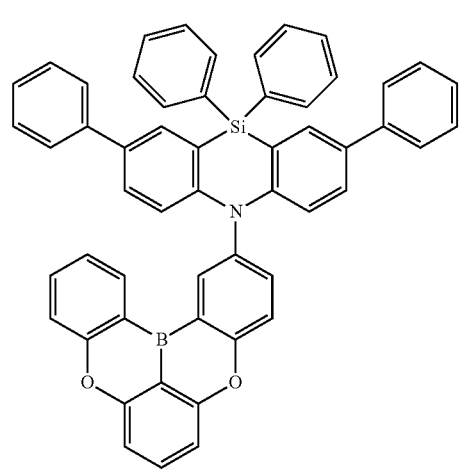
15
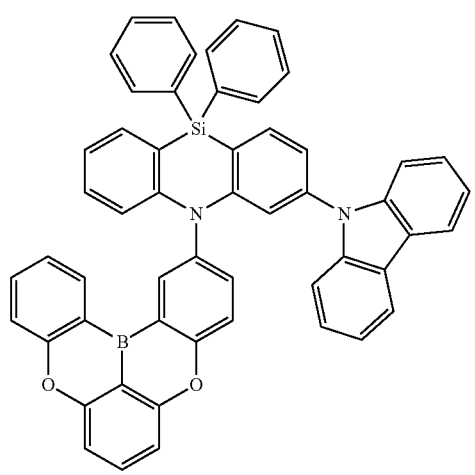
16
-continued
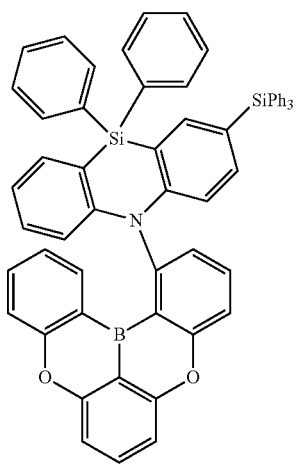
17
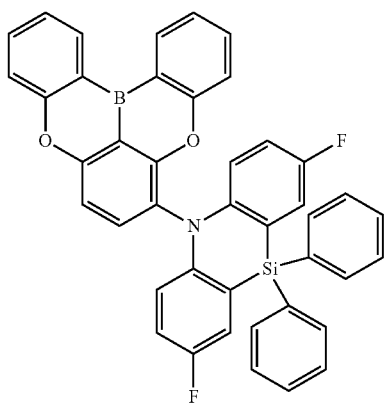
18
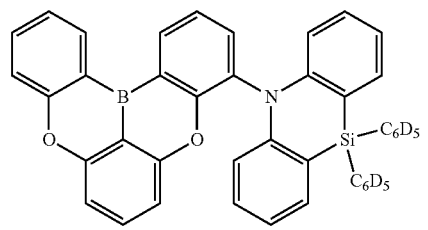
19
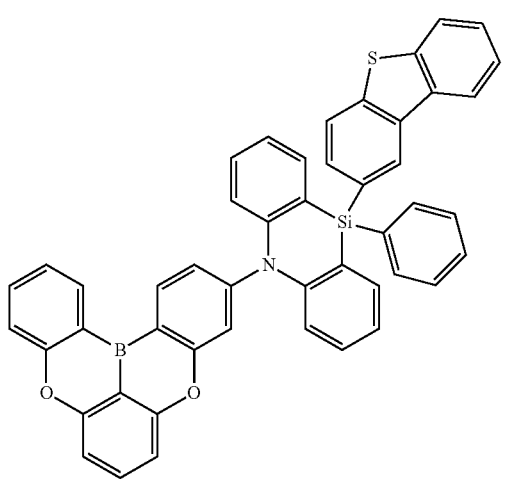
20

21
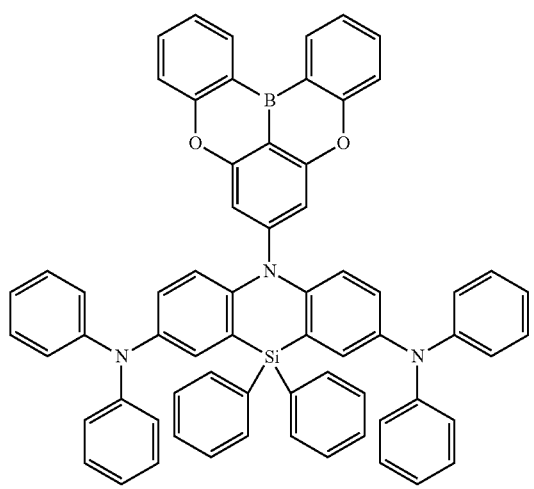
22
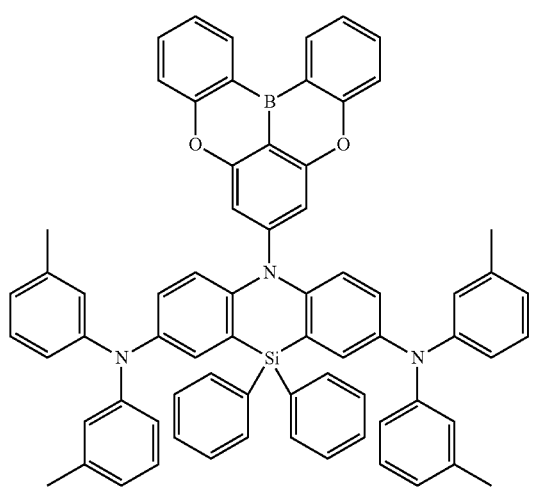
23
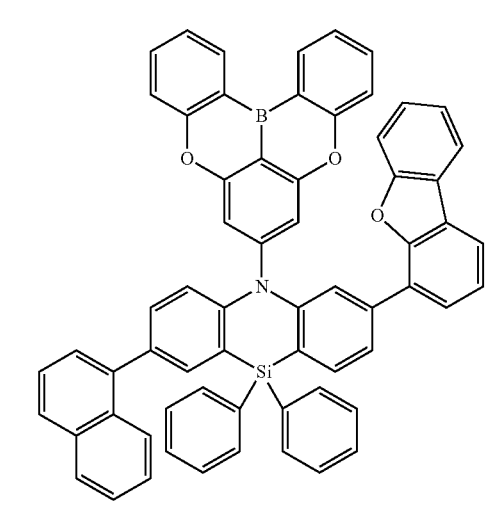
24
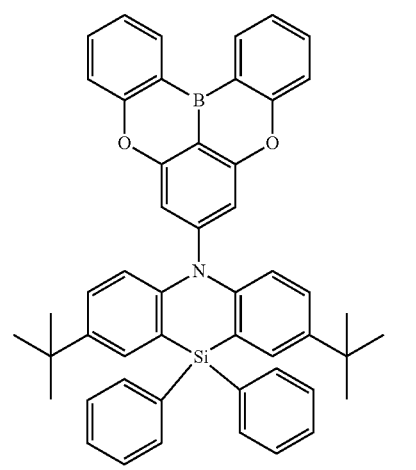
25
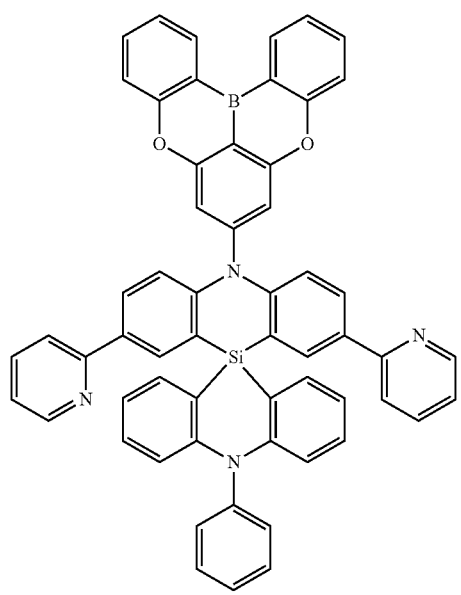
26

31
-continued
27
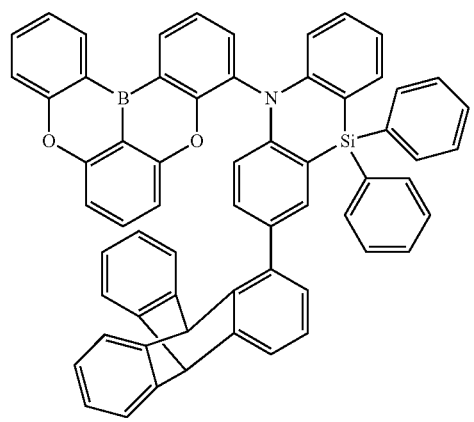
28
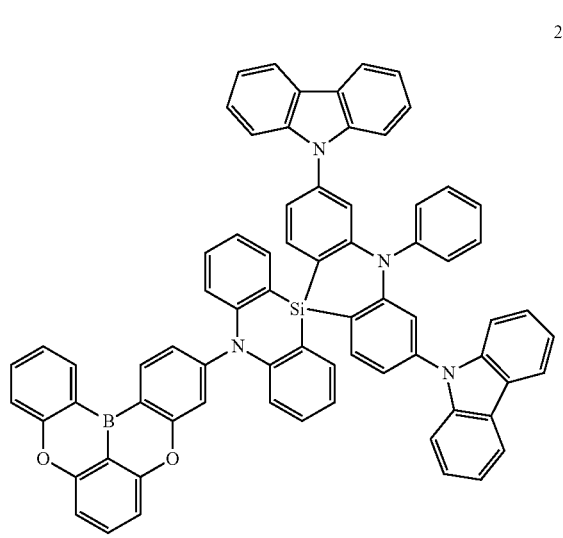
29
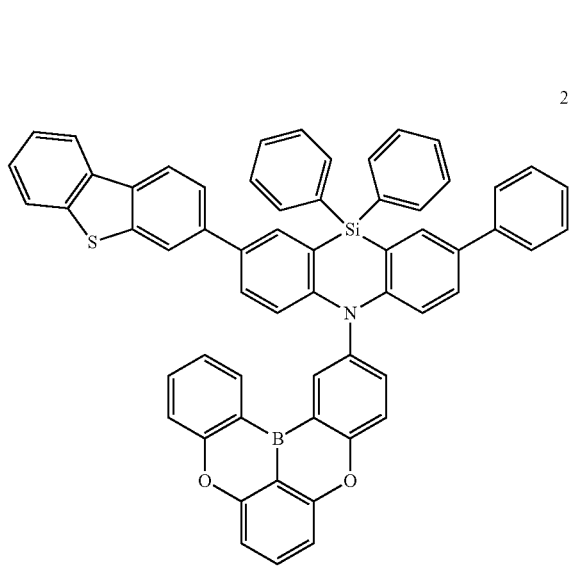
32
-continued
30
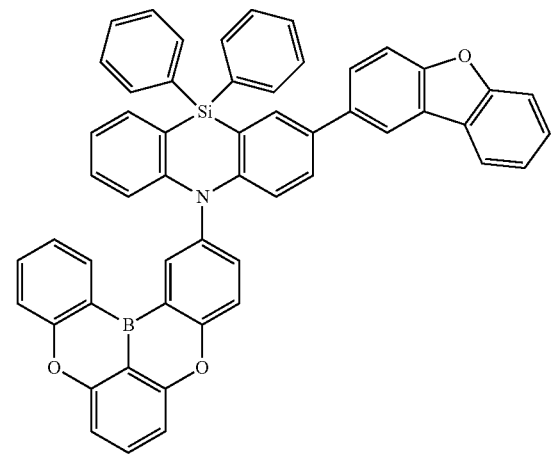
31
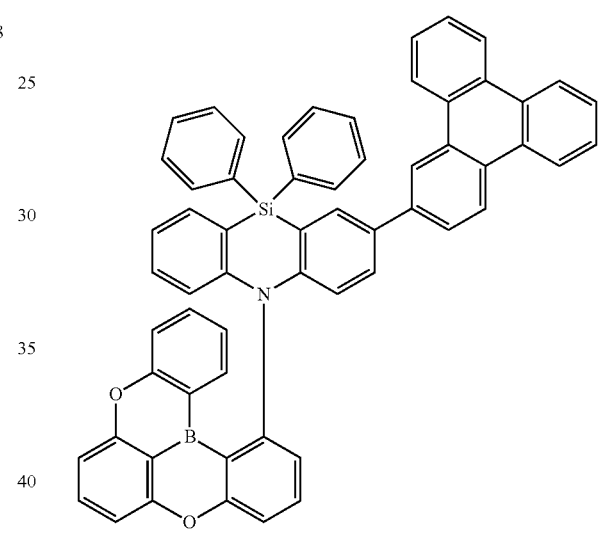
32
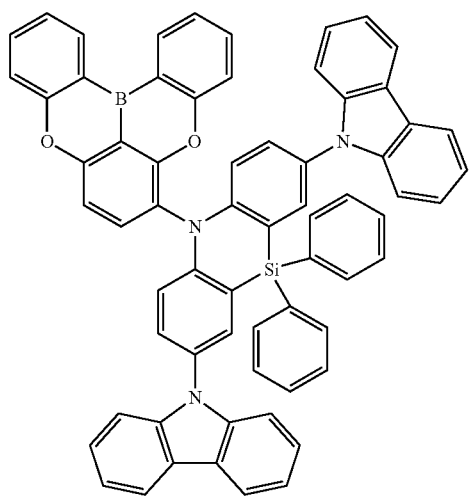

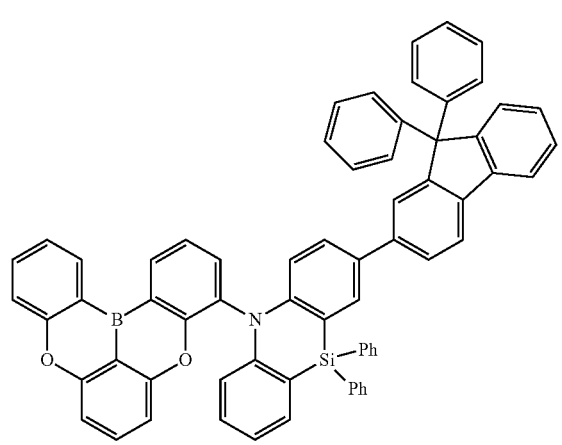
33
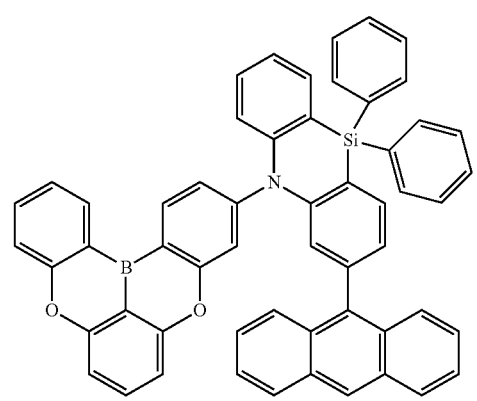
34
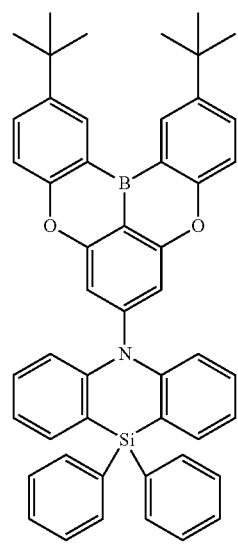
35
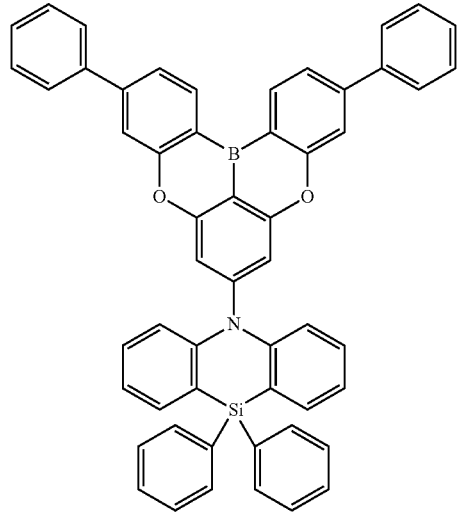
36
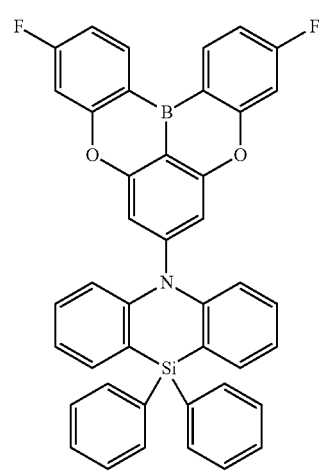
37
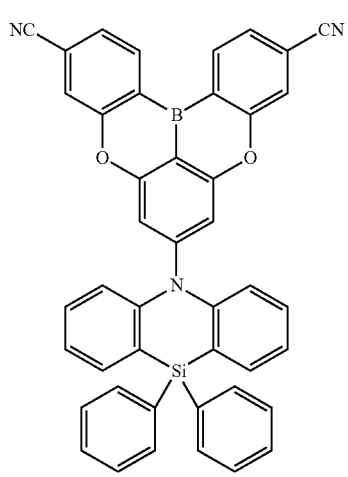
38

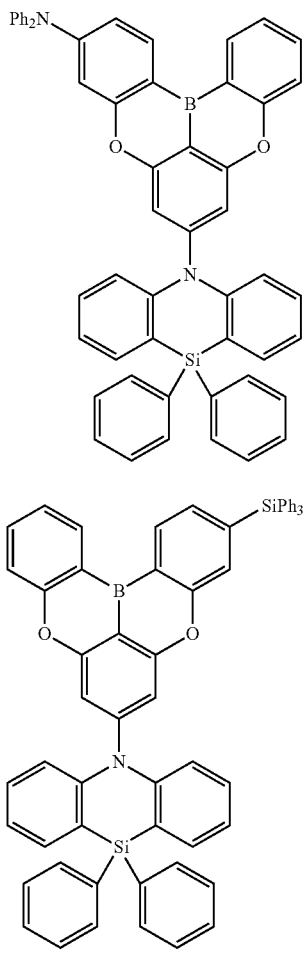
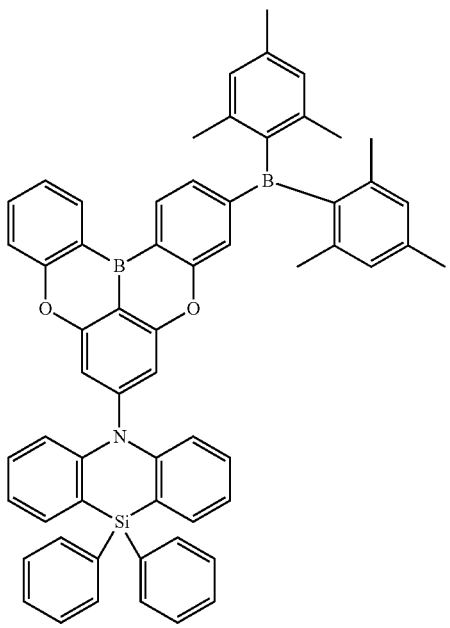
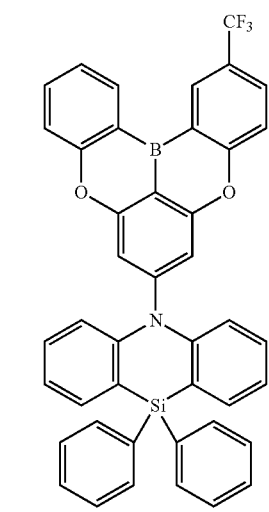
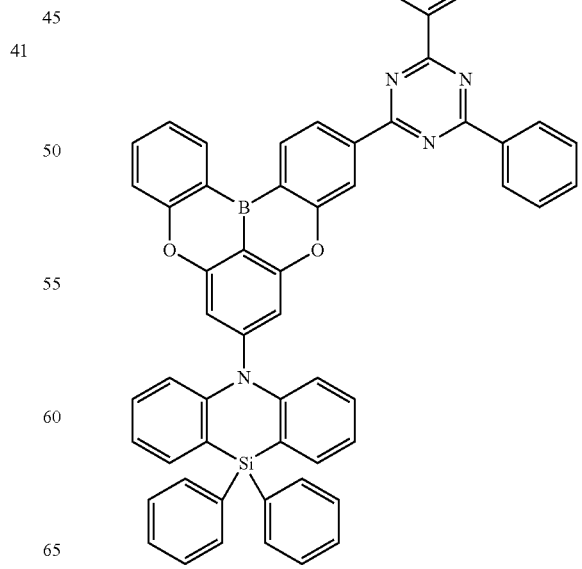

44
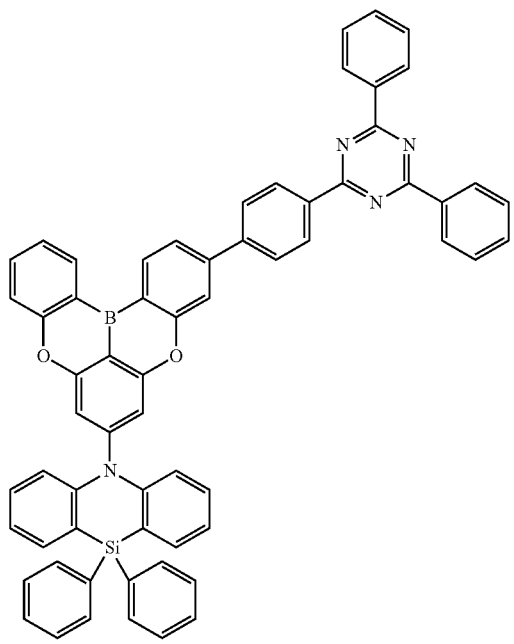
45
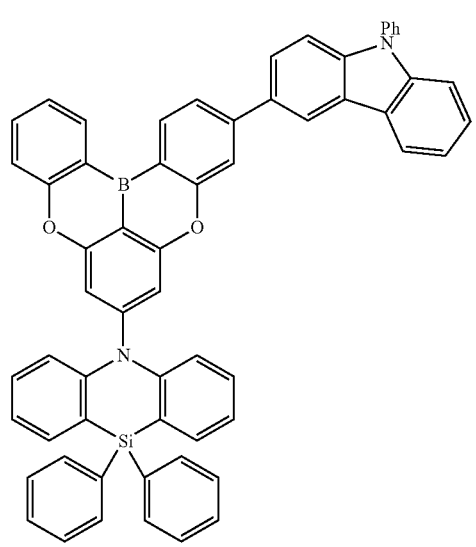
46
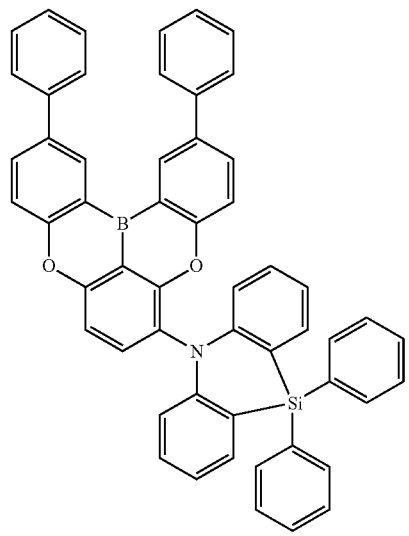
47
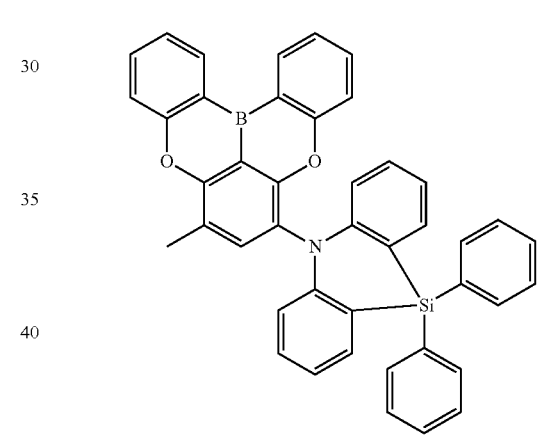
48
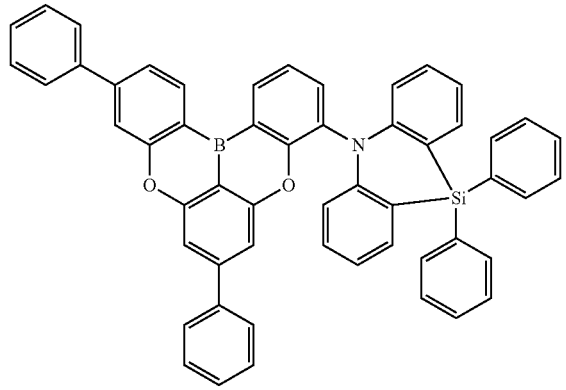

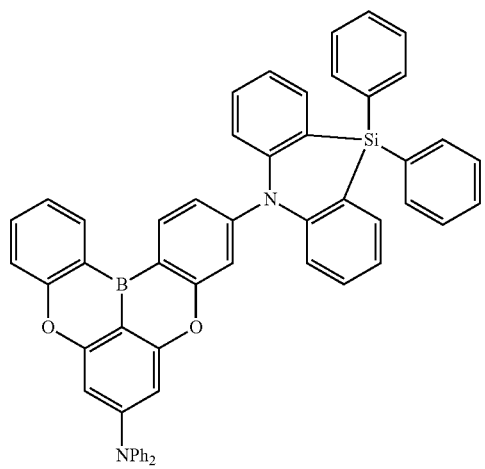
49
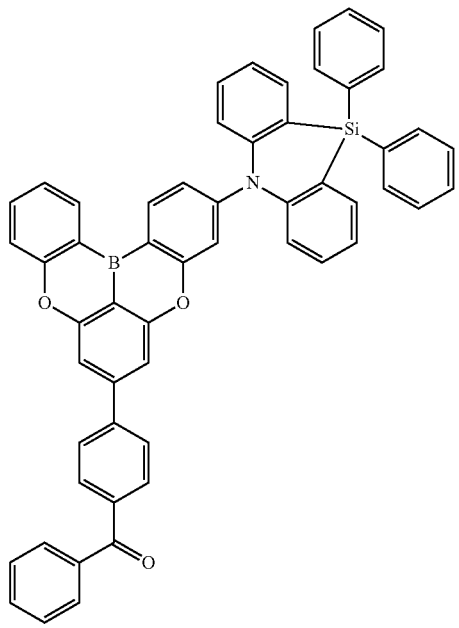
52
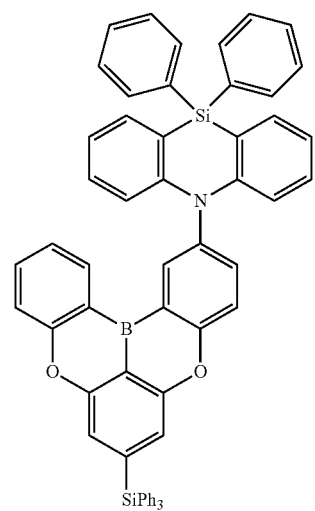
50
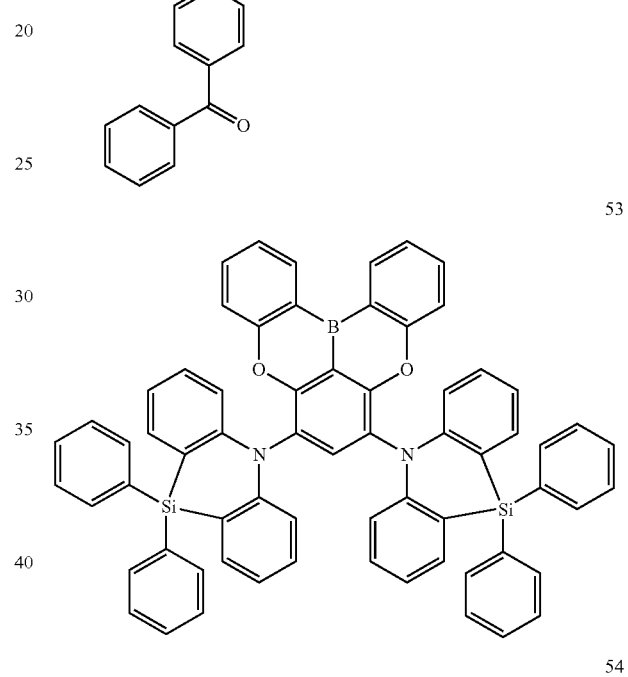
53
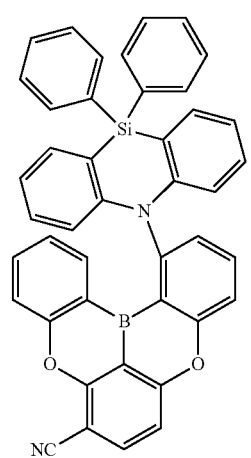
51
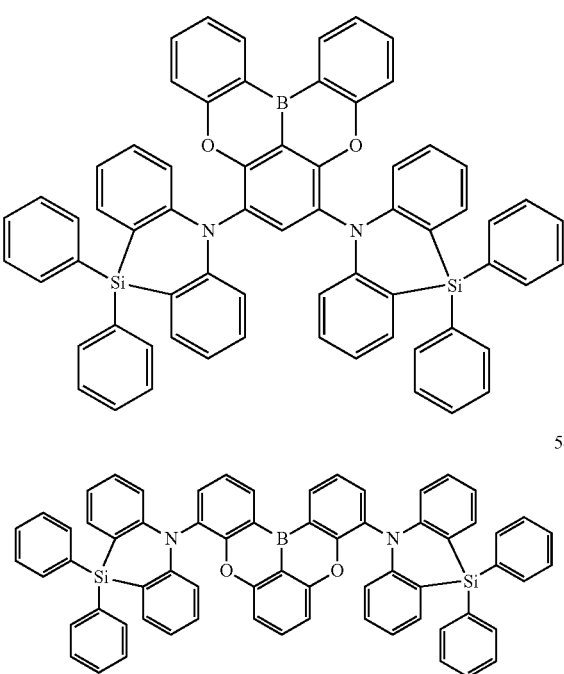
54
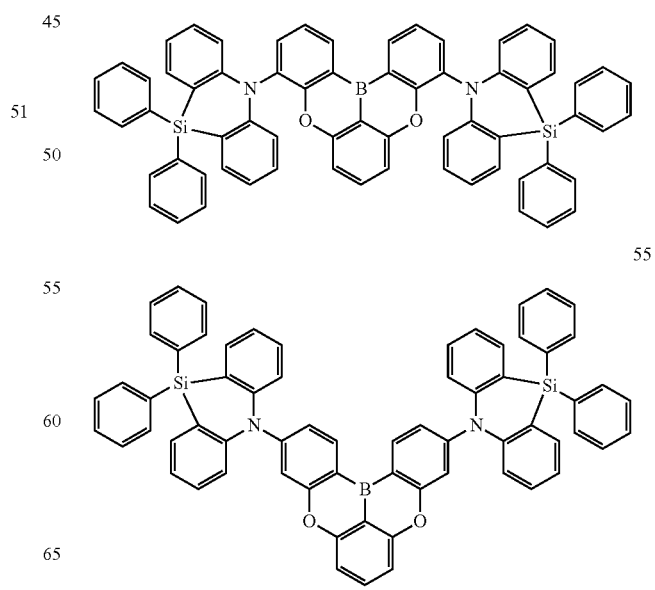
55
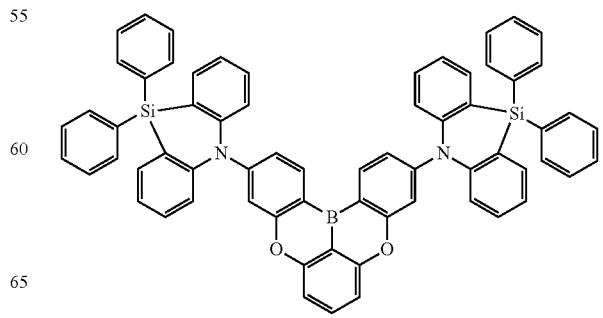

56
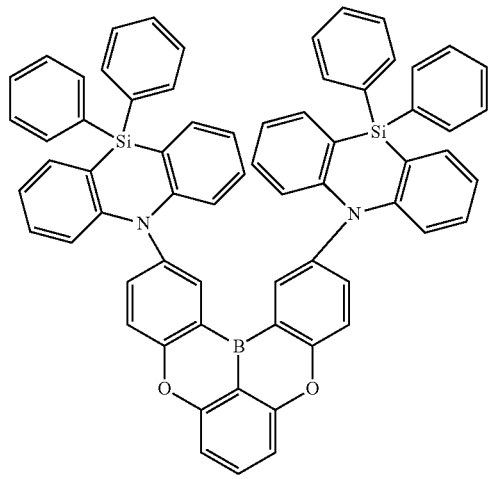
57
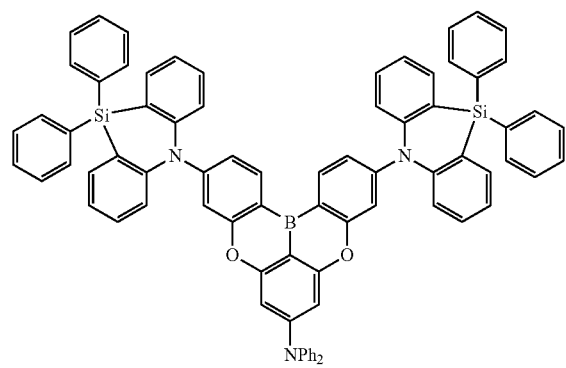
58
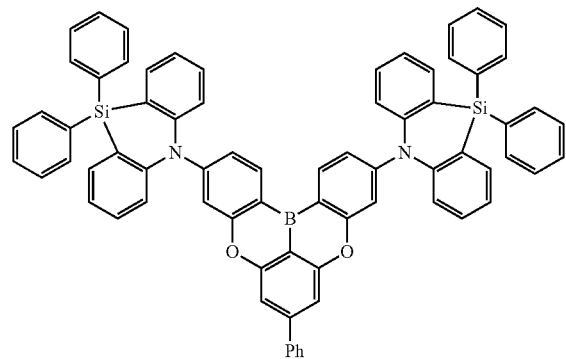
59
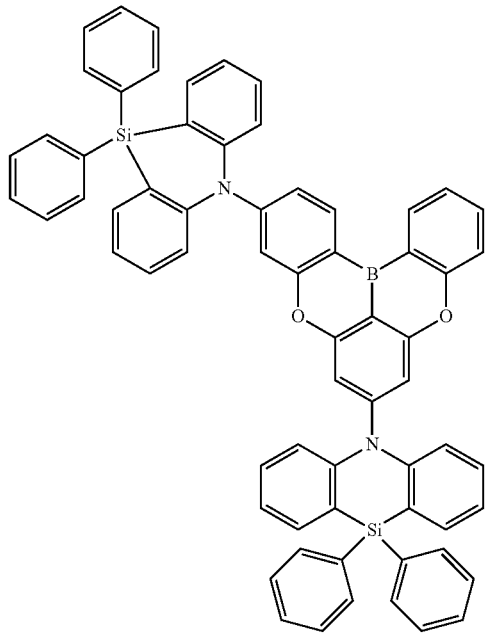
60
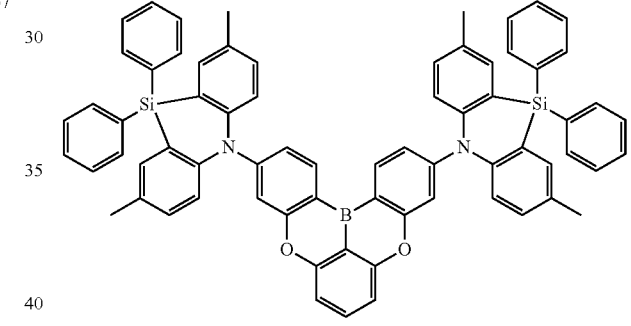
61
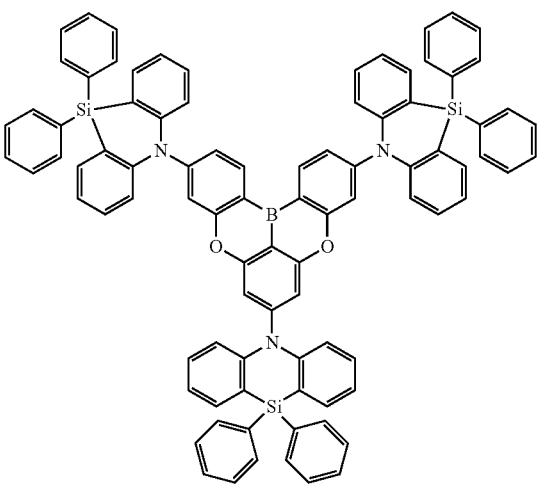

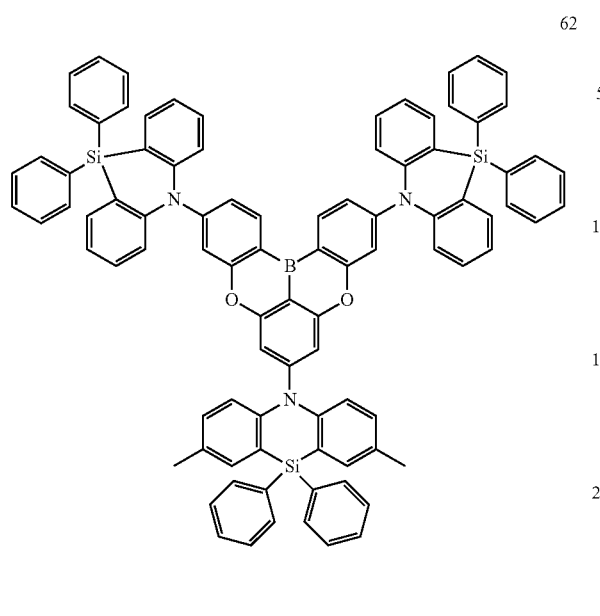
62
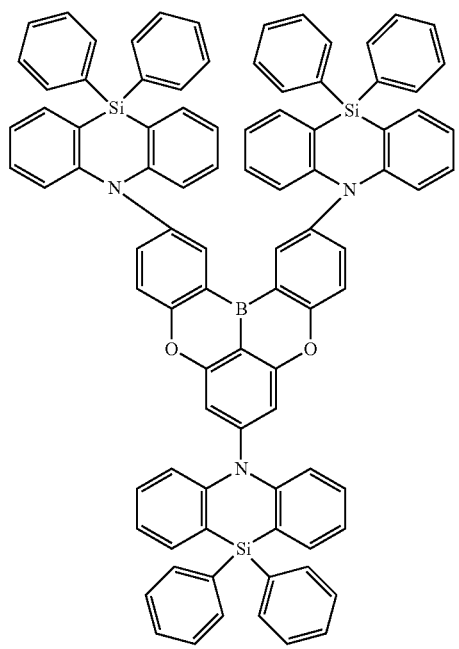
64
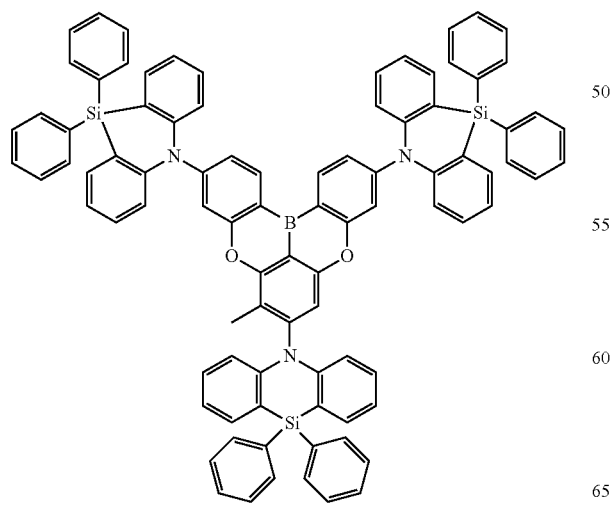
63
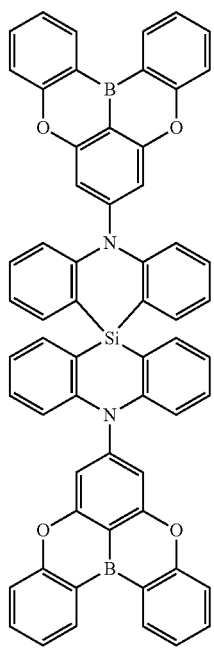
65

66
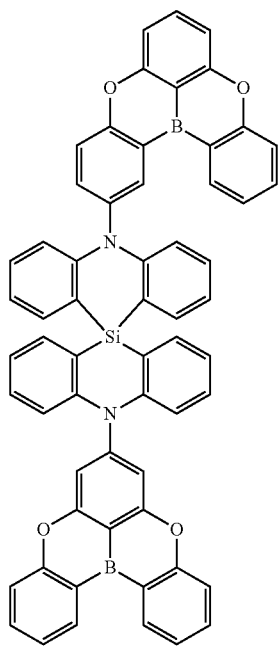
67
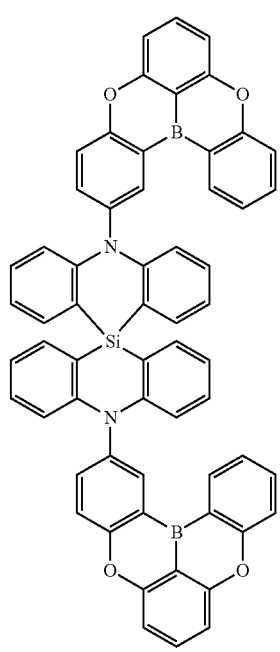
68
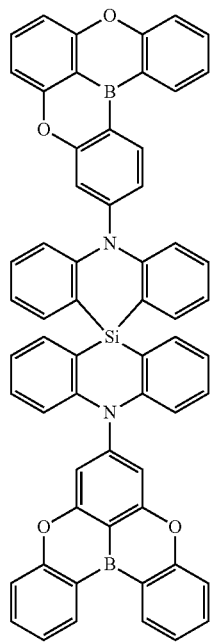
69
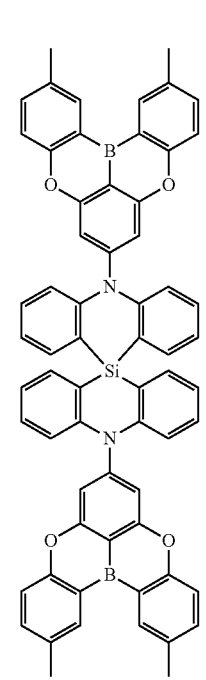

70
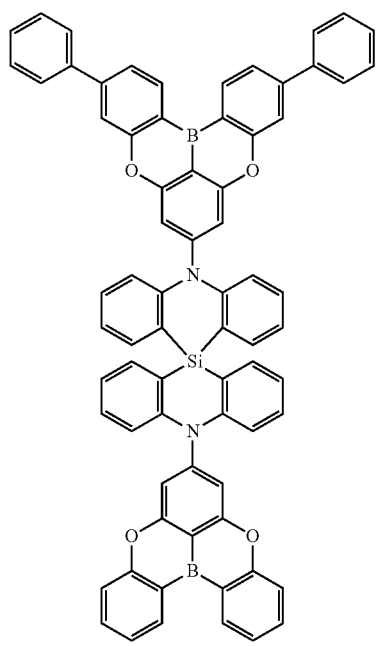
71
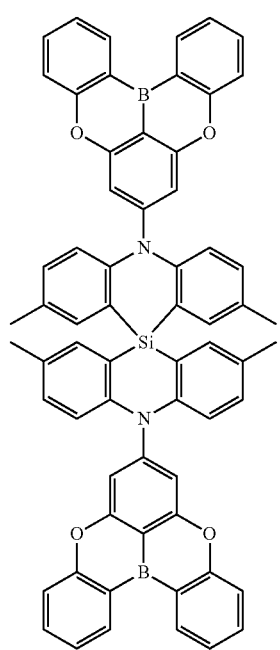
72
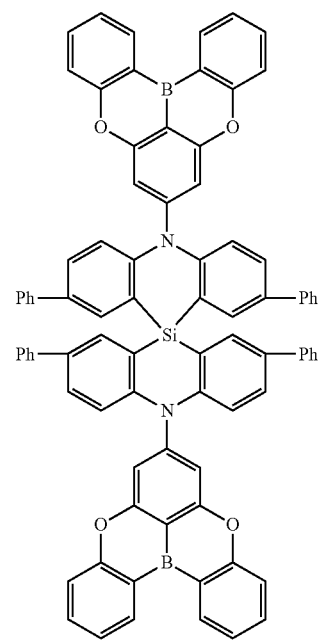
73
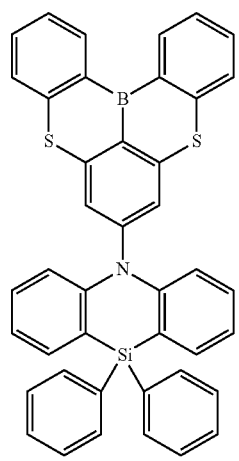
74
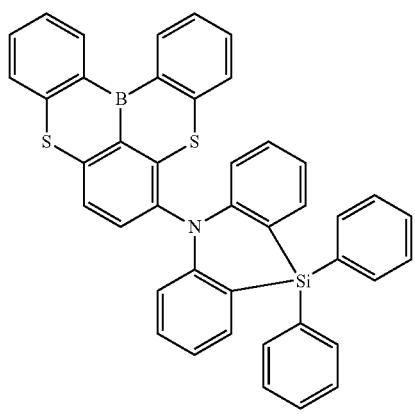

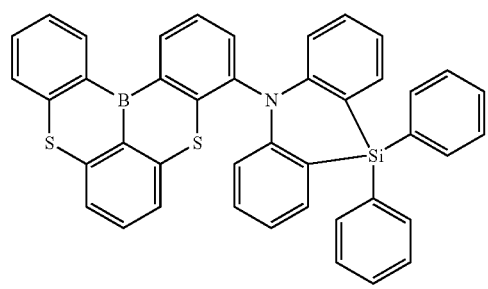
75
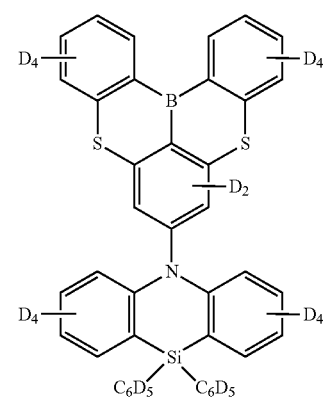
73-d
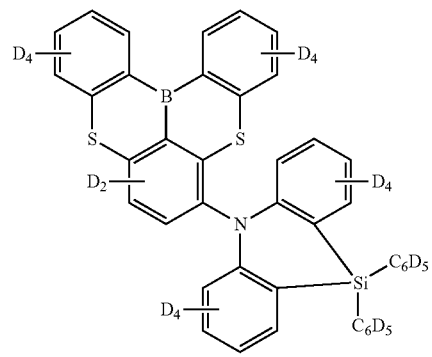
74-d
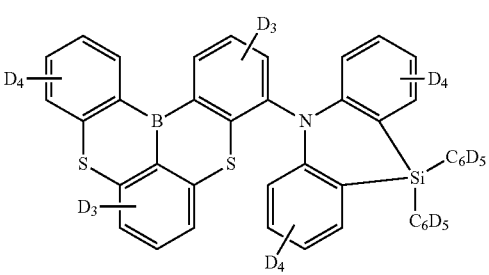
75-d
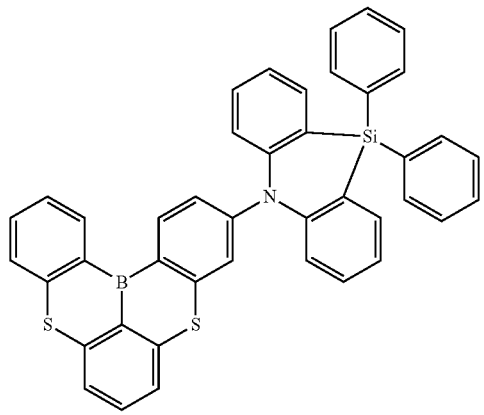
76
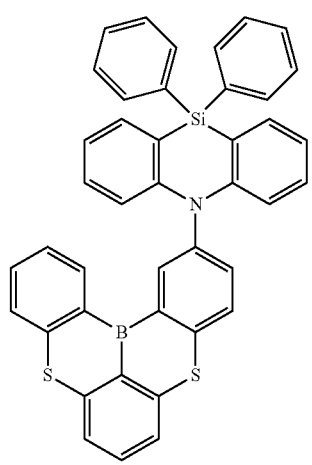
77
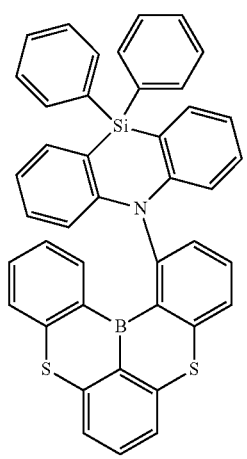
78

79
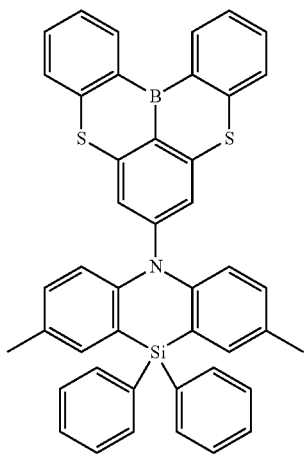
80
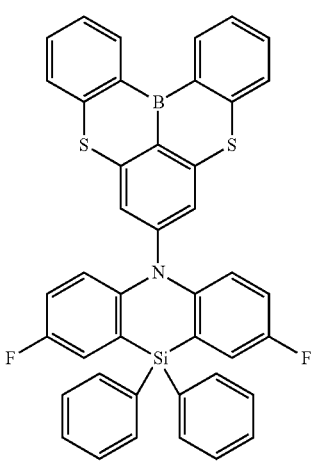
81
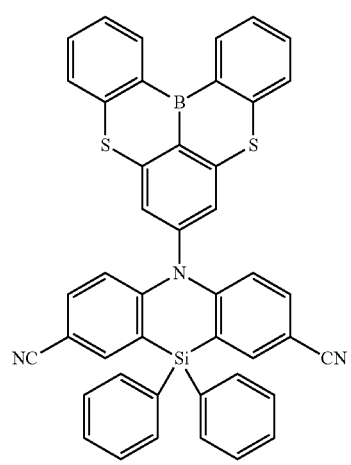
82
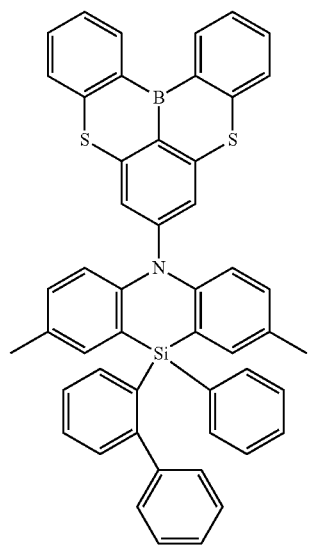
83
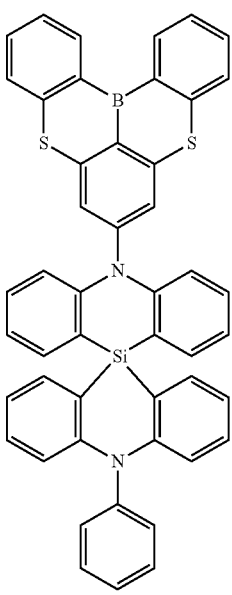
84
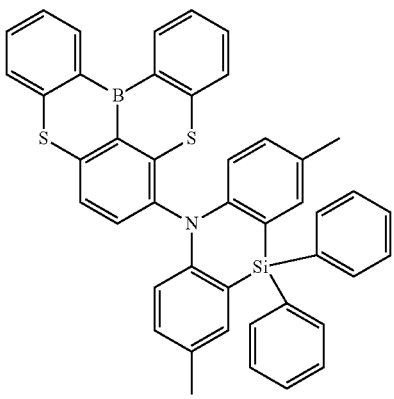

85
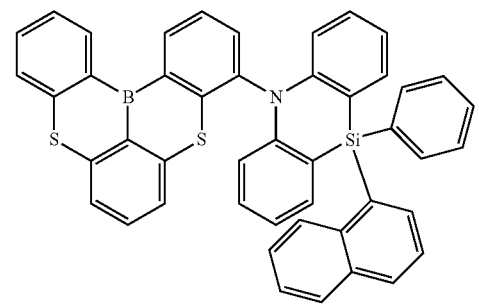
86
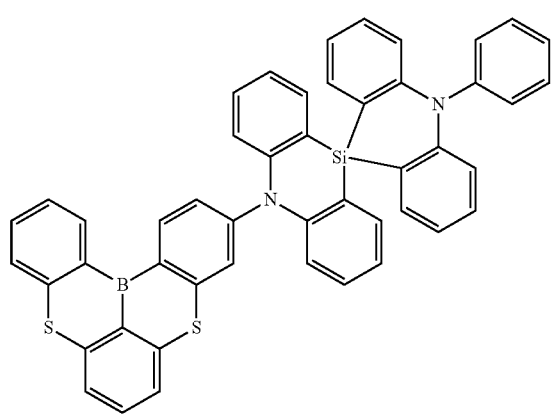
87
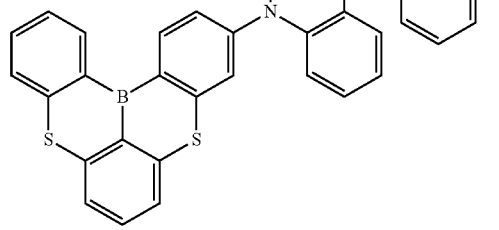
88
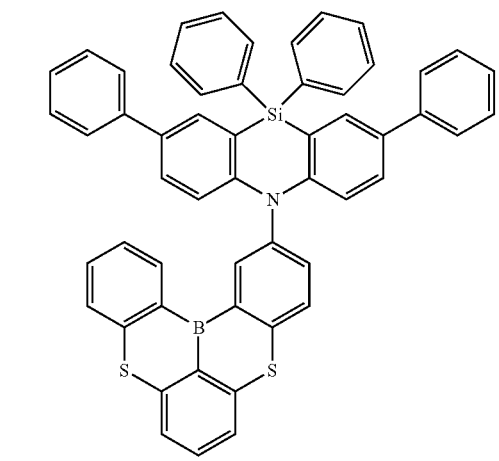
89
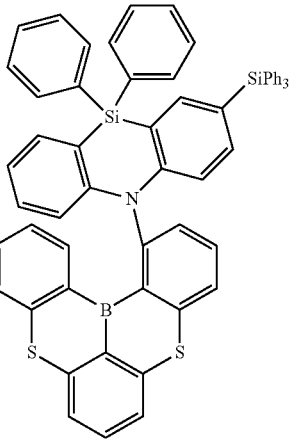
90
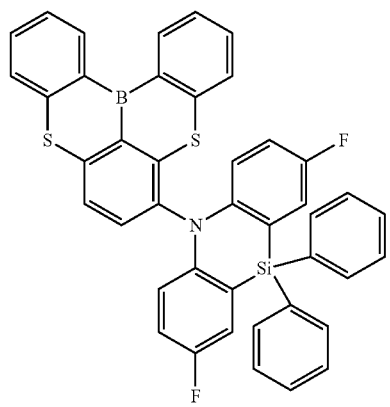
91
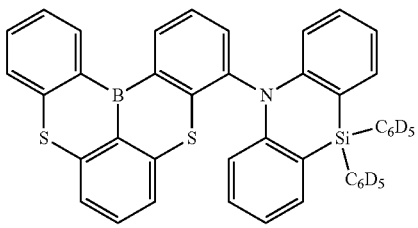
92
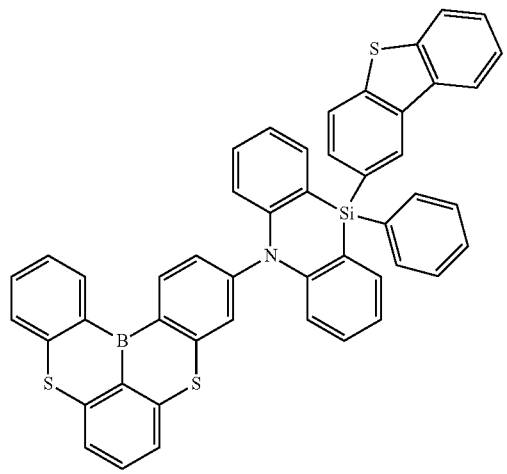

-continued
93
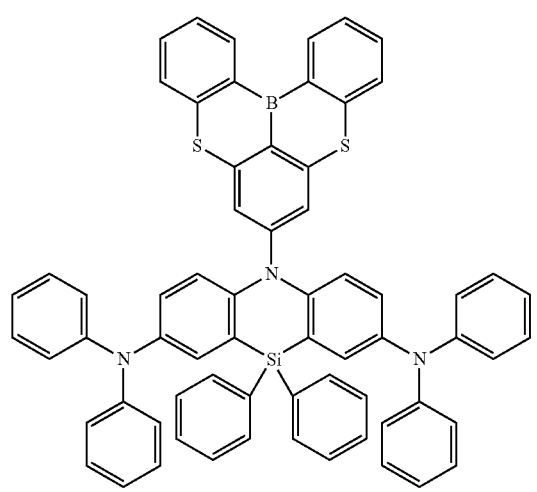
94
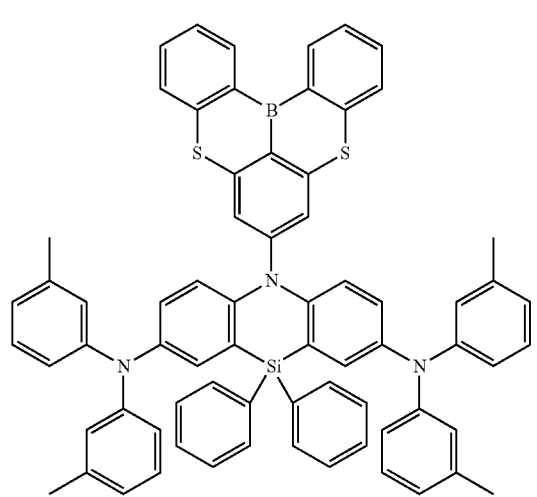
95
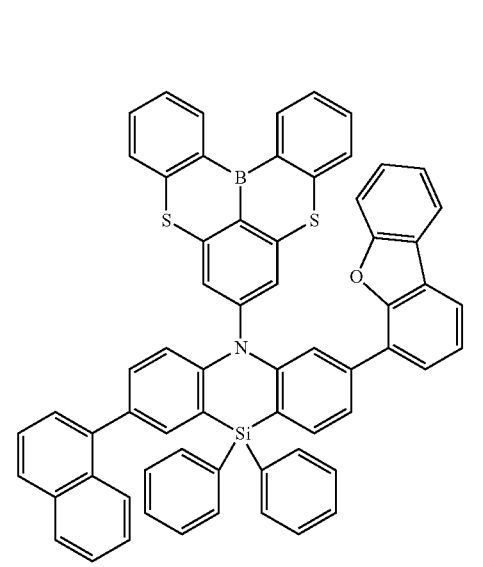
-continued
96
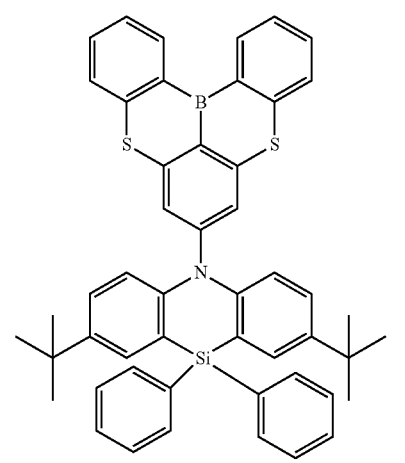
97
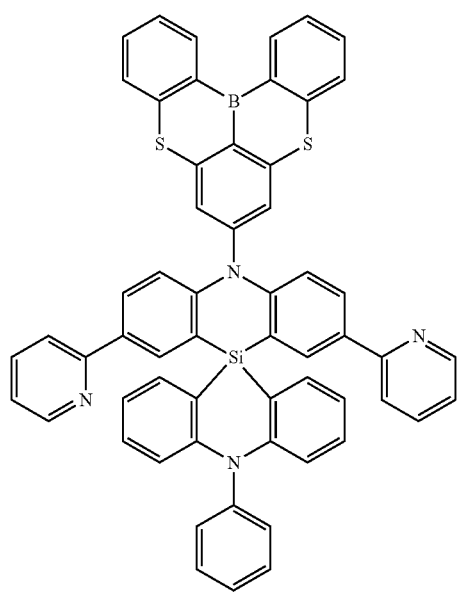
98
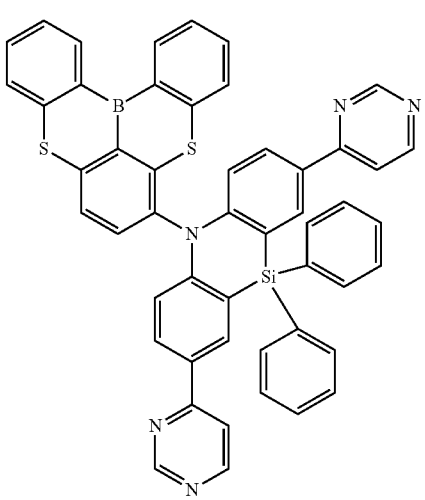

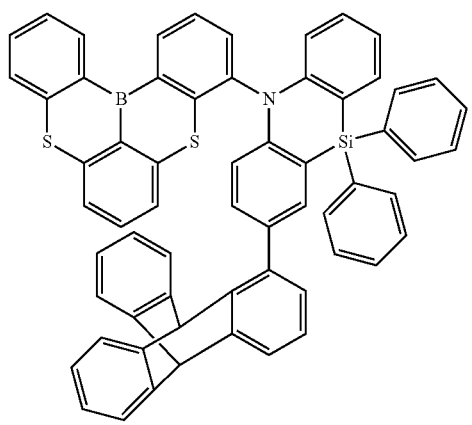
99
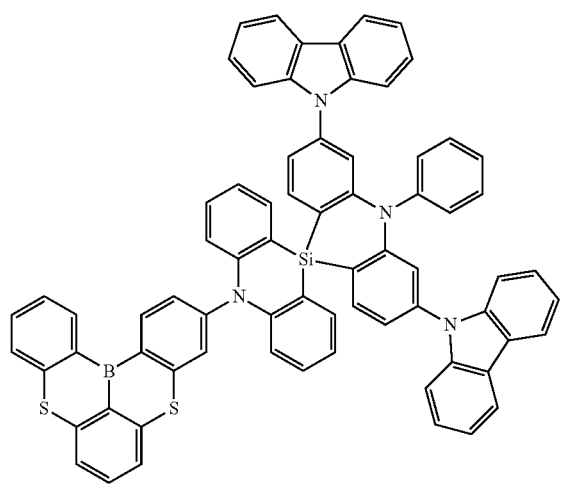
100
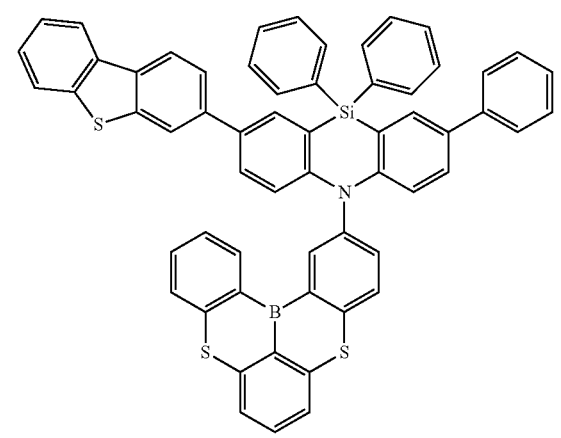
101
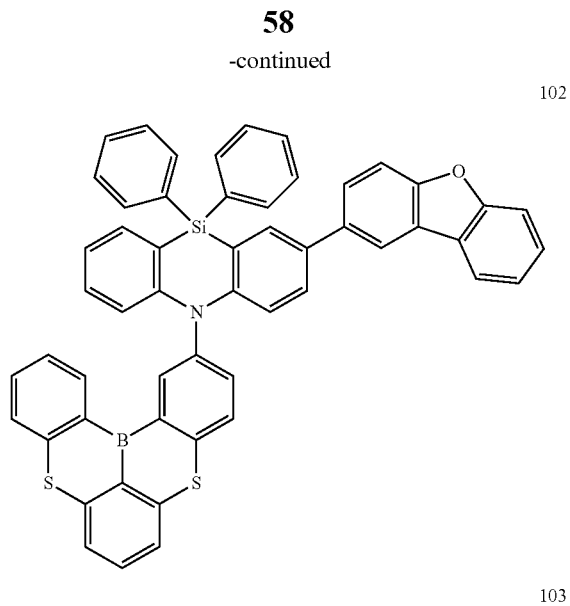
102
103
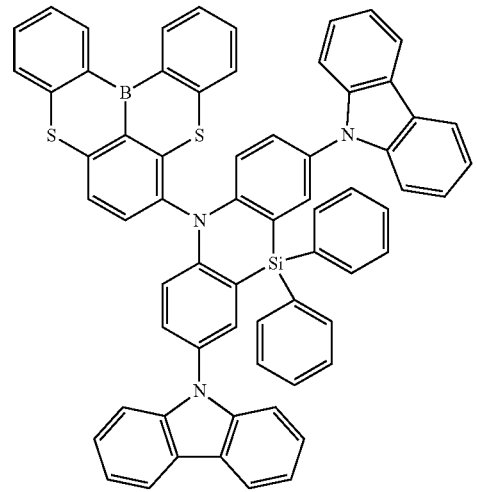
104

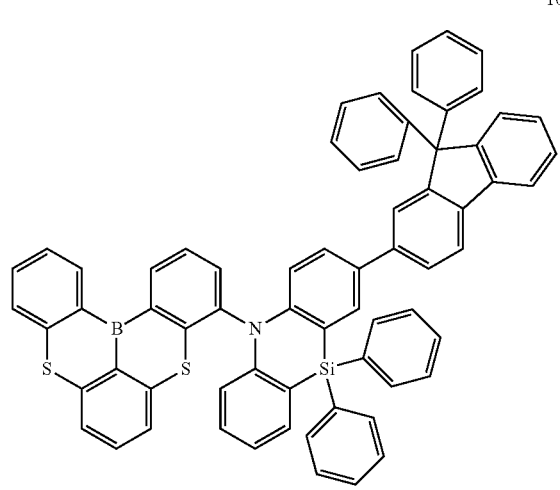
105
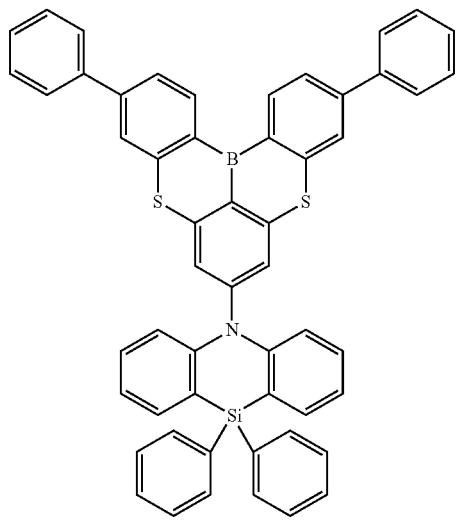
108
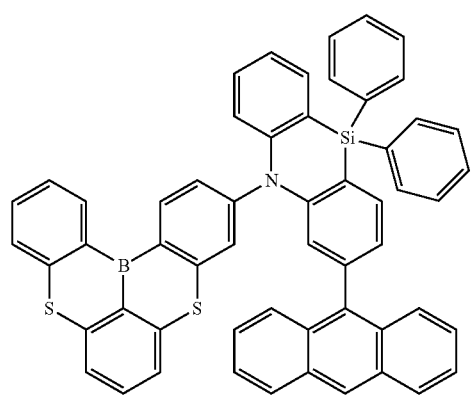
106
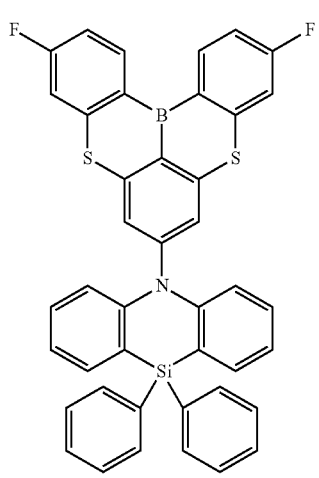
109
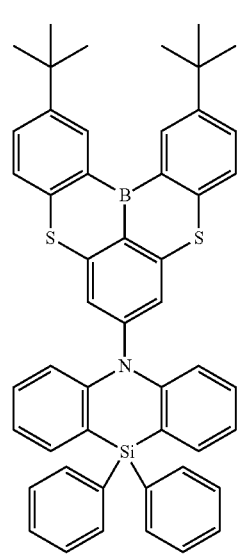
107
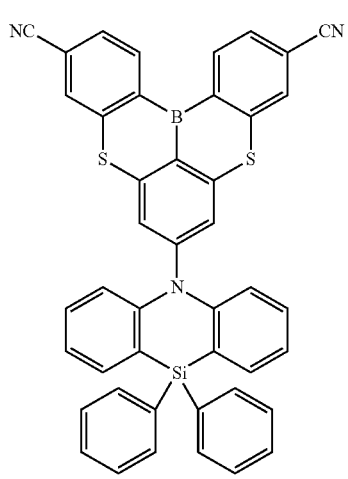
110

61
-continued
111
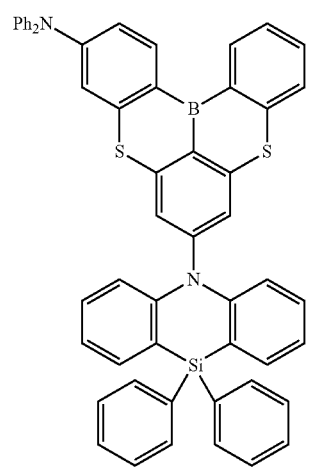
112
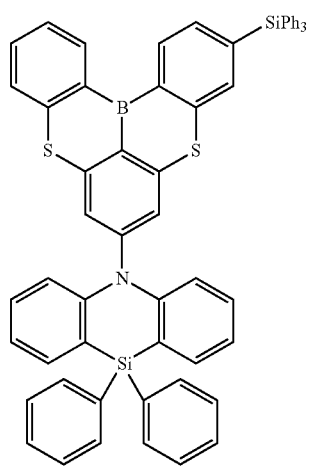
113
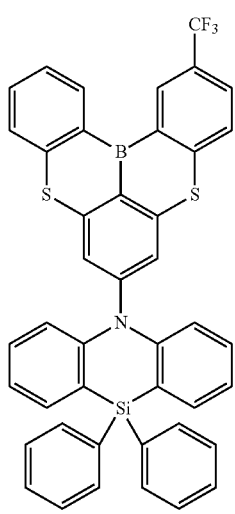
62
-continued
114
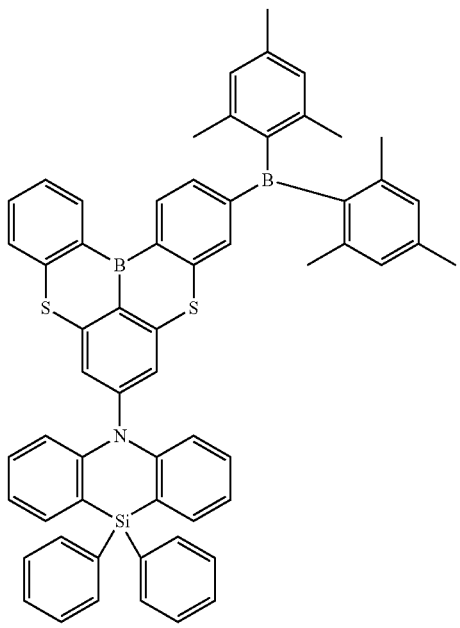
115
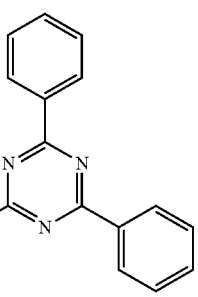

116
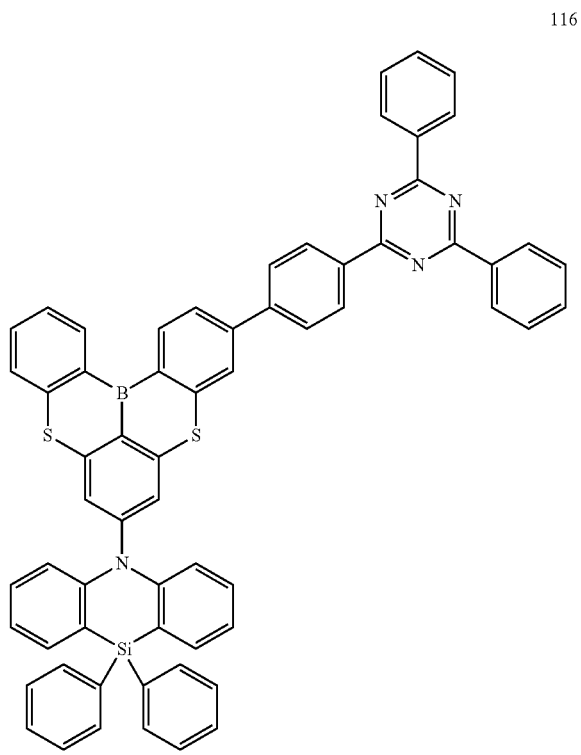
117
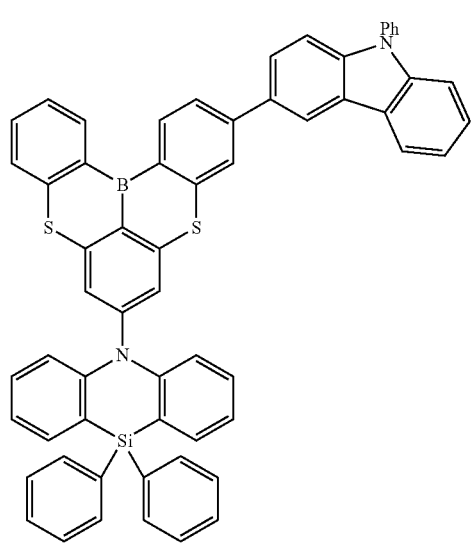
118
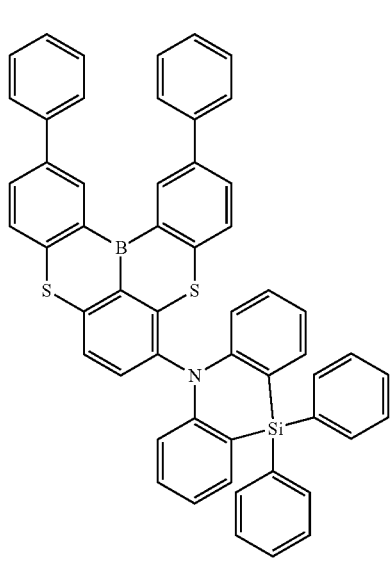
119
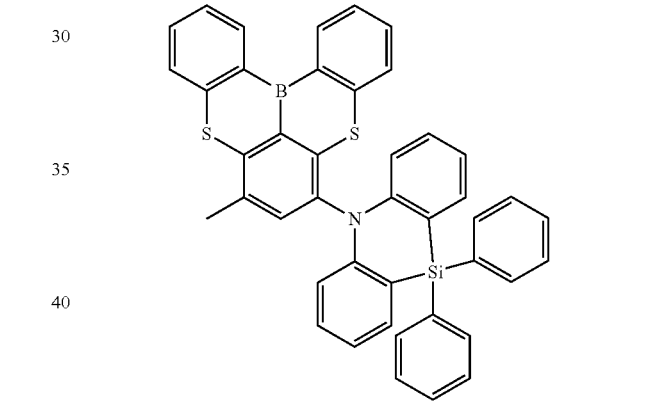
120
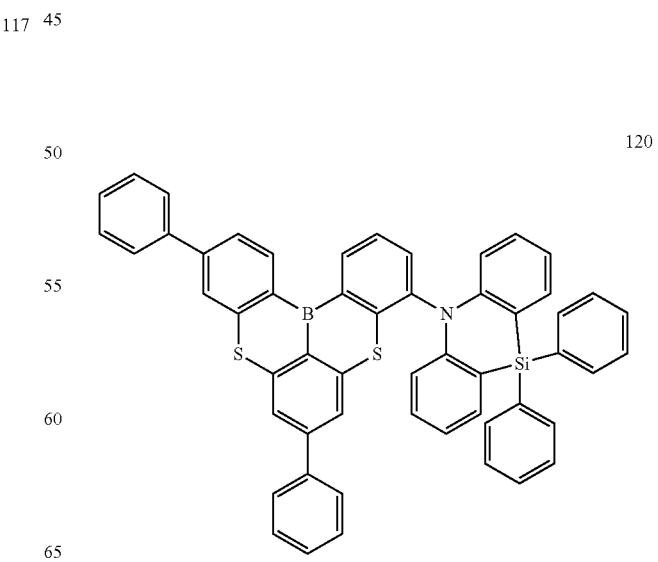

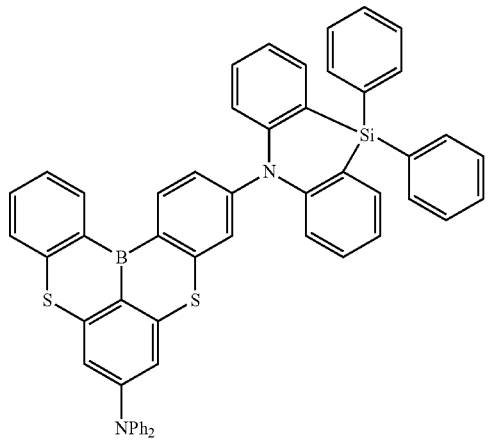
121
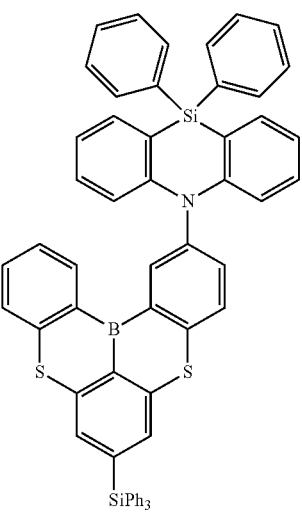
122
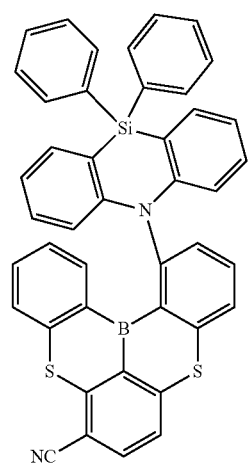
123
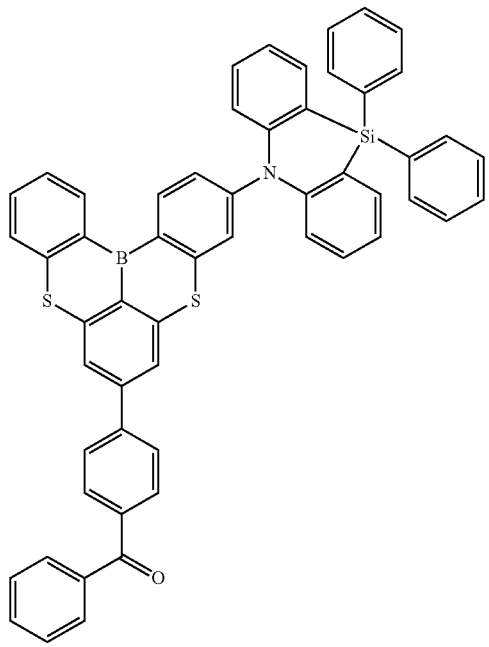
124
125
126
127

128
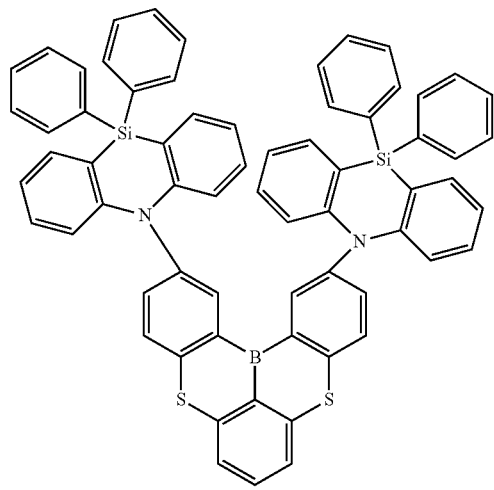
129
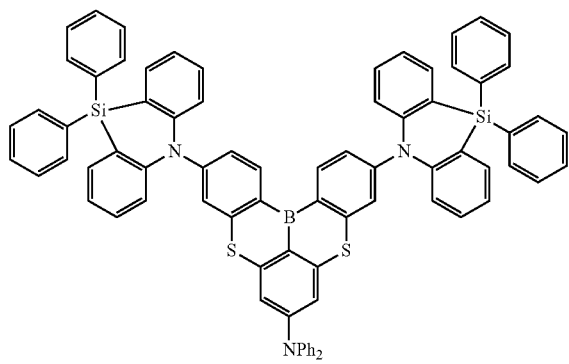
130
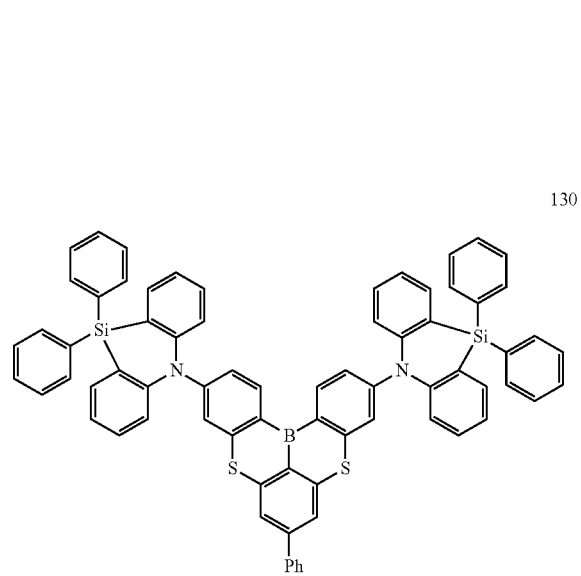
131
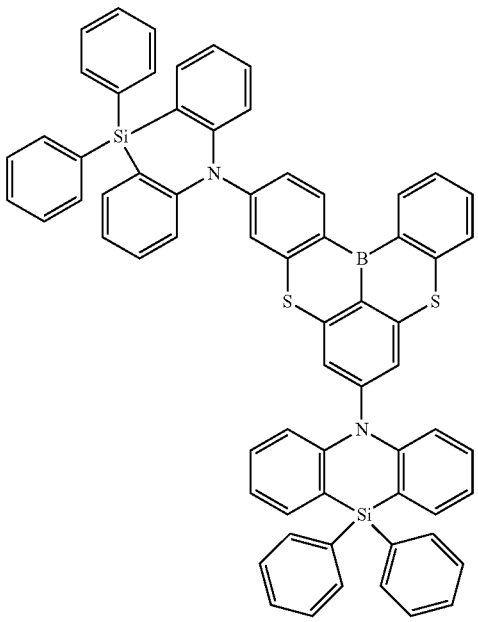
132
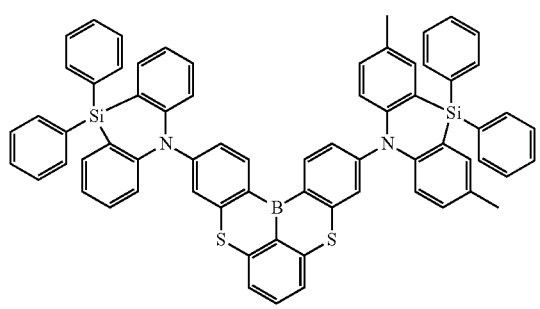
133
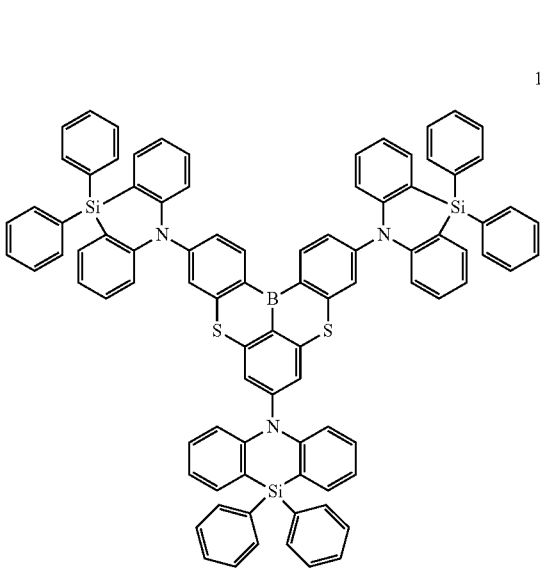

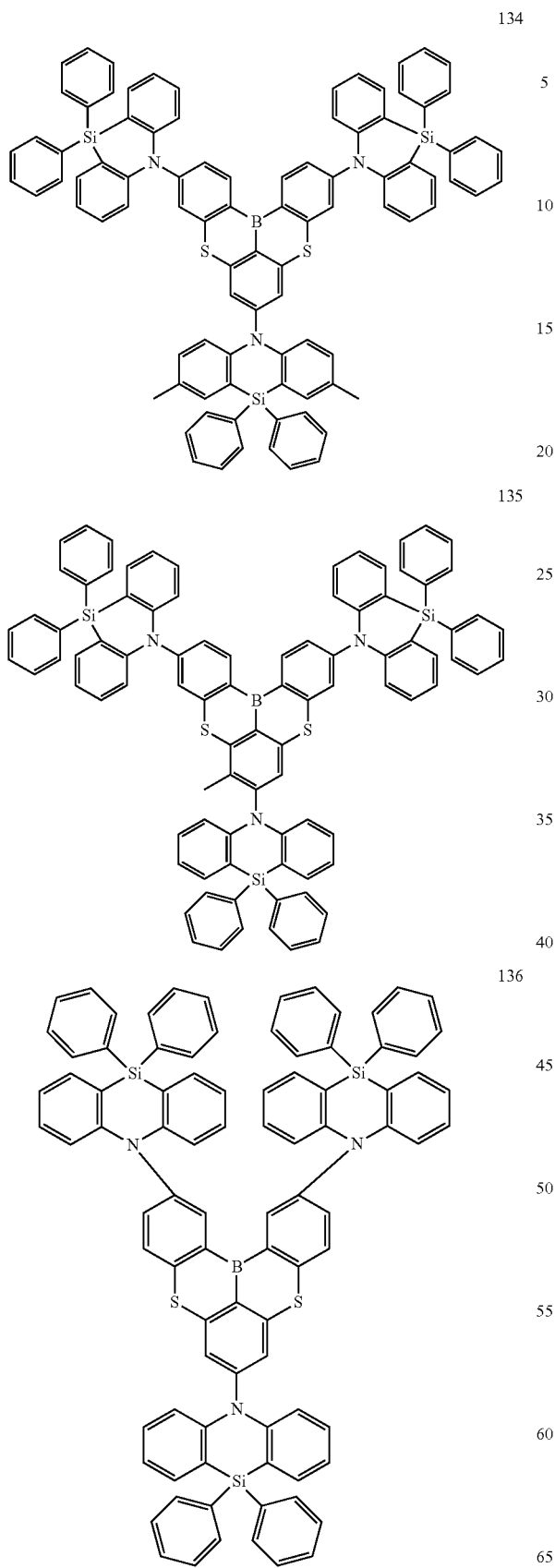

139
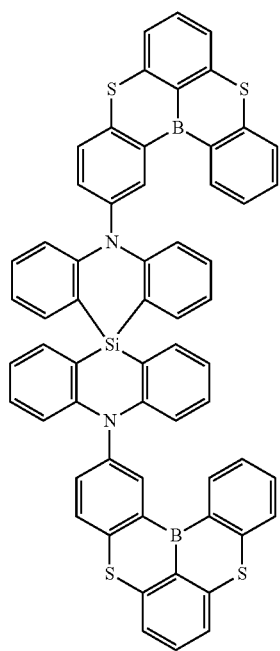
140
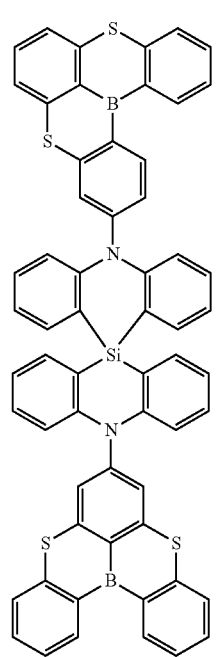
141
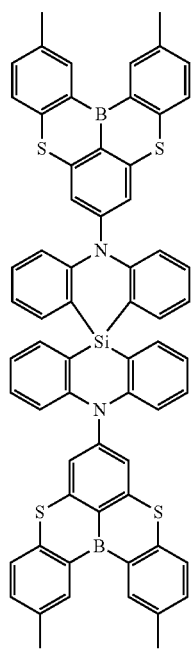
142
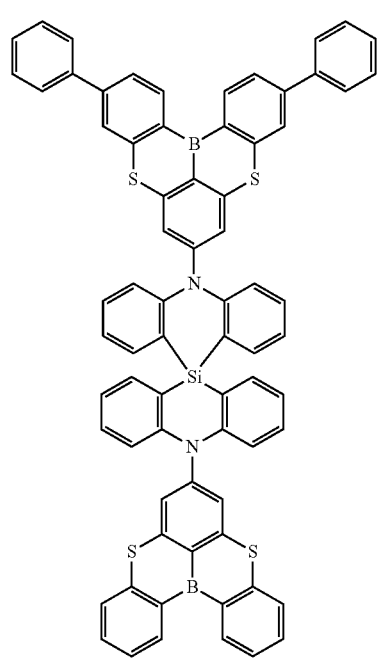

143
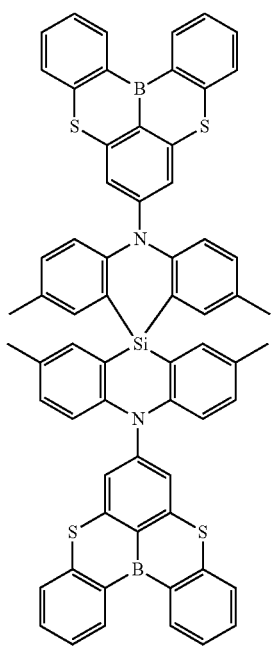
144
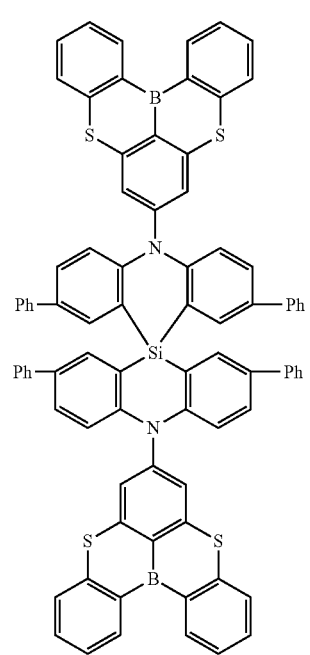
145
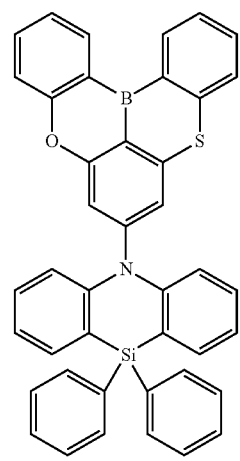
146
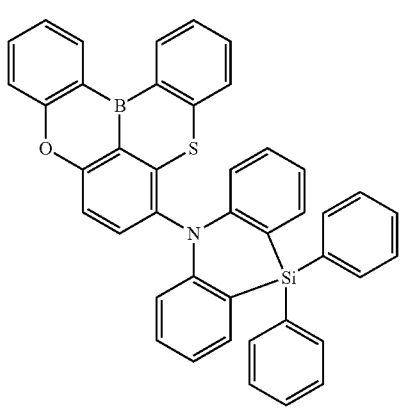
147
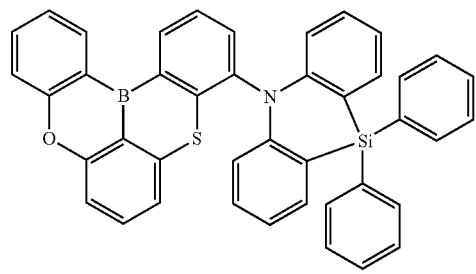
145-d
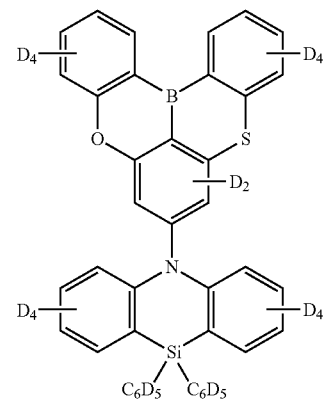

146-d
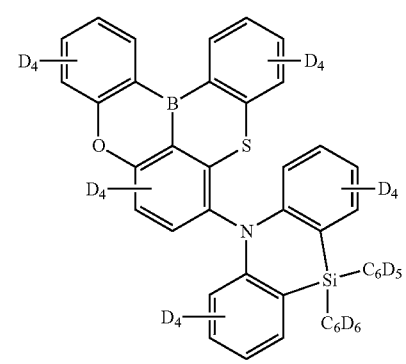
147-d
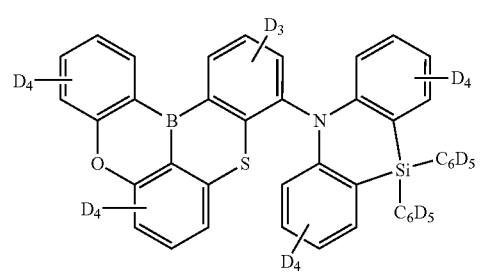
148
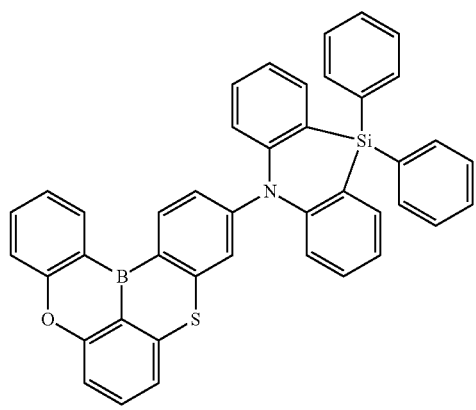
149
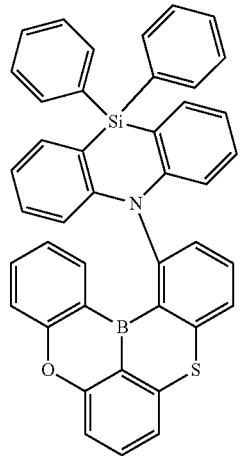
150
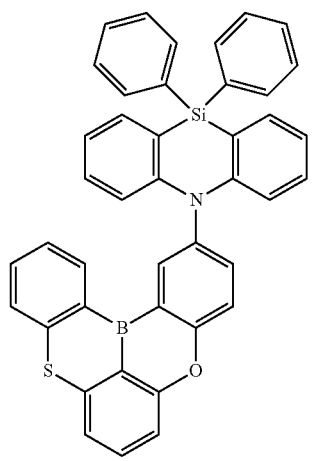
151
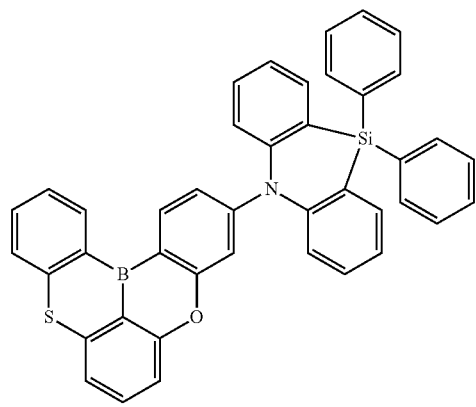
152

153
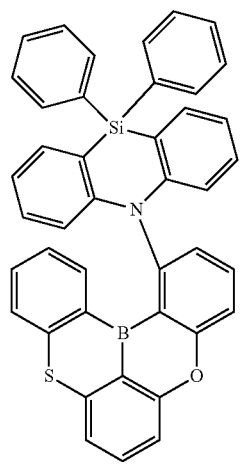
154
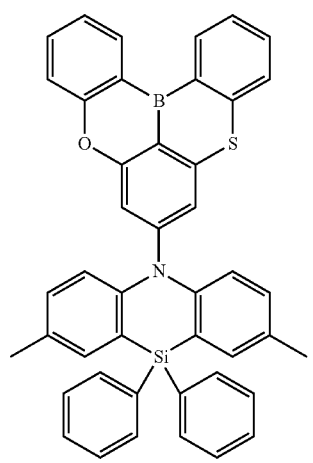
155
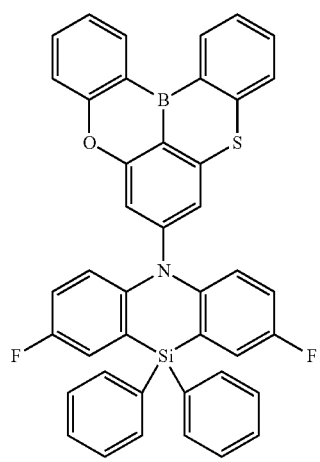
156
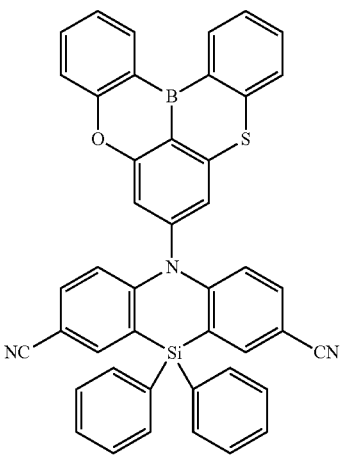
157
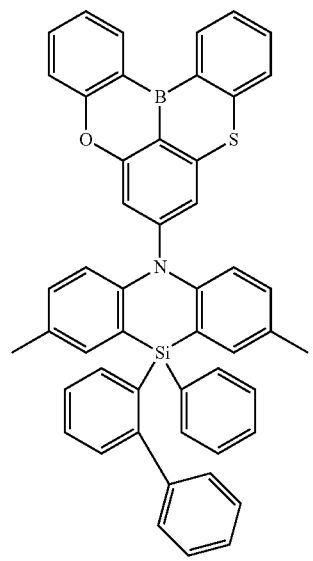
158
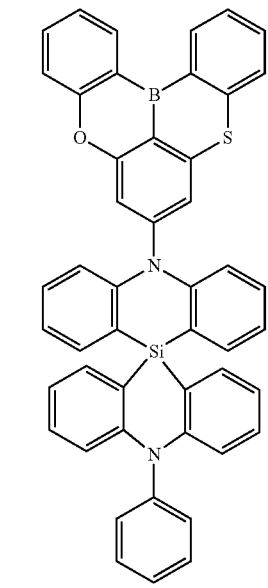

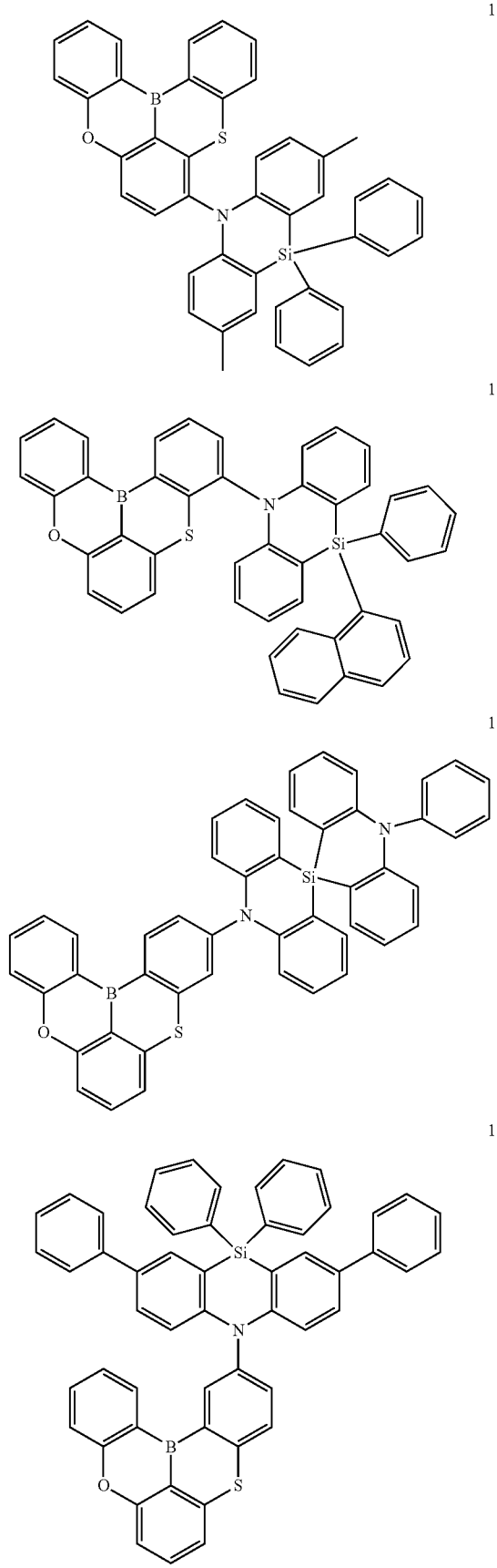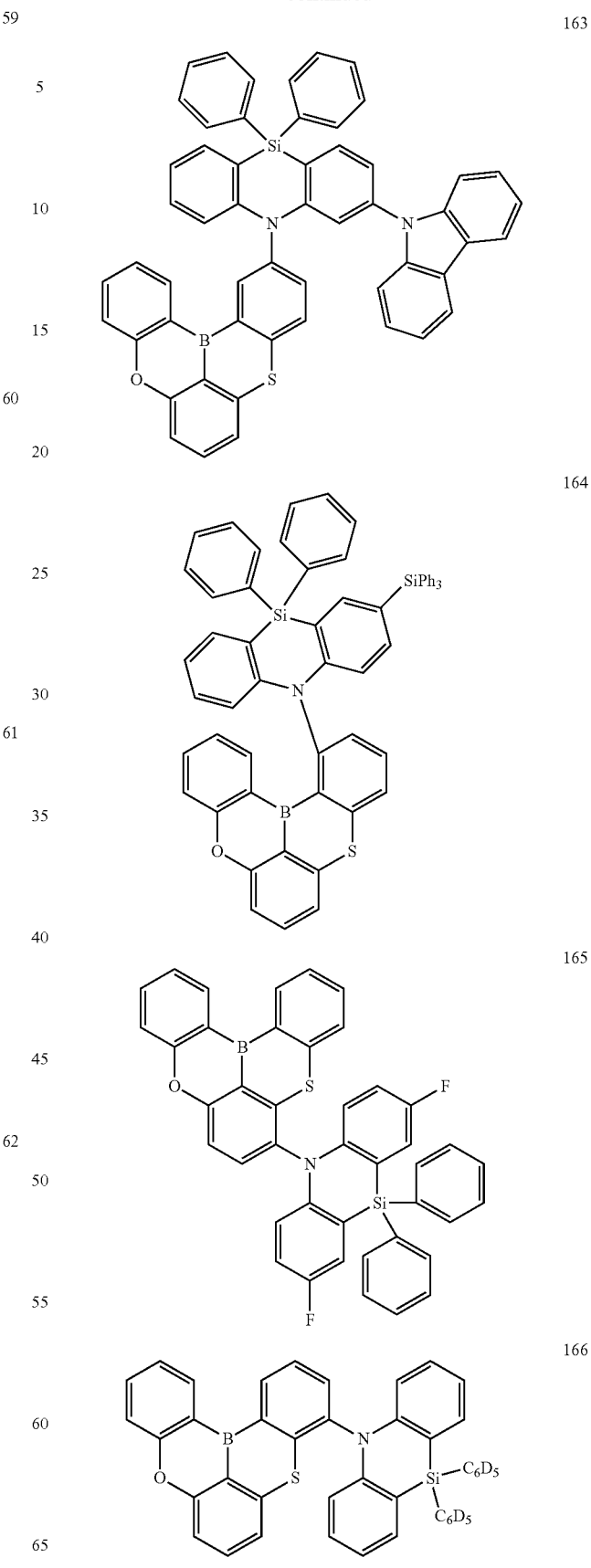

-continued
167
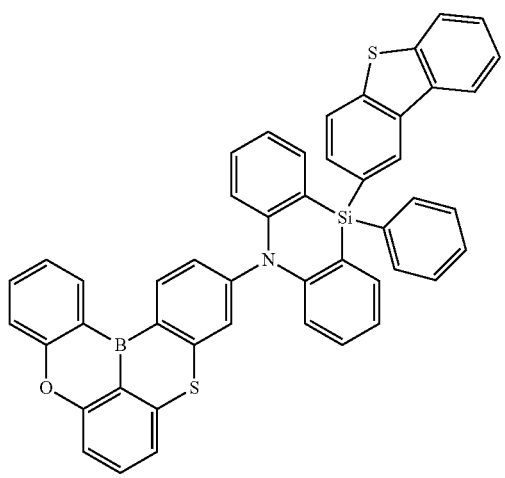
168
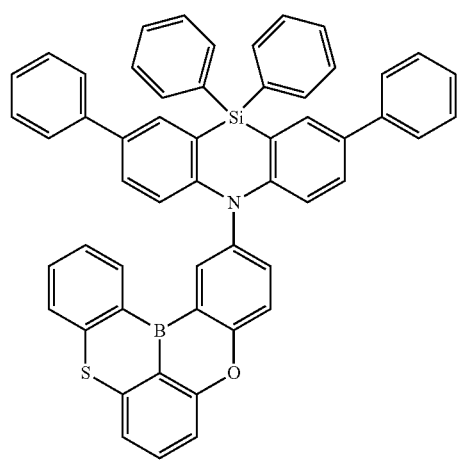
169
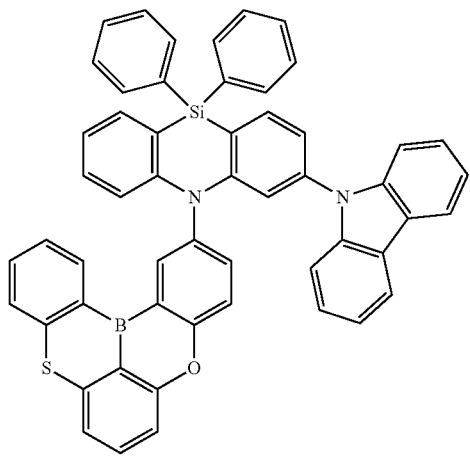
-continued
170
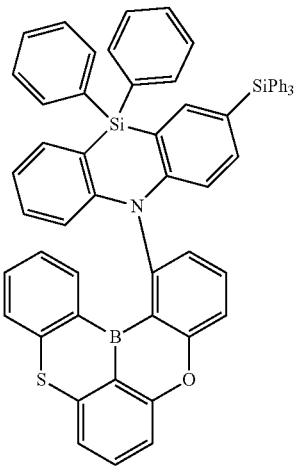
171
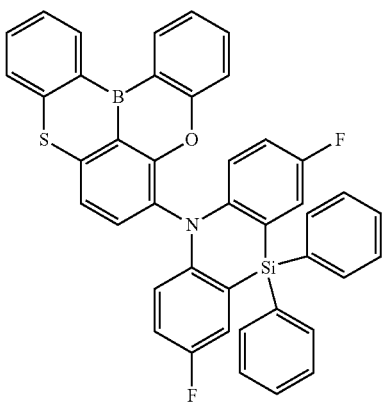
172
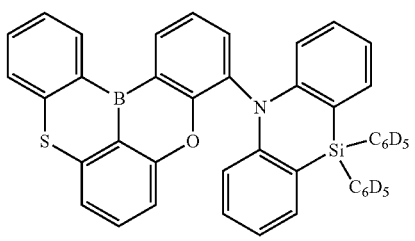
173
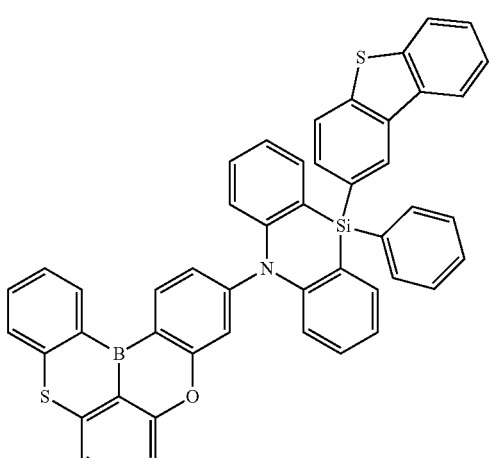

174
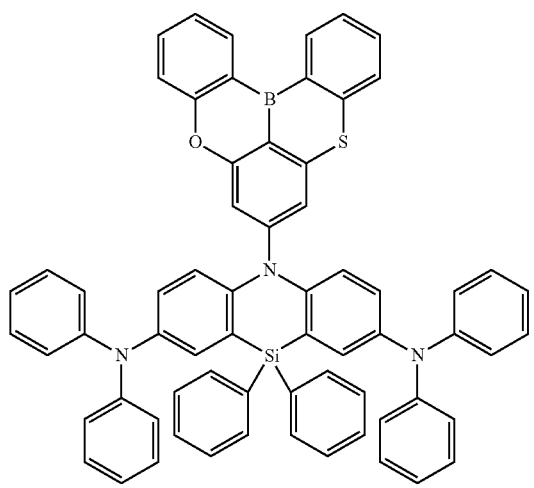
175
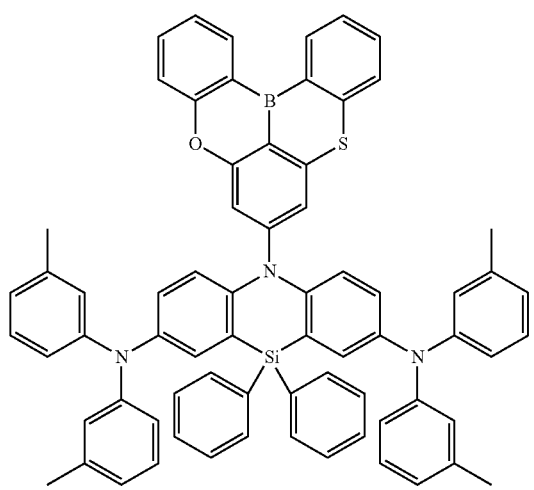
176
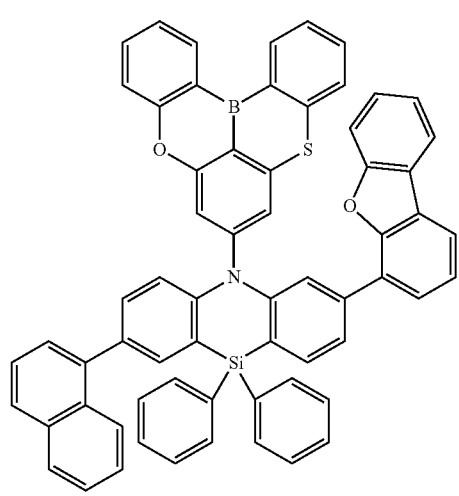
177
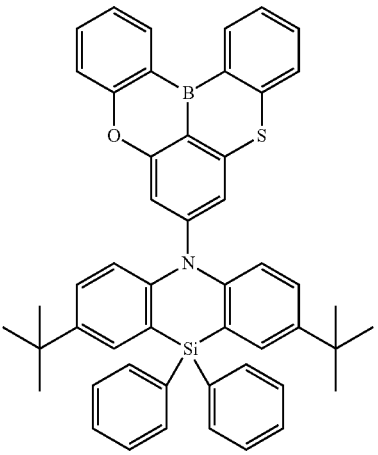
178
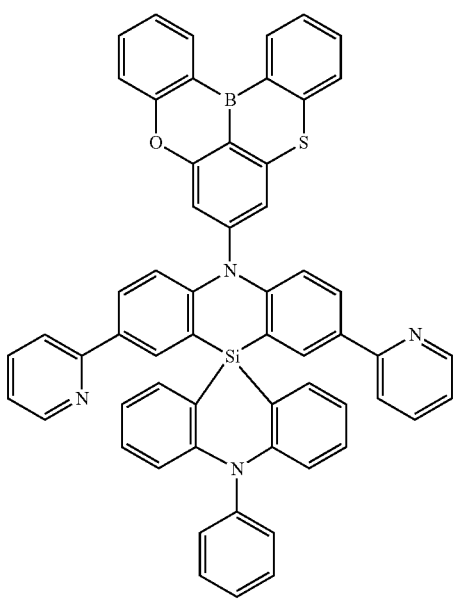
179
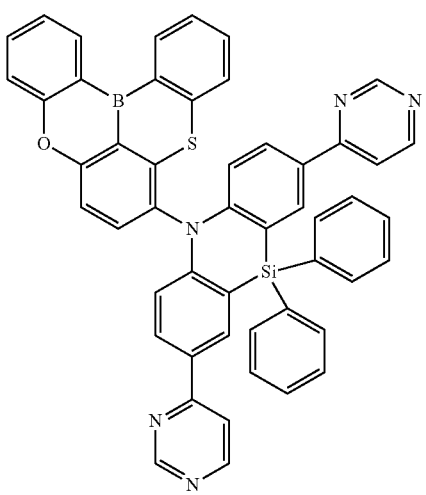

180
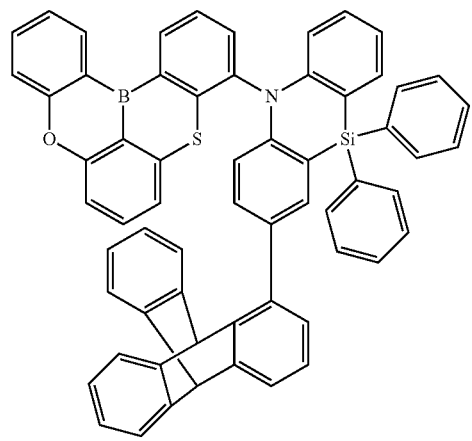
183
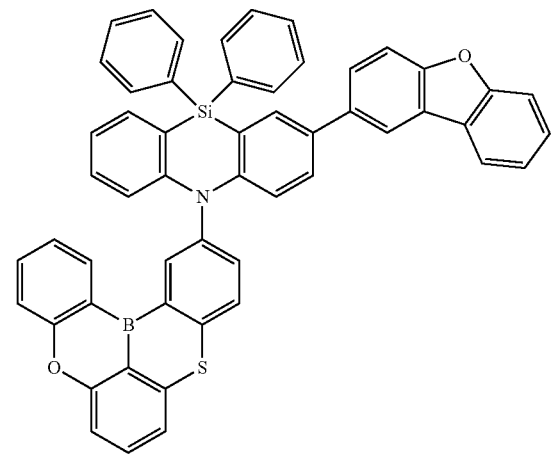
181
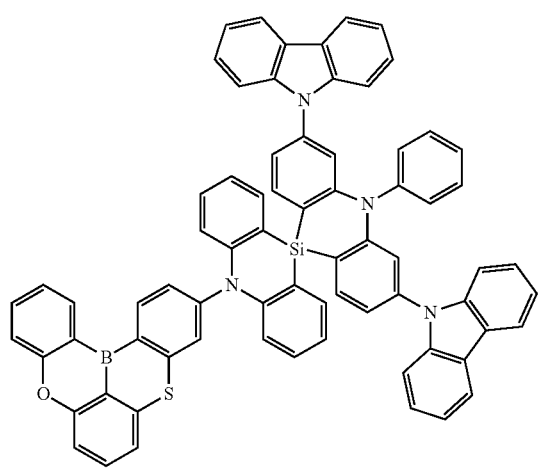
184
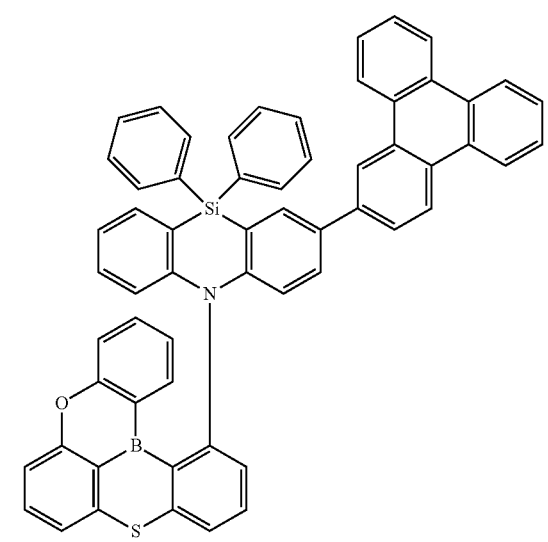
182
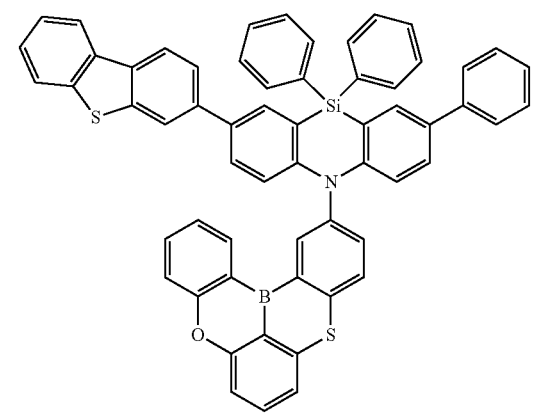
185
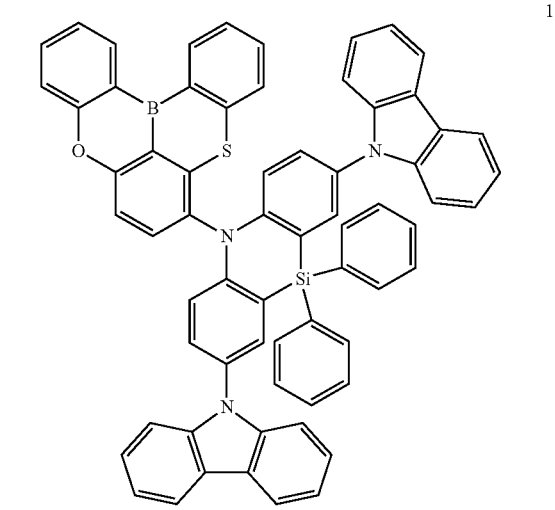

-continued
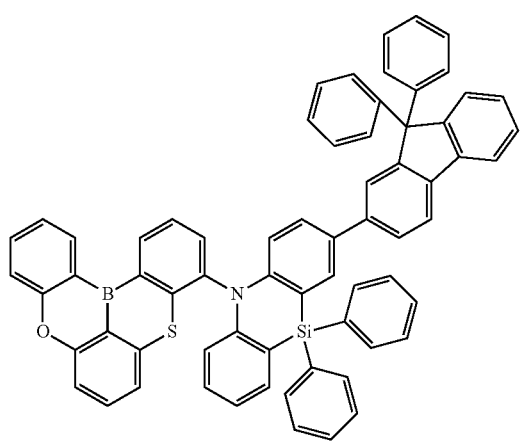
186
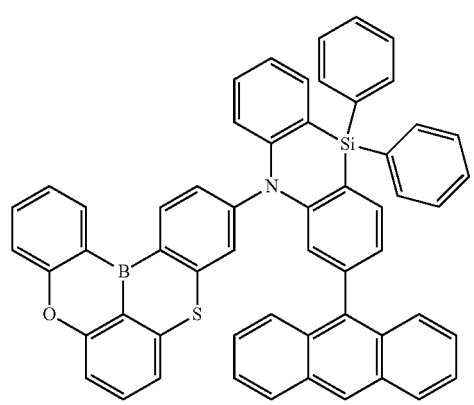
187
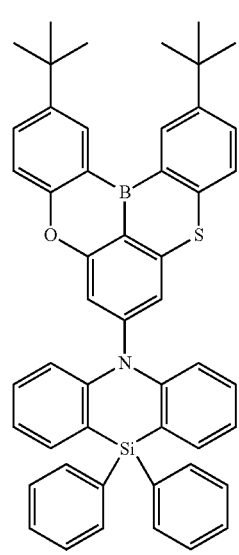
188
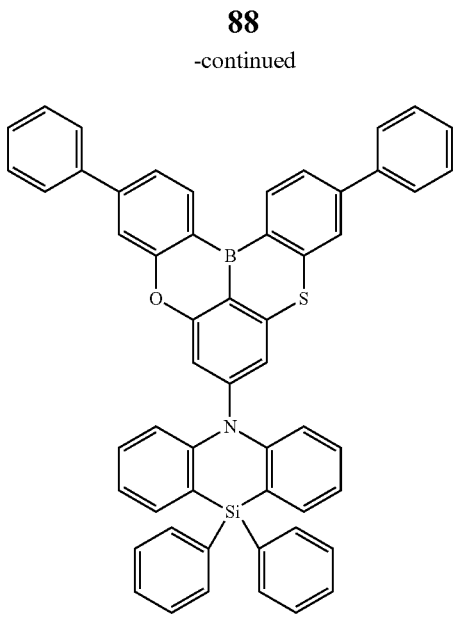
189
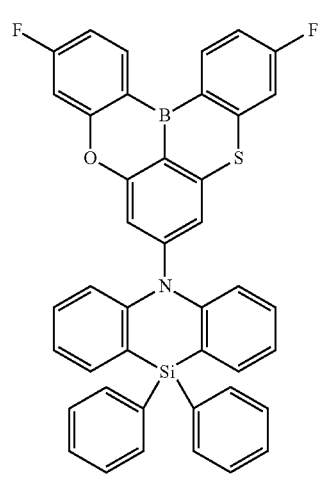
190
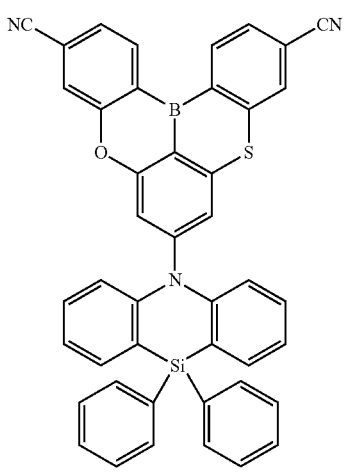
191

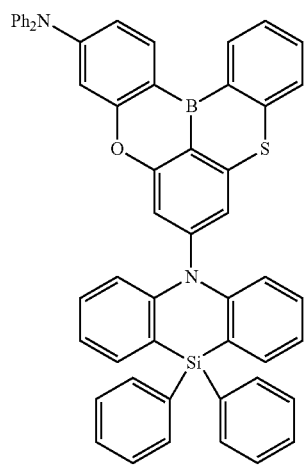
192
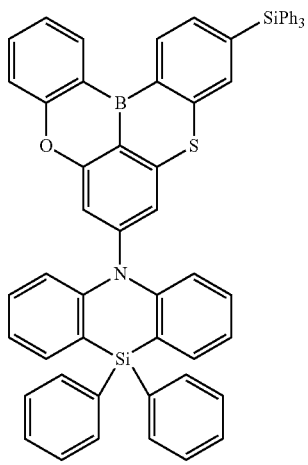
193
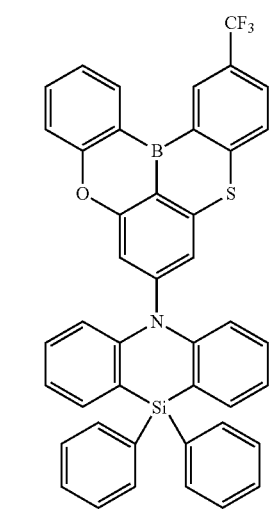
194
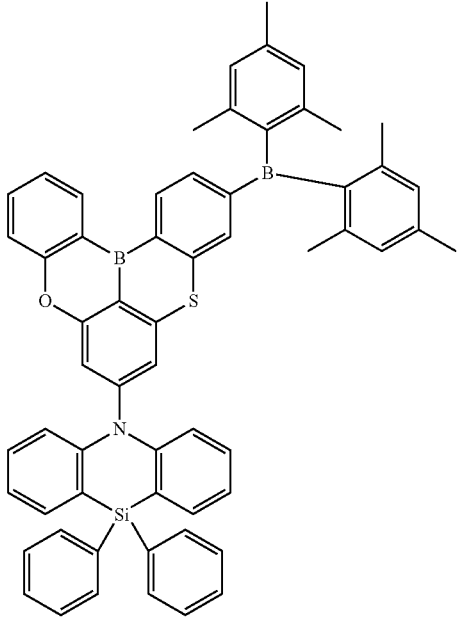
195
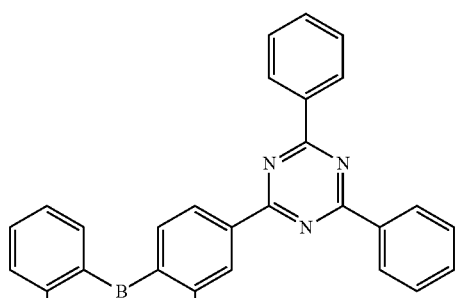
196

197
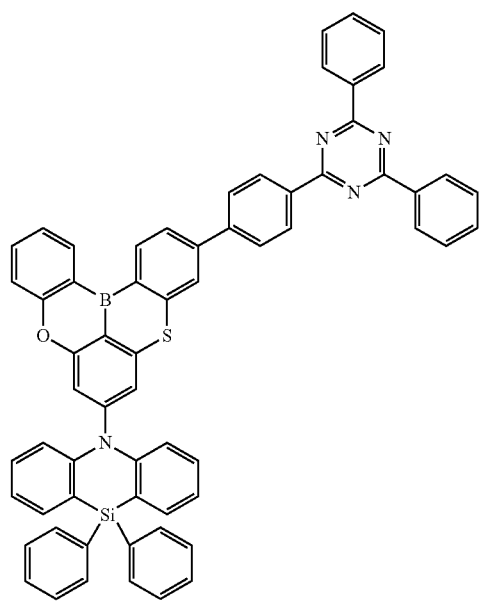
198
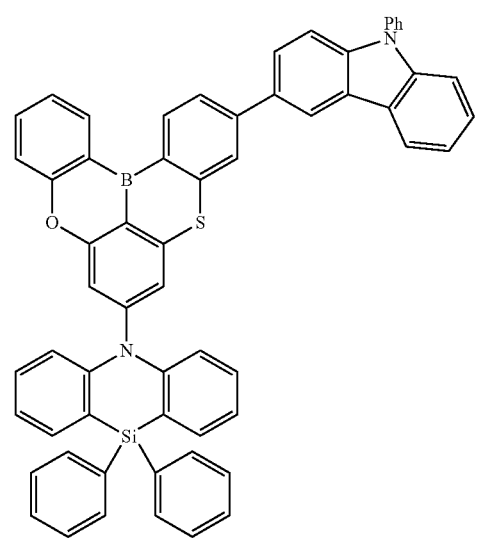
199
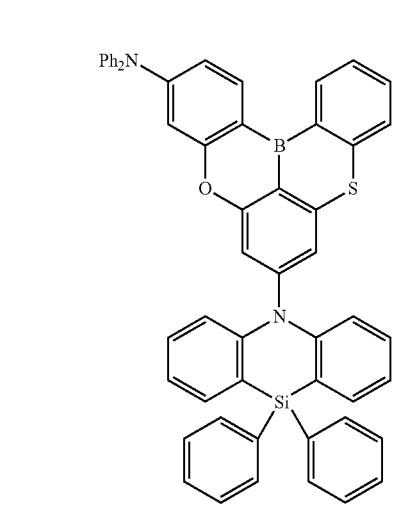
200
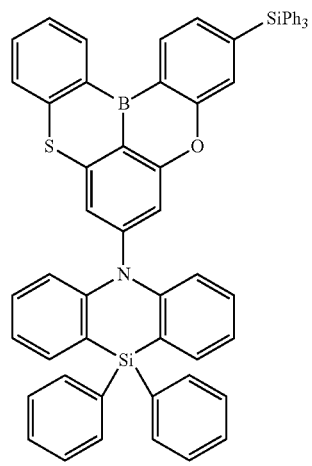
201
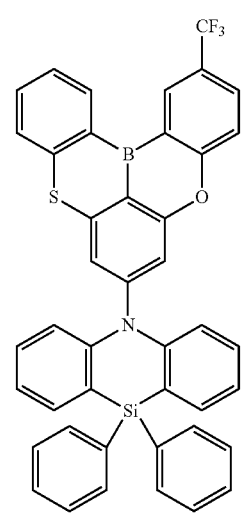
202
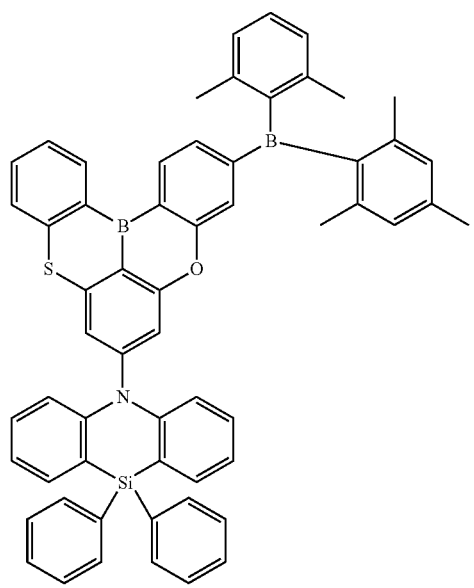

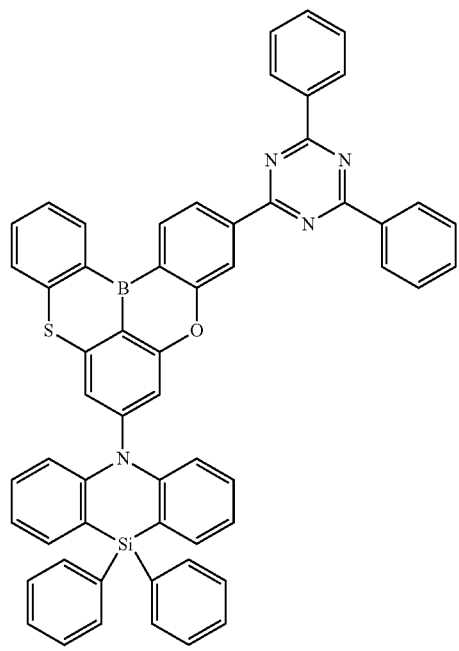
203
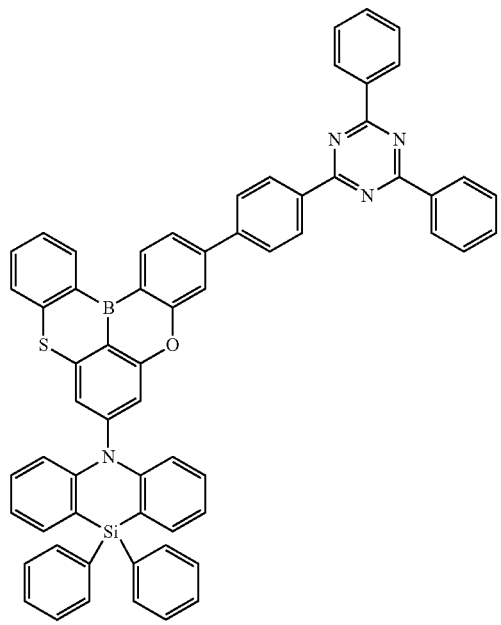
204
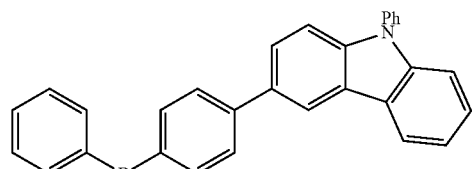
205
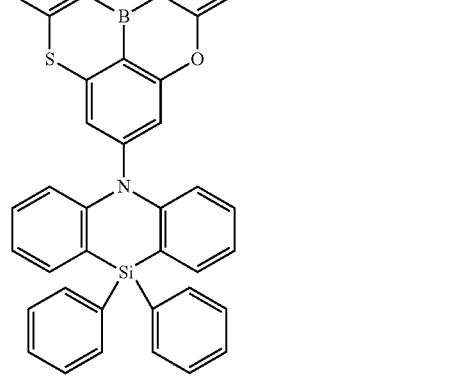
206
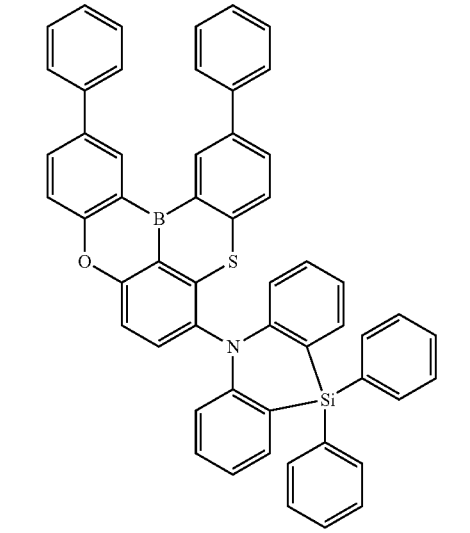
207

208
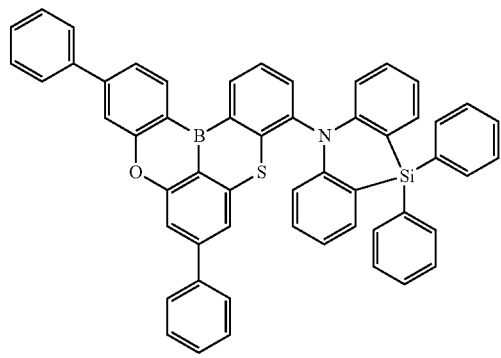
209
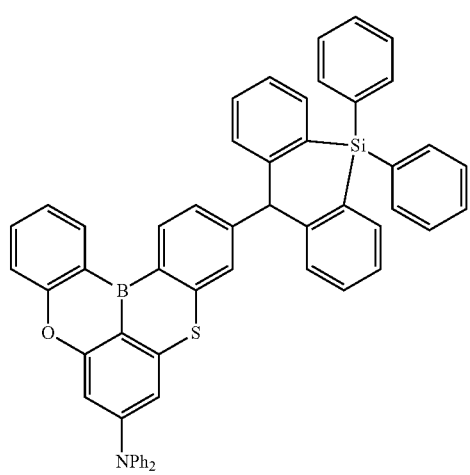
210
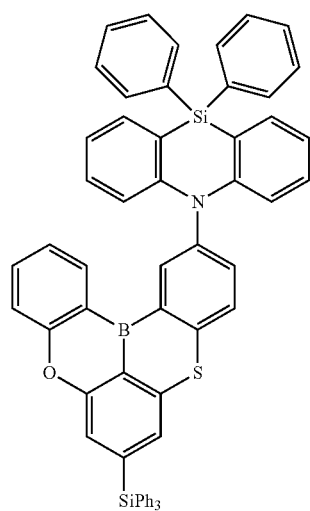
211
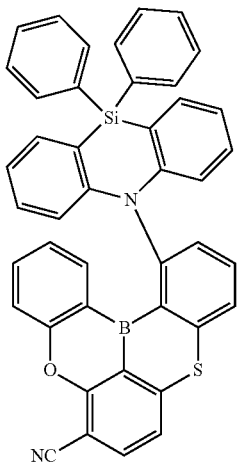
212
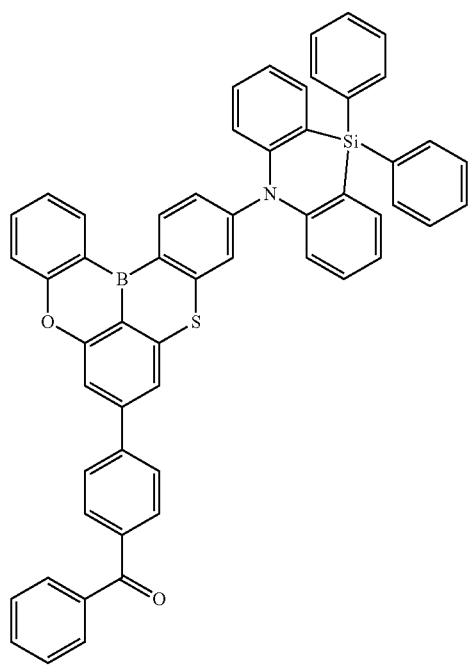

-continued
213
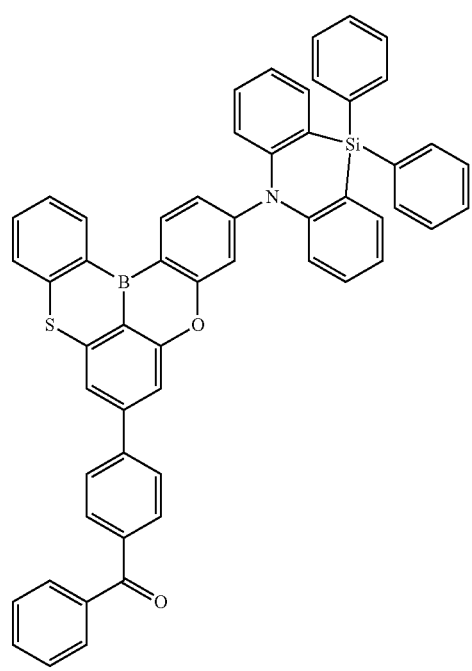
214
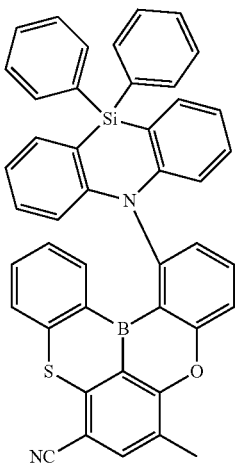
215
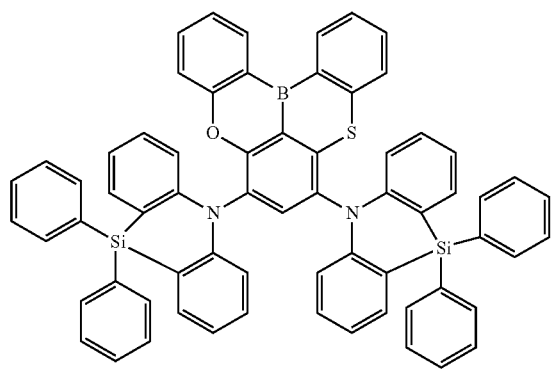
-continued
216
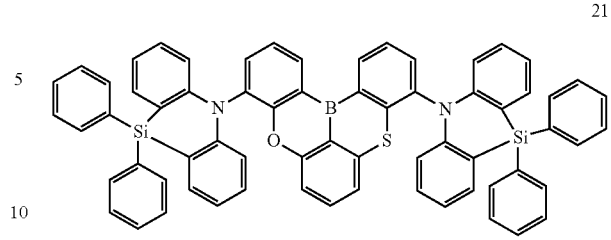
217
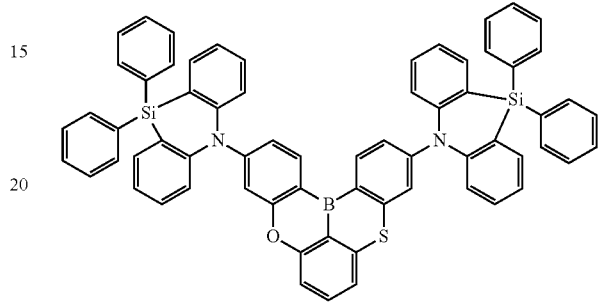
218
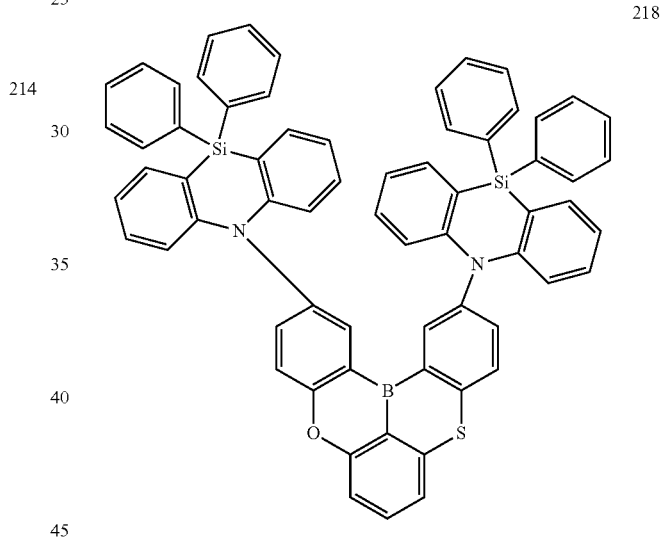
219
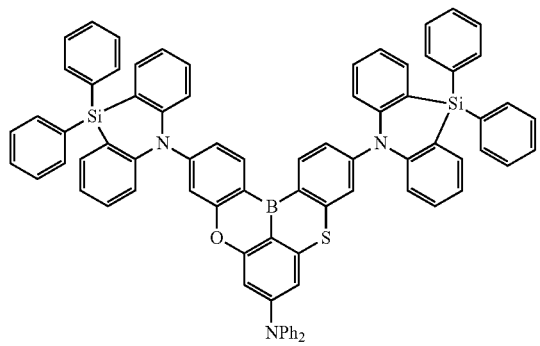

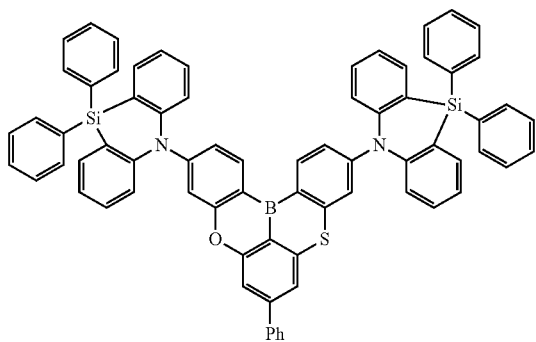
220
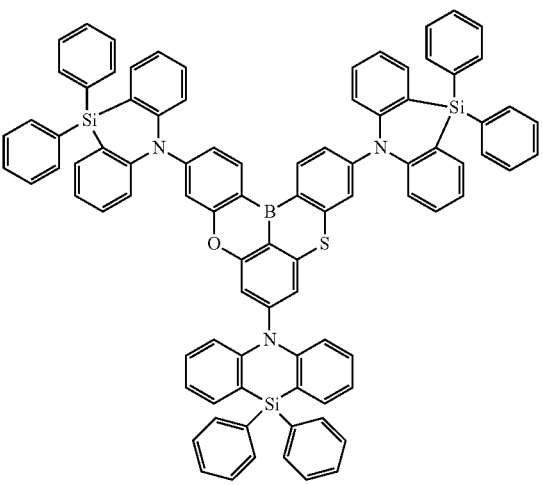
223
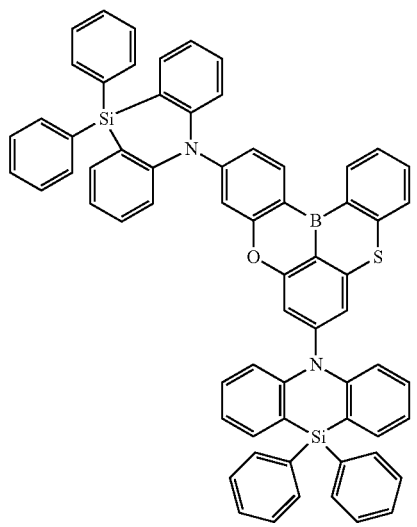
221
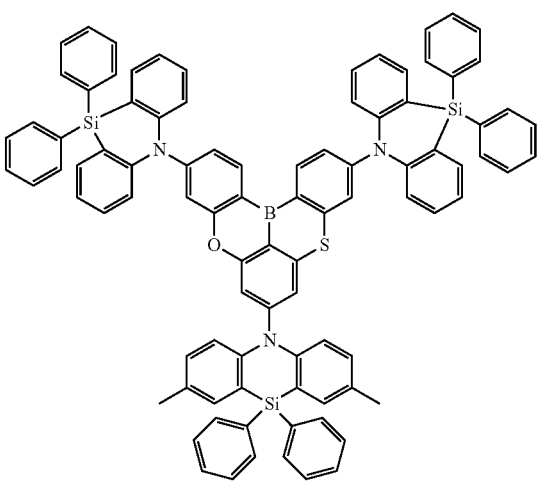
224
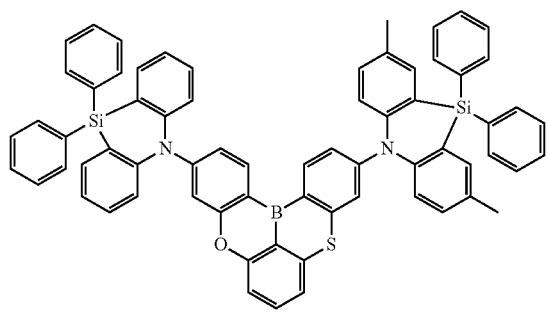
222
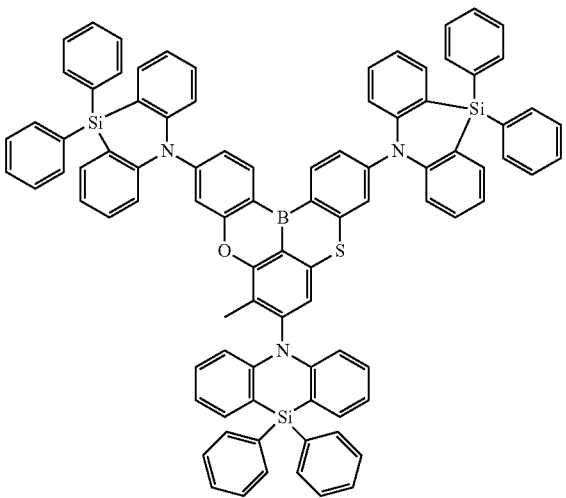
225

101
-continued
226
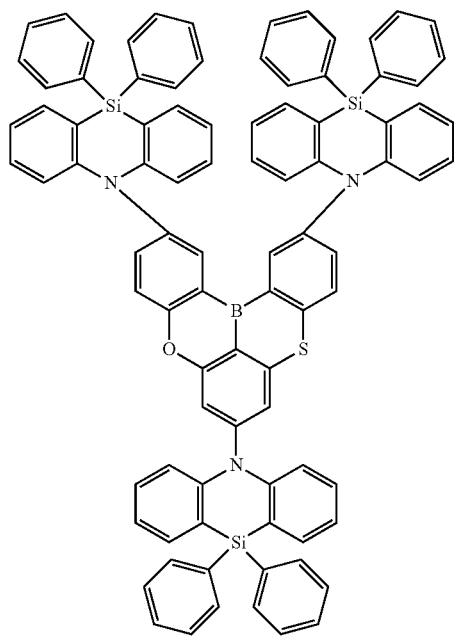
227
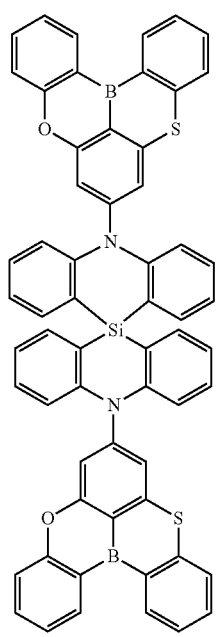
102
-continued
228
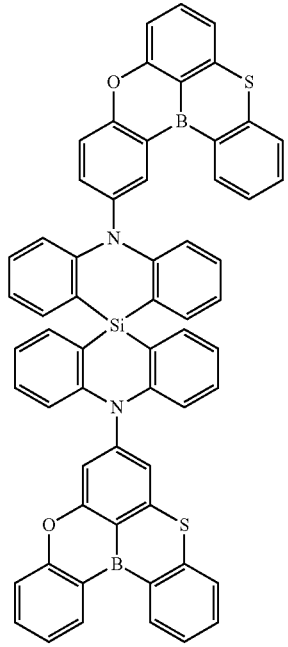
229
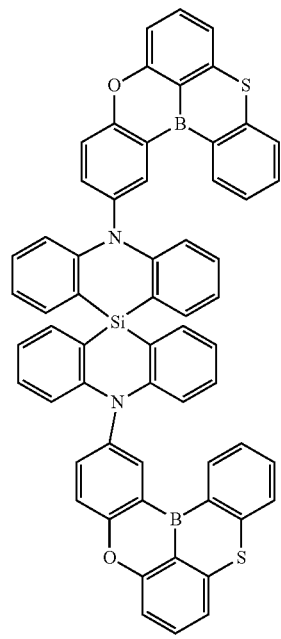

103
-continued
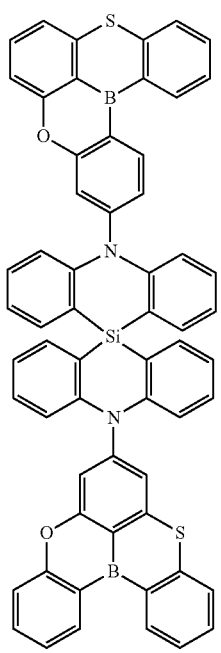
230
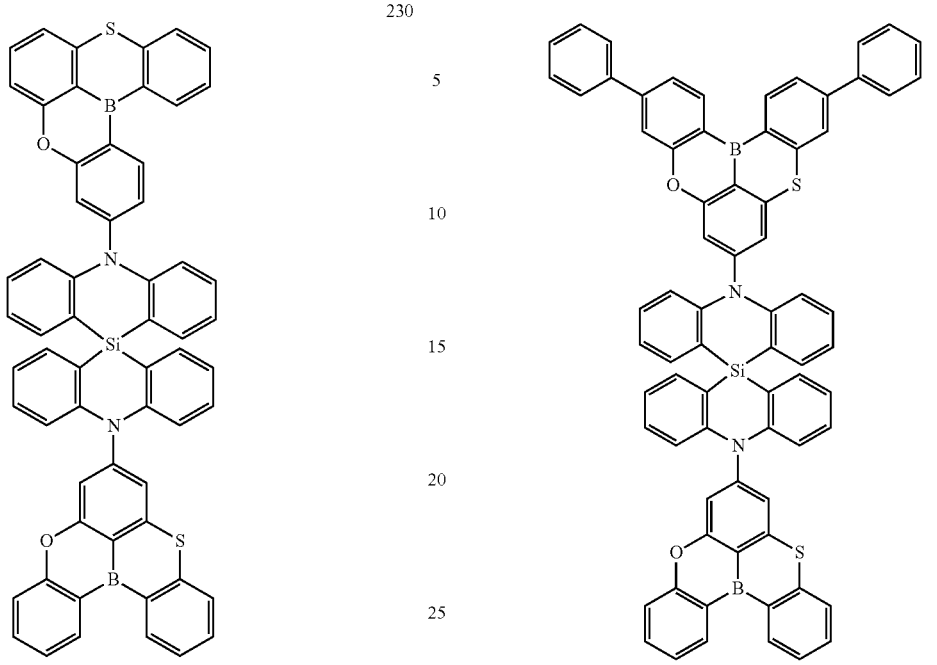
232
231
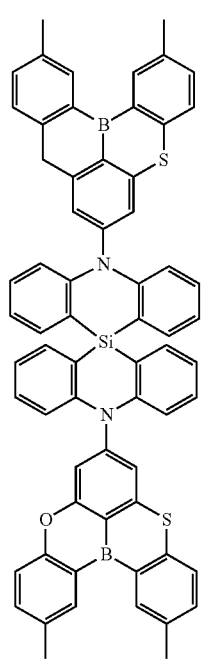
233
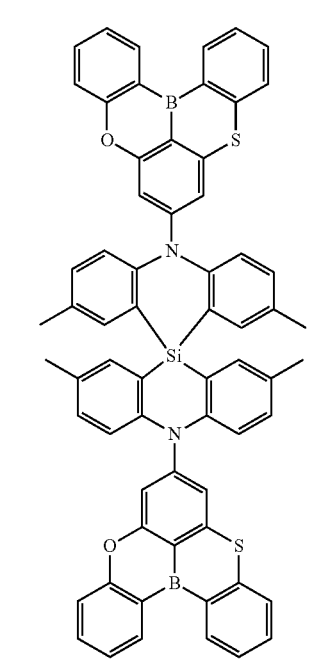

-continued

234

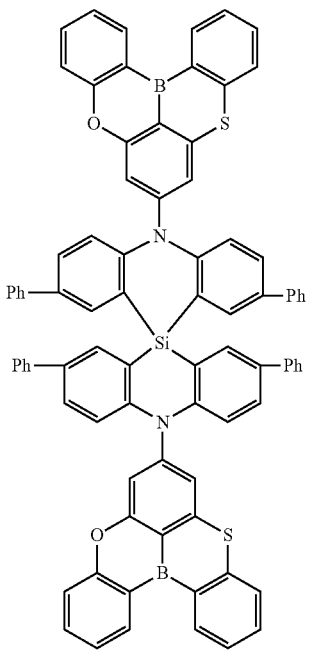

Although not all listed as an embodiment, at least one of the hydrogen atoms in the compound of an embodiment may be substituted with a deuterium atom. For example, any hydrogen atom in a compound according to an embodiment may be substituted with a deuterium atom.

For example, the compound of an embodiment may have the same form as Compound 1-d corresponding to that in which a hydrogen atom is substituted with a deuterium atom in Compound 1 of Compound Group 1, and although not listed, the form in which any hydrogen atom is substituted with a deuterium atom may be equally provided for compounds in other embodiments described in Compound Group 1.

The emission layer EML in the organic electroluminescence device 10 including the compound of an embodiment may emit a delayed fluorescence. For example, the emission layer EML may emit a thermally activated delayed fluorescence (TADF).

Although not shown in the drawings, the organic electroluminescence device 10 of an embodiment may include multiple emission layers. The emission layers may be sequentially stacked and provided. For example, the organic electroluminescence device 10 including the emission layers may emit white light. The organic electroluminescence device including emission layers may be an organic electroluminescence device having a tandem structure. When the organic electroluminescence device 10 includes multiple emission layers, at least one emission layer EML may include the above-described compound of an embodiment.

In an embodiment, the emission layer EML may include a host and a dopant, and may include the above-described compound of an embodiment as a dopant. For example, the emission layer EML in the organic electroluminescence device 10 of an embodiment may include host for emitting a delayed fluorescence and a dopant for emitting a delayed fluorescence, and may include the above-described compound of an embodiment as a dopant for emitting a delayed fluorescence. The emission layer EML may include at least one of the compounds represented by Compound Group 1 as described above as a thermally activated delayed fluorescence dopant.

In an embodiment, the emission layer EML may be a delayed fluorescence emission layer, and the emission layer EML may include a known host material and the above-described compound. For example, in the organic electroluminescence device of an embodiment, the compound of an embodiment may be used as a TADF dopant.

In an embodiment, the emission layer may include known host materials. For example, in an embodiment, the emission layer EML may include, as a host material, tris(8-hydroxyquinolino)aluminum ($Alq_3$), 4,4'-bis(N-carbazolyl)-1,1'-biphenyl (CBP), poly(N-vinylcabazole) (PVK), 9,10-di(naphthalene-2-yl)anthracene (ADN), 4,4',4''-tris(carbazol-9-yl)-triphenylamine (TCTA), 1,3,5-tris(1-phenyl-1H-benzo[d]imidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzo[b,d]furan (PPF), 3,3'-bis(N-carbazolyl)-1,1'-biphenyl (mCBP), 1,3-bis(N-carbazolyl)benzene (mCP), etc. However, embodiments are not limited thereto, and known delayed fluorescence emission host materials other than the listed host materials may be included.

The emission layer EML in the organic electroluminescence device 10 of an embodiment may further include known dopant materials. In an embodiment, the emission layer EML may further include, as dopant materials, styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzena mine (N-BDAVBi), perylene and the derivatives thereof (e.g., 2,5,8,11-tetra-t-butylperylene (TBP)), pyrene and the derivatives thereof (e.g., 1-dipyrene, 1,4-dipyrenylbenzene, 1,4-bis(N,N-diphenylamino)pyrene), etc.

In the organic electroluminescence device 10 of an embodiment illustrated in FIGS. 1 to 4, the electron transport region ETR is provided on the emission layer EML. The electron transport region ETR may include at least one of a hole blocking layer HBL, an electron transport layer ETL, or an electron injection layer EIL, but an embodiment is not limited thereto. The electron transport region ETR may have a single layer formed of a single material, a single layer formed of different materials, or a multilayer structure including layers formed of different materials.

For example, the electron transport region ETR may have a single layer structure of an electron injection layer EIL or an electron transport layer ETL, and may have a single layer structure formed of an electron injection material and an electron transport material. The electron transport region ETR may have a single layer structure formed of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, in a range of about 1000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the embodiments are not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-Tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (B3PyPB), or a mixture thereof. The thickness of the electron transport layers ETL may be in a range of about 100 Å to about 1,000 Å. For example, the thickness of the electron transport layers ETL may be in a range of about 150 Å to about 500 Å. If the thickness of the electron transport layers ETL satisfies the above-described range, satisfactory electron transport characteristics may be obtained without a substantial increase in driving voltage.

When the electron transport region ETR includes the electron injection layer EIL, the electron transport region ETR may be formed using metal halides such as LiF, NaCl, CsF, RbCl, RbI, and CuI, lanthanum metals such as Yb, co-deposition of the metal halides and the lanthanum metals (e.g., KI:Yb or RbI:Yb, etc.), metal oxides such as $Li_2O$ and BaO, lithium quinolato (LiQ), etc., but the embodiments are not limited thereto. The electron injection layer EIL may also be formed of a mixture material of an electron transport material and an insulating organo-metal salt. The organo-metal salt may be a material having an energy band gap of greater than or equal to about 4 eV. For example, the organo-metal salt may include metal acetates, metal benzoates, metal acetoacetates, metal acetylacetonates or metal stearates. The thickness of the electron injection layer EIL may be in a range of about 1 Å to about 100 Å. For example, the thickness of the electron injection layer EIL may be in a range of about 3 Å to about 90 Å. If the thickness of the electron injection layers EIL satisfies the above-described range, satisfactory electron injection properties may be obtained without a substantial increase in driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), 4,7-diphenyl-1,10-phenanthroline (Bphen), DPEPO, and PPF, but is not limited thereto.

The second electrode EL2 is provided on the electron transport region ETR. The second electrode EL2 may be a common electrode or cathode. The second electrode EL2 may be a transmissive electrode, a transflective electrode, or a reflective electrode. When the second electrode EL2 is a transmissive electrode, the second electrode EL2 may include a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof, or a mixture thereof (e.g., AgMg, AgYb, or MgAg). In other embodiments, the second electrode EL2 may have a multi-layer structure including a reflective layer or a transflective layer formed of the above-described materials, and a transparent conductive layer formed of ITO, IZO, ZnO, ITZO, etc.

Although not shown, the second electrode EL2 may be connected to an auxiliary electrode. If the second electrode EL2 is connected with the auxiliary electrode, the resistance of the second electrode EL2 may decrease.

A capping layer CPL may be further disposed on the second electrode EL2 of the organic electroluminescence device 10 according to an embodiment. The refractive index of the capping layer CPL may be greater than or equal to about 1.6. For example, the refractive index of the capping layer CPL may be greater than or equal to about 1.6 at a wavelength of about 589 nm.

The capping layer CPL may be an organic layer or an inorganic layer. For example, when the capping layer CPL includes an inorganic material, the inorganic material may include an alkaline metal compound such as LiF, an alkaline earth metal compound such as $MgF_2$, SiON, $SiN_x$, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl)biphenyl-4,4'-diamine (TPD15), 4,4',4''-tris (carbazol-9-yl)triphenylamine (TCTA), etc., or an epoxy resin, or acrylate such as methacrylate. However, the embodiments are not limited thereto, and the organic material may also include Compounds P1 to P5 below.

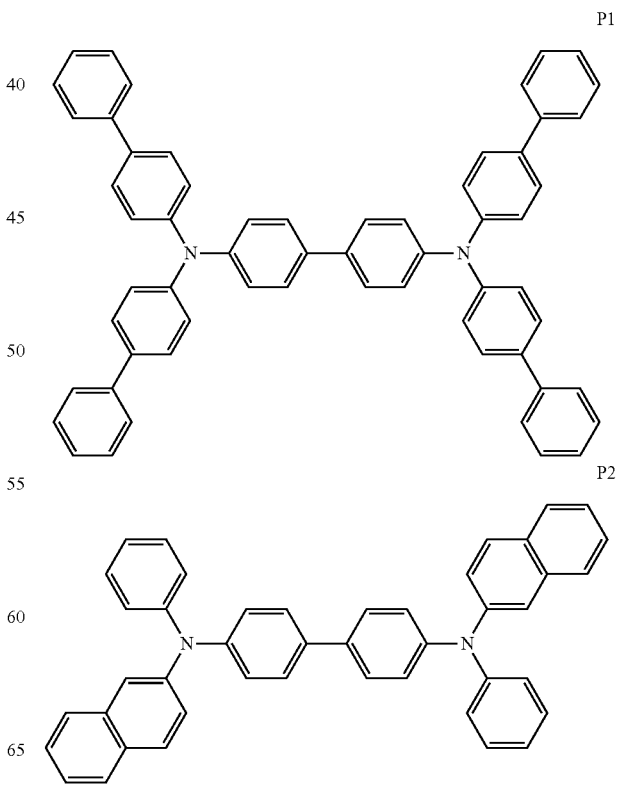

P3

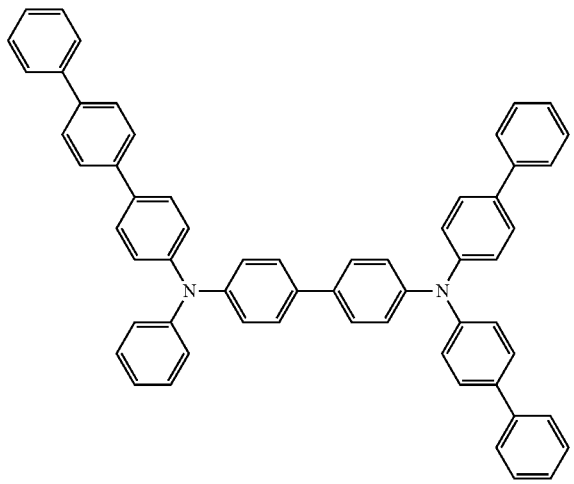

P4

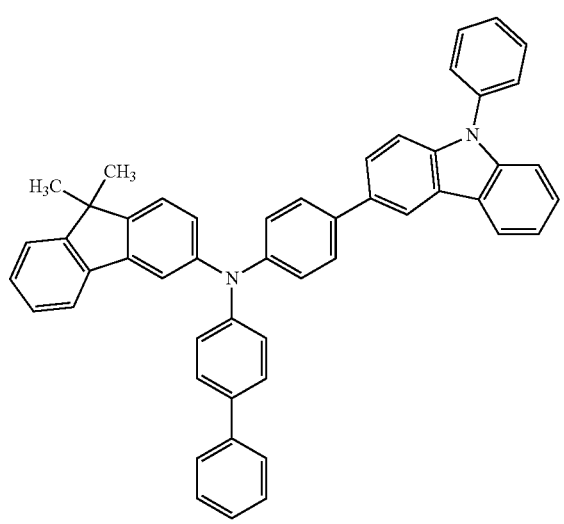

P5

CPL1

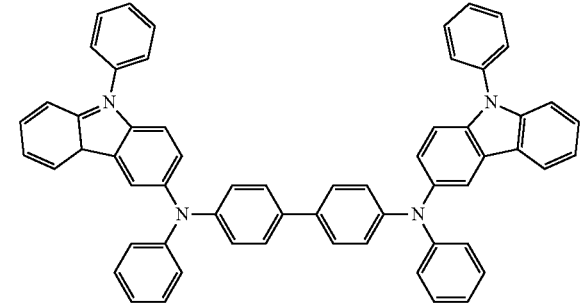

CPL2

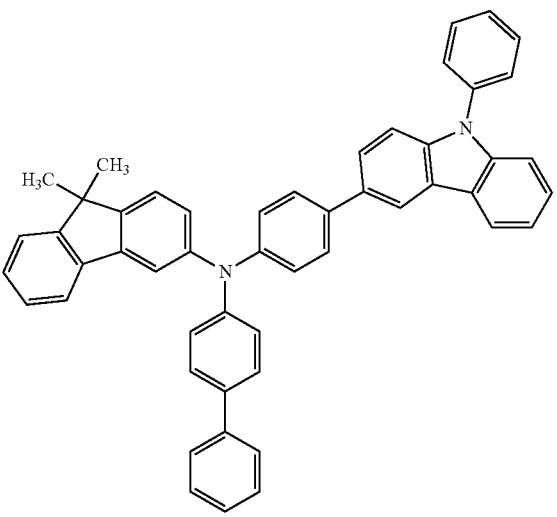

However, the embodiments are not limited thereto, and a capping layer CPL may include an amine compound. For example, the capping layer CPL may include at least one of Compound CPL1 or Compound CPL2 below.

The organic electroluminescence device 10 according to an embodiment of the inventive concept may include the above-described compound of an embodiment in the emission layer EML disposed between the first electrode EL1 and the second electrode EL2 to exhibit excellent light emission efficiency. The organic electroluminescence device of an embodiment may exhibit high light emission efficiency in an emission wavelength region of blue light. The compound according to an embodiment may be a thermally activated delayed fluorescence dopant, and the emission layer EML may include the compound of an embodiment to emit a thermally activated delayed fluorescence, thereby exhibiting good light emission efficiency characteristics.

The above-described compound of an embodiment may be included as a material for the organic electroluminescence device 10 in a functional layer in addition to the emission layer EML. For example, the organic electroluminescence device 10 of an embodiment of the inventive concept may also include the above-described compound in at least one functional layer disposed between the first electrode EL1 and the second electrode EL2, or in the capping layer CPL disposed on the second electrode EL2.

When the above-described compound of an embodiment is used as a material of the organic electroluminescence device by including an azasiline unit and a condensed cyclic unit containing an oxaborine or a thiaborine ring essentially containing a boron atom (B), efficiency of the organic electroluminescence device may be more improved. Furthermore, the organic electroluminescence device of an embodiment including the compound of an embodiment in the emission layer may emit deep blue light and exhibit high efficiency characteristics.

Hereinafter, with reference to Examples and Comparative Examples, a compound according to an embodiment of this inventive concept and an organic electroluminescence device of an embodiment will be described in detail. The Examples shown below are illustrated only for the understanding of this inventive concept, and the scope of the inventive concept is not limited thereto.

EXAMPLES

1. Synthesis of Compound of One Embodiment

First, a synthesis method for a compound according to an example will be described in detail by illustrating a synthetic method of Compounds 1, 55, and 60. In the following descriptions, a compound synthesis method is provided as an example, but the synthetic method for a compound according to an embodiment of the inventive concept is not limited to Examples below.

(1) Synthesis of Compound 1

Compound 1 according to an example may be synthesized by, for example, the steps shown in Reaction Scheme 1 below:

In a nitrogen atmosphere, Intermediate A-1 (0.70 g, 2.00 mmol), Intermediate A-2 (0.49 g, 1.40 mmol), Pd(dba$_2$)$_3$ (0.09 g, 0.10 mmol), SPhos (0.04 g, 0.10 mmol) and t-BuONa (0.19 g, 2.00 mmol) were refluxed in toluene for 3 hours. The reaction mixture was cooled to room temperature and filtered using a celite pad. The filtrate was concentrated under reduced pressure. The crude product was purified by a silica gel column chromatography (using eluent having a 2:1 volume ratio of hexane and chloroform) to obtain Compound 1 which is a white solid (0.25 g, yield 20%). Compound 1 was identified with NMR analysis. [$^1$H NMR (500 MHz, CDCl$_3$, δ): 8.72 (d, J=7.5 Hz, 2H), 7.72 (d, J=7.5 Hz, 2H), 7.64-7.61 (m, 6H), 7.52 (d, J=8.5 Hz, 2H), 7.43-7.36 (m, 8H), 7.26-7.21 (m, 2H), 7.11 (s, 2H), 7.01 (t, J=7.3 Hz, 2H), 6.75 (d, J=8.5 Hz, 2H)]

(2) Synthesis of Compound 55

Compound 55 according to an example may be synthesized by, for example, the steps shown in Reaction Formula 2 below:

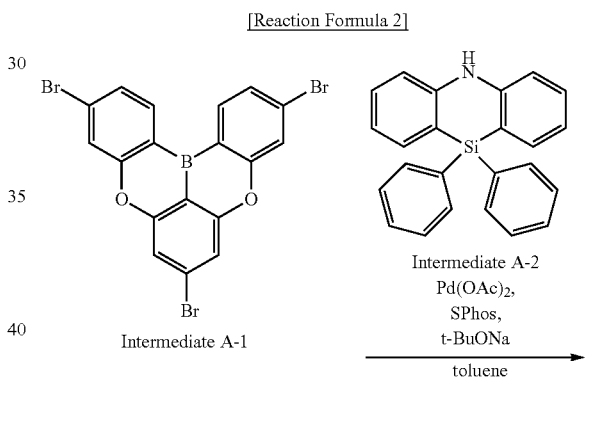

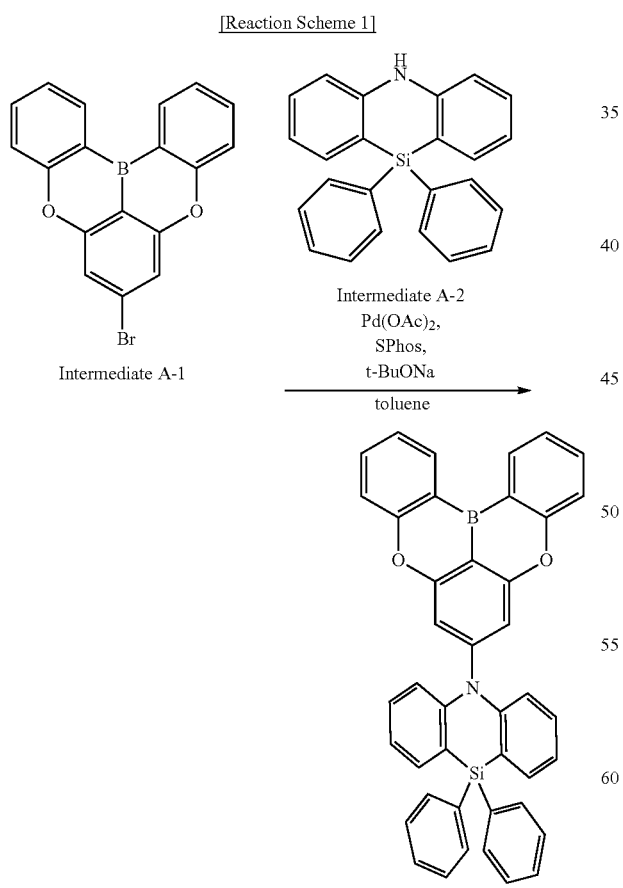

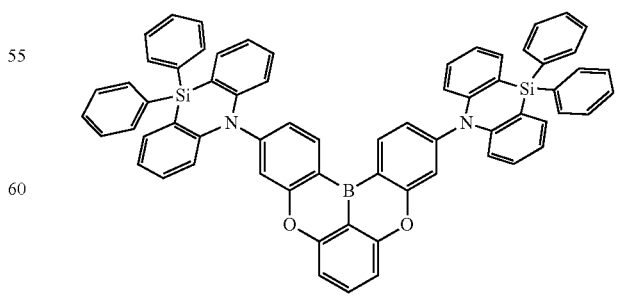

In a nitrogen atmosphere, Intermediate B-1 (0.51 g, 2.00 mmol), Intermediate A-2 (0.81 g, 2.32 mmol), Pd(dba$_2$)$_3$ (0.10 g, 0.10 mmol), SPhos (0.04 g, 0.10 mmol) and t-BuONa (0.32 g, 2.00 mmol) were refluxed in toluene for 3 hours. The reaction mixture was cooled to room temperature and filtered using a celite pad. The filtrate was concentrated under reduced pressure. The crude product was purified by a silica gel column chromatography (using eluent having a 2:1 volume ratio of hexane and chloroform) to obtain Compound 55 which is a light yellow solid (0.14 g, yield 14%). Compound 55 was identified with NMR analysis. [$^1$H NMR (500 MHz, CDCl$_3$, δ): 8.86 (d, J=8.0 Hz, 2H), 7.82 (t, J=8.3 Hz, 1H), 7.65-7.62 (m, 12H), 7.48 (s, 2H), 7.43-7.37 (m, 12H), 7.29 (d, J=8.5 Hz, 2H), 7.23 (t, J=7.0 Hz, 6H), 7.01 (t, J=7.3 Hz, 4H), 6.72 (d, J=8.5 Hz, 4H)]

(3) Synthesis of Compound 60

Compound 60 according to an example may be synthesized by, for example, the steps shown in Reaction Formula 3 below:

[Reaction Formula 3]

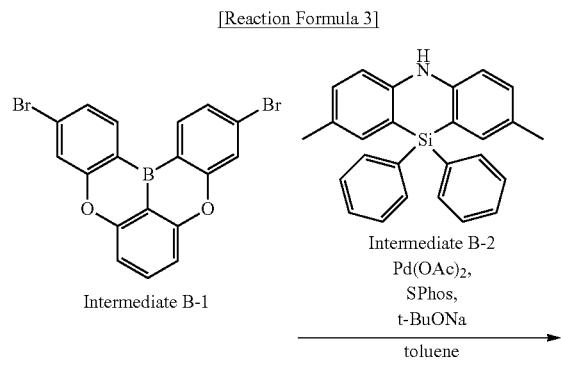

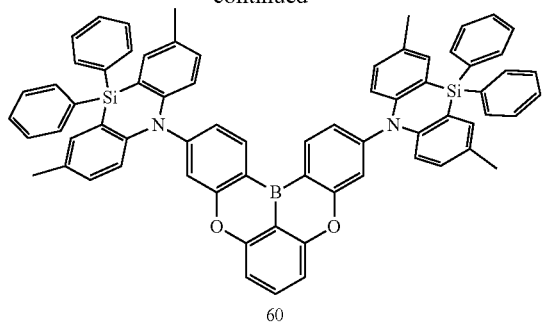

60

In a nitrogen atmosphere, Intermediate B-1 (0.51 g, 2.00 mmol), Intermediate B-2 (0.88 g, 2.32 mmol), Pd(dba$_2$)$_3$ (0.10 g, 0.10 mmol), SPhos (0.04 g, 0.10 mmol) and t-BuONa (0.32 g, 2.00 mmol) were refluxed in toluene for 3 hours. The reaction mixture was cooled to room temperature and filtered using a celite pad. The filtrate was concentrated under reduced pressure. The crude product was purified by a silica gel column chromatography (using eluent having a 2:1 volume ratio of hexane and chloroform) to obtain Compound 60 which is a light yellow solid (0.12 g, yield 11%). Compound 60 was identified with NMR analysis. [$^1$H NMR (500 MHz, CDCl$_3$, δ): 8.74 (d, J=8.4 Hz, 2H), 7.80 (t, J=8.2 Hz, 1H), 7.65 (dd, J=7.6, 1.6 Hz, 8H), 7.43-7.88 (m, 18H), 7.23-7.19 (m, 4H), 7.09 (dd, J=8.8, 2.0 Hz, 4H), 6.74 (d, J=8.4 Hz, 4H), 2.29 (s, 12H)]

2. Evaluation of Compound Characteristics

The results of quantum chemistry calculations with respect to Examples and Comparative Example Compounds below are shown. With respect to Examples and Comparative Example Compounds, the structural optimization of B3LYP/6-31G(d) was performed by using Gaussian09 Rev.D.01, and TD-DFT of B3LYP/6-31G(d) was performed to obtain the lowest singlet exciton energy level (S1) and the lowest triplet exciton energy level (T1). The obtained lowest singlet exciton energy level (S1) and lowest triplet exciton energy level (T1) are listed for comparison. The difference between S1 and T1 energy are expressed as $\Delta E_{ST}$.

The compounds used in Examples and Comparative Examples which are used in the evaluation are listed in Table 1 below:

TABLE 1

Compound 1

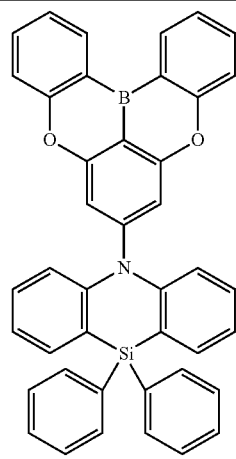

1

TABLE 1-continued
Compound 55
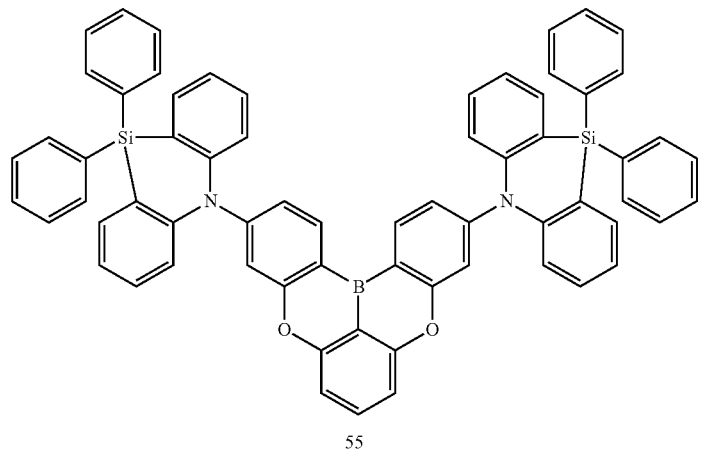 [SMILES: c1ccc([Si]2(c3ccccc3)c3ccccc3N(c3ccc4c(c3)Oc3cccc5c3B4c3ccc(N4c6ccccc6[Si](c6ccccc6)(c6ccccc6)c6ccccc64)cc3O5)c3ccccc32)cc1]
55
Compound 60
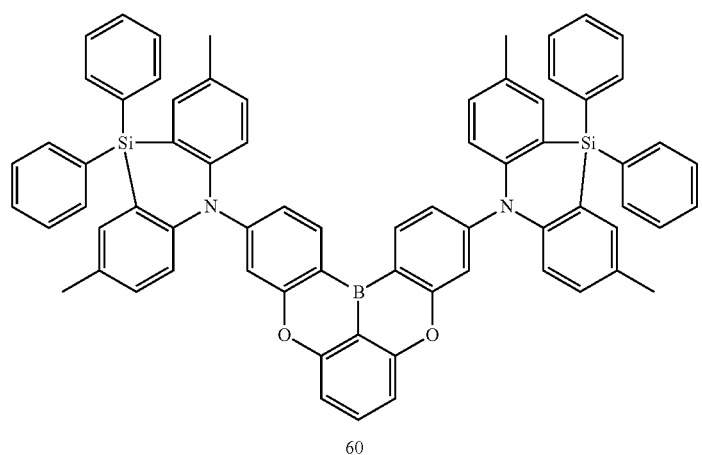 [SMILES: Cc1ccc2c(c1)[Si](c1ccccc1)(c1ccccc1)c1cc(C)ccc1N2c1ccc2c(c1)Oc1cccc3c1B2c1ccc(N2c4ccc(C)cc4[Si](c4ccccc4)(c4ccccc4)c4cc(C)ccc42)cc1O3]
60
Compound 65
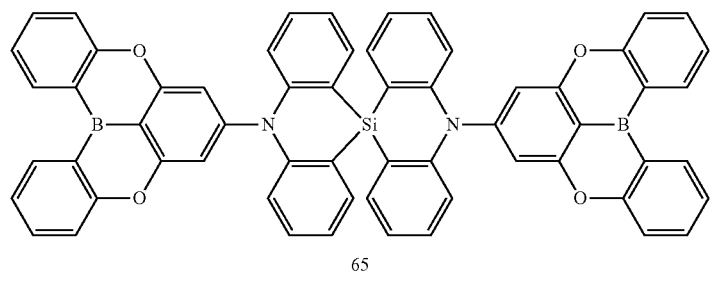 [SMILES: c1ccc2c(c1)Oc1cc(N3c4ccccc4[Si]4(c5ccccc53)c3ccccc3N(c3cc5c6c(c3)Oc3ccccc3B6c3ccccc3O5)c3ccccc34)cc3c1B2c1ccccc1O3]
65

TABLE 1-continued
| | |
|---|---|
| Comparative Example Compound C1 | 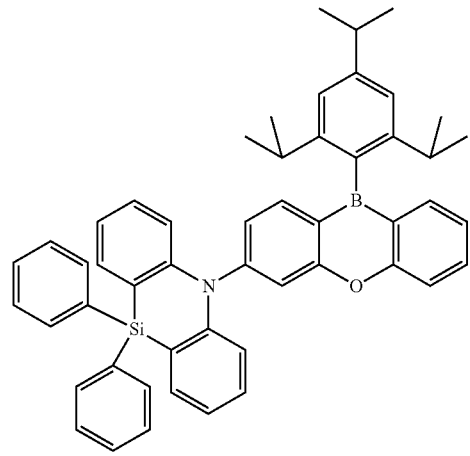 C1 |
| Comparative Example Compound C2 | 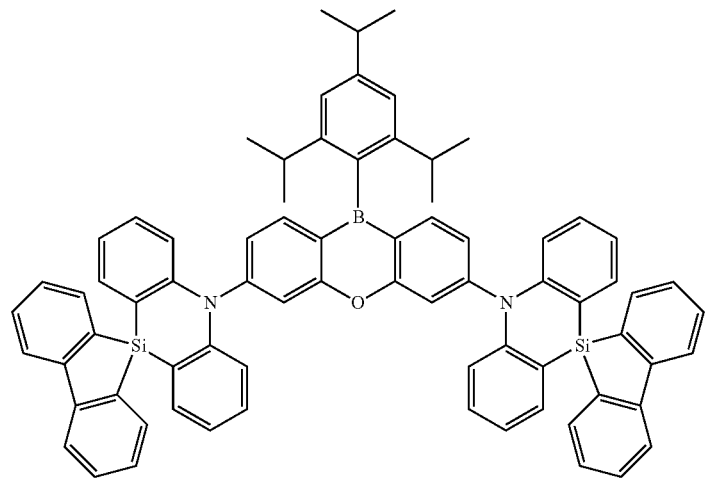 C2 |
| Comparative Example Compound C3 | 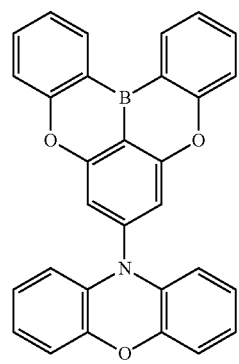 C3 |

TABLE 1-continued

| | |
|---|---|
| Comparative Example Compound C4 | 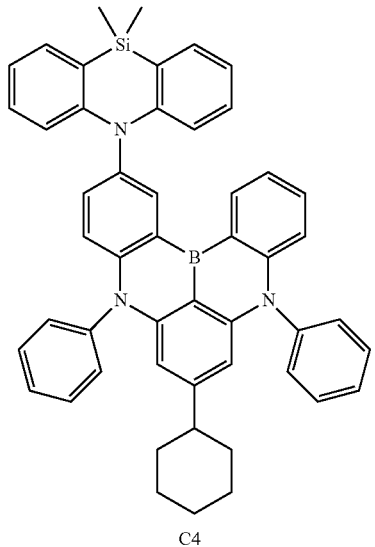<br>C4 |
| Comparative Example Compound C5 | 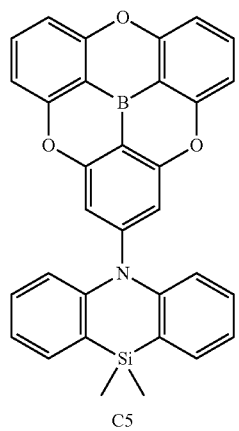<br>C5 |

The results of quantum chemistry calculations with respect to Examples and Comparative Example Compounds are listed in Table 2.

TABLE 2

| Compound | S1 (eV) | T1 (eV) | $\Delta E_{ST}$ (eV) |
|---|---|---|---|
| 1 | 2.7410 | 2.7351 | 0.0059 |
| 55 | 2.6618 | 2.6575 | 0.0043 |
| 60 | 2.5296 | 2.5228 | 0.0068 |
| 65 | 2.7078 | 2.7022 | 0.0056 |
| C1 | 2.7662 | 2.7572 | 0.0090 |
| C2 | 2.6278 | 2.6198 | 0.0080 |
| C3 | 2.2335 | 2.2265 | 0.0070 |
| C4 | 3.0613 | 2.6170 | 0.4443 |
| C5 | 2.9278 | 2.9196 | 0.0082 |

Referring to the results of Table 2, it may be confirmed that the compounds of Examples show $\Delta E_{ST}$ values of 0.01 or less. Thus, it may be confirmed that Example Compounds have small $\Delta E_{ST}$ values and thus may be used as a thermally activated delayed fluorescence dopant. It is believed that Example Compounds have smaller $\Delta E_{ST}$ values compared to Comparative Example Compounds, and thus Example Compounds exhibit improved light emission emitting efficiency characteristics compared to Comparative Example Compounds.

3. Evaluation of Compound Fluorescence Characteristics

With respect to Examples and Comparative Example Compounds, the fluorescence quantum yield and fluorescence lifetime were evaluated. Samples for evaluation of fluorescence characteristics were prepared by depositing, on a quartz substrate, a composition including Example and Comparative Example Compounds for evaluation to form an organic film. Evaluation of the prepared samples were performed in an inert gas atmosphere. In the preparation of samples, DPEPO or PPF was used as a host material. In the prepared sample composition, an Example or Comparative Example Compound was contained to be 12 wt % to 50 wt % based on the total weight of the composition.

The fluorescence emission characteristics were evaluated by measuring fluorescence emission spectra using a V-670 spectrometer from JASCO. The fluorescence quantum yield was determined by using a JASCO ILF-835 integrating sphere system using the same samples.

TABLE 3

| Compound | PL$\lambda_{max}$ (nm) | PLQY (%) | Tau delay/μsec |
|---|---|---|---|
| 1 | 451 | 81 | 1.9 |
| 55 | 465 | 98 | 2.3 |
| 60 | 484 | 99 | 1.6 |
| C1 | 439 | 68 | 6.0 |
| C2 | 453 | 75 | 4.5 |
| C3 | 492 | 92 | 2.6 |

Referring to the results of Table 3, it may be confirmed that Example Compounds emit deep blue light having the maximum emission wavelength of less than or equal to about 490 nm. It may be confirmed that Example Compounds exhibit fluorescence efficiency of 80% or greater to exhibit good light emission efficiency characteristics. The Example Compounds exhibit smaller delay time (Tau delay) compared to Comparative Example Compounds, and thus it may be predicted that delayed fluorescence efficiency of Example Compounds is more increased compared to Comparative Example Compounds.

4. Manufacture and Evaluation of Organic Electroluminescence Device

An evaluation of the organic electroluminescence device of an embodiment including the compound of an embodiment in the emission layer was carried out as follows. The method for manufacturing the organic electroluminescence device for the evaluation of the device is described below.

Compounds 1, 55, and 60 as described above were used as a dopant material of the emission layer to manufacture the organic electroluminescence devices of Examples 1 to 3, respectively. Comparative Examples 1 and 2 are the organic electroluminescence devices manufactured by using each of Comparative Example Compounds C1 and C2 as a dopant material of the emission layer, respectively.

(Manufacture of Organic Electroluminescence Device)

The organic electroluminescence devices of Examples and Comparative Examples were manufactured as follows. An ITO was patterned on a glass substrate to form a first electrode. HAT-CN was deposited to a thickness of about 100 Å to form a hole injection layer, TAPC was deposited to a thickness of about 500 Å to form a hole transport layer, and a 100 Å-thick electron blocking layer EBL was formed with mDCP. In the formation of an emission layer, an Example Compound and PPF were co-deposited in a ratio of about 20:80 to form a 200 Å-thick layer. For example, the emission layer formed by co-depositing was deposited by mixing an Example Compound and PPF.

A 100 Å-thick layer was formed on the emission layer by using PPF, a 300 Å-thick layer was formed with B3PyPB, and a 10 Å-thick layer was formed with LiF to form an electron transport region. A second electrode having a thickness of about 1,000 Å was formed with aluminum (Al).

Compounds of each functional layer used in the manufacture of the organic electroluminescence devices are as follows.

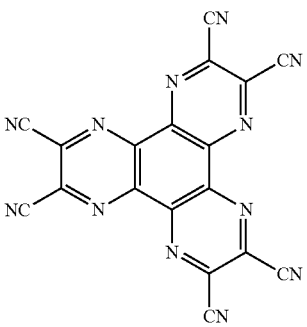

HAT-CN

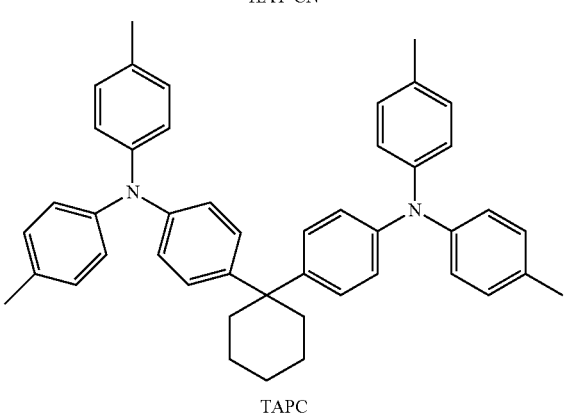

TAPC

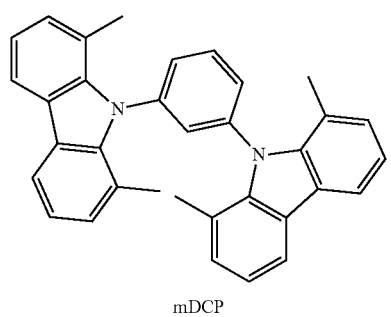

mDCP

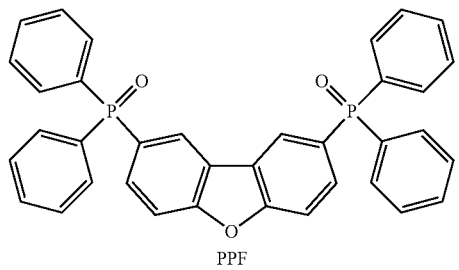

PPF

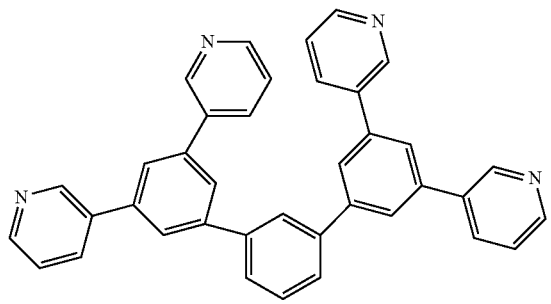

B3PyPB (Evaluation of Organic Electroluminescence Device Characteristics)

The evaluation results of the organic electroluminescence devices of Examples and Comparative Examples are listed in Table 4. A maximum emission wavelength ($\lambda_{max}$) and an external quantum efficiency ($\eta$ext) of the manufactured organic electroluminescence devices are listed in Table 4 for comparison. In the evaluation results of Example and Comparative Example characteristics, the maximum emission wavelength ($\lambda_{max}$) represents the wavelength showing the maximum value in the emission spectrum.

TABLE 4

| Device manufactured examples | Dopant Material | $\lambda_{max}$ (nm) | $\eta$ext (%) |
| --- | --- | --- | --- |
| Example 1 | Example Compound 1 | 457 | 21.2 |
| Example 2 | Example Compound 55 | 464 | 31.7 |
| Example 3 | Example Compound 60 | 478 | 32.0 |
| Comparative Example 1 | Comparative Example Compound C1 | 445 | 15.7 |
| Comparative Example 2 | Comparative Example Compound C2 | 459 | 20.6 |

Referring to the results of Table 4, it may be confirmed that the organic electroluminescence devices of Examples emit light in a blue wavelength region of less than or equal to about 480 nm to exhibit high light emission efficiency characteristics. It may be confirmed that Examples 1 to 3 exhibit higher external quantum efficiency values compared to Comparative Examples.

The compound of an example may include at least one condensed cyclic unit containing a boron atom and at least one azasiline unit bonded to the condensed cyclic unit to facilitate the reverse intersystem crossing, thereby exhibiting excellent light emission efficiency. The organic electroluminescence device of an example may include the compound of an example in the emission layer to exhibit high light emission efficiency in a deep blue emission wavelength region.

The organic electroluminescence device of an embodiment may exhibit excellent light emission efficiency.

The compound of an embodiment may be contained in the emission layer of the organic electroluminescence device to contribute to high efficiency of the organic electroluminescence device.

Although the inventive concept has been described with reference to embodiments of the inventive concept, it will be understood that the inventive concept should not be limited to these embodiments but that various changes and modifications can be made by those skilled in the art without departing from the spirit and scope of the inventive concept.

Accordingly, the technical scope of the inventive concept is not intended to be limited to the contents set forth in the detailed description of the specification, but is intended to be defined by the claims.

What is claimed is:

1. An organic electroluminescence device comprising:
    a first electrode;
    a second electrode disposed on the first electrode; and
    an emission layer disposed between the first electrode and the second electrode, wherein
    the emission layer comprises a compound represented by Formula 1, and the compound is a thermally activated delayed fluorescence emitting material:

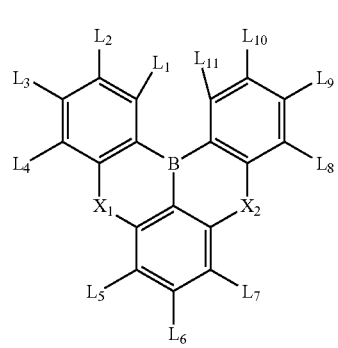

[Formula 1]

wherein in Formula 1,
$X_1$ and $X_2$ are each independently O or S,
at least one of $L_1$ to $L_{11}$ is a substituent represented by Formula 2-b, and
the remainder of $L_1$ to $L_{11}$ are each independently a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms:

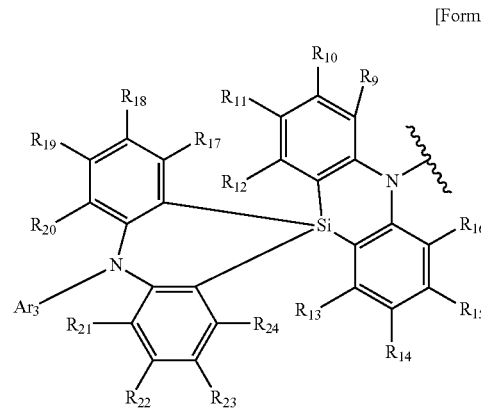

[Formula 2-b]

wherein in Formula 2-b,
$R_9$ to $R_{24}$ are each independently a hydrogen atom, a deuterium atom, a halogen atom, a cyano group, a substituted or unsubstituted amine group, a substituted or unsubstituted silyl group, a substituted or unsubstituted boron group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
$Ar_3$ is a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or a substituent represented by Formula 1, and when Ar₃ is a substituent represented by Formula 1, L₁ to L₁₁ in Ar₃ are each independently a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

2. The organic electroluminescence device of claim 1, wherein Formula 1 is represented by one of Formula 1-1 to Formula 1-3:

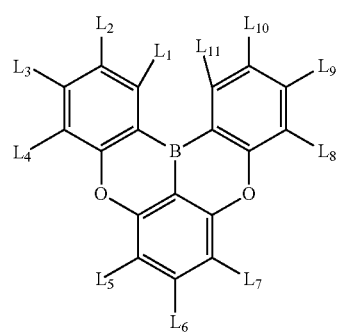

[Formula 1-1]

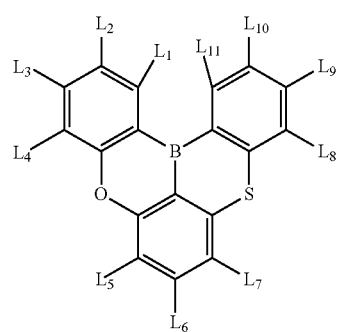

[Formula 1-2]

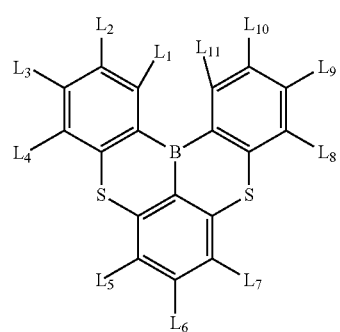

[Formula 1-3]

wherein in Formula 1-1 to Formula 1-3,

L₁ to L₁₁ are the same as defined in Formula 1.

3. The organic electroluminescence device of claim 1, wherein Formula 1 is represented by one of Formula 1A to Formula 1E:

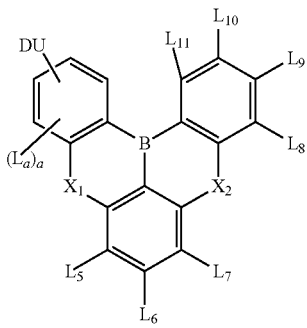

[Formula 1A]

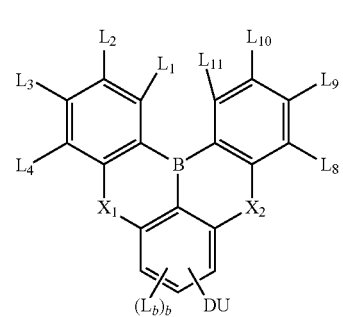

[Formula 1B]

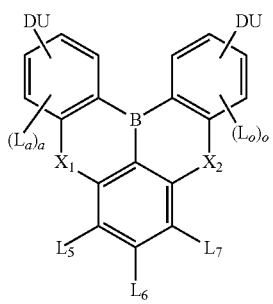

[Formula 1C]

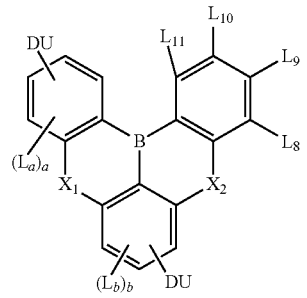

[Formula 1D]

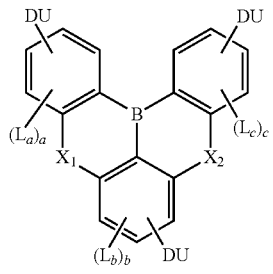

[Formula 1E]

wherein in Formula 1A to Formula 1E, a to c are each independently an integer from 0 to 3, X₁ and X₂ are the same as defined in Formula 1, L_a to L_c and L₁ to L₁₁ are each independently a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and DU is represented by Formula 2-b.

4. The organic electroluminescence device of claim 1, wherein Formula 1 is represented by Formula 1F:

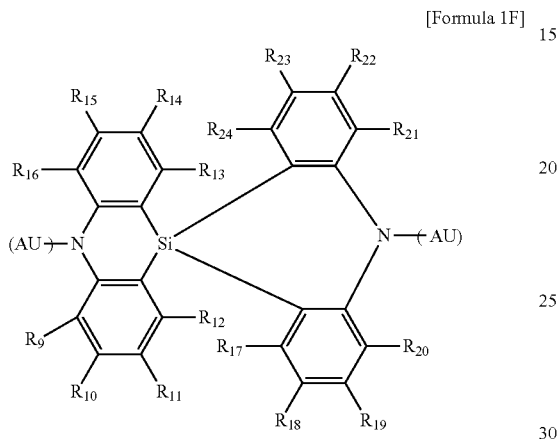

[Formula 1F]

wherein in Formula 1F, $R_9$ to $R_{24}$ are the same as defined in Formula 2-b, and AU is a substituent represented by Formula 1, except that AU is not substituted with a substituent represented by Formula 2-b.

5. The organic electroluminescence device of claim 1, wherein Formula 1 is represented by one of Formula 1F-1 to Formula 1F-3:

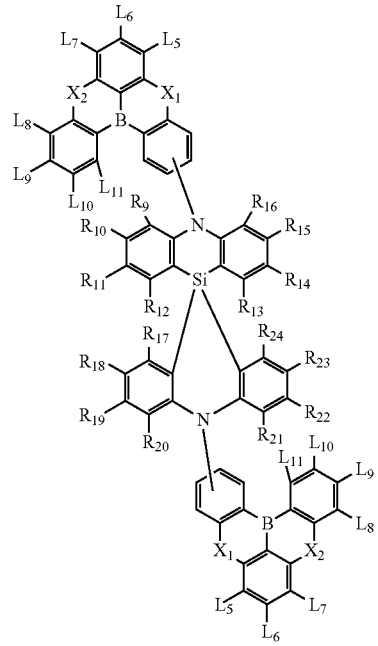

[Formula 1F-1]

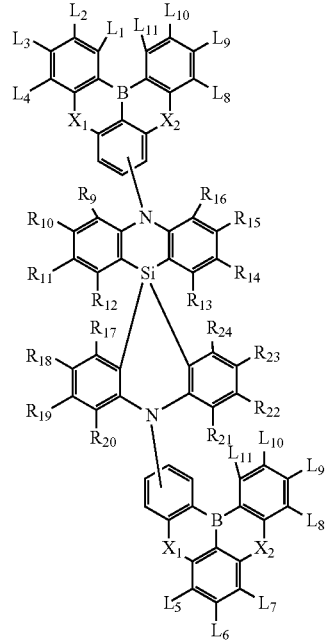

[Formula 1F-2]

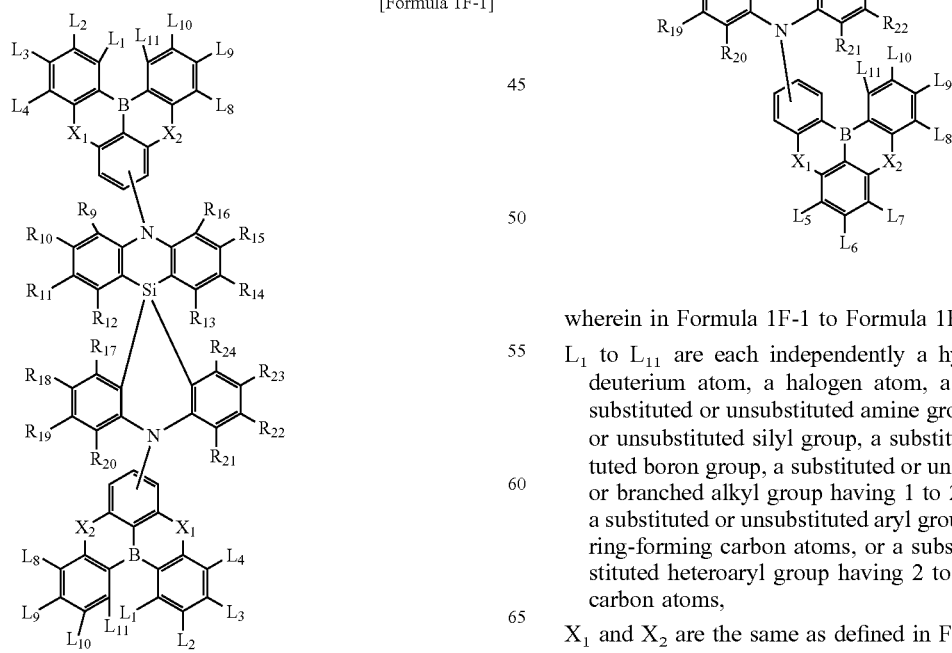

[Formula 1F-3]

wherein in Formula 1F-1 to Formula 1F-3, $L_1$ to $L_{11}$ are each independently a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $X_1$ and $X_2$ are the same as defined in Formula 1, and $R_9$ to $R_{24}$ are the same as defined in Formula 2-b.

6. The organic electroluminescence device of claim 1, wherein
   the organic electroluminescence device further includes a capping layer disposed on the second electrode, and
   the capping layer has a refractive index of greater than or equal to about 1.6.

7. The organic electroluminescence device of claim 1, wherein
   the emission layer is a delayed fluorescence emission layer containing a host and a dopant, and
   the dopant comprises the compound represented by Formula 1.

8. The organic electroluminescence device of claim 1, wherein the emission layer emits light having a center wavelength in a range of about 430 nm to about 490 nm.

9. The organic electroluminescence device of claim 1, wherein
   a $\Delta E_{ST}$ value of the compound is 0.01 eV or less, and
   $\Delta E_{ST}$ value is a difference between a lowest singlet exciton energy level (S1) of the compound and a lowest triplet exciton energy level (T1) of the compound.

10. An organic electroluminescence device comprising:
    a first electrode;
    a second electrode disposed on the first electrode; and
    an emission layer disposed between the first electrode and the second electrode, wherein
    the emission layer comprises at least one of the compounds represented by Compound Group 1:

[Compound Group 1]

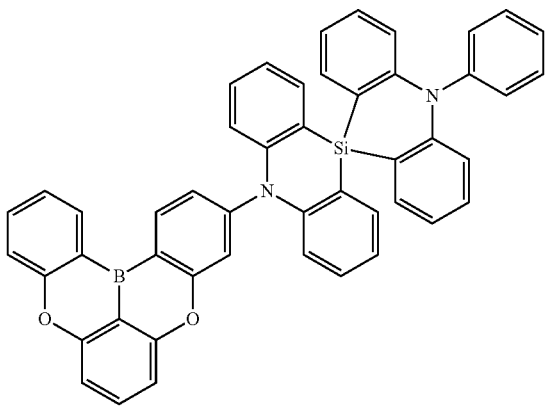

14

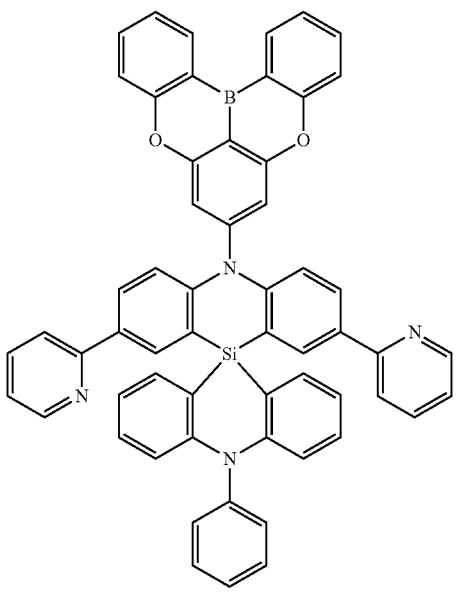

25

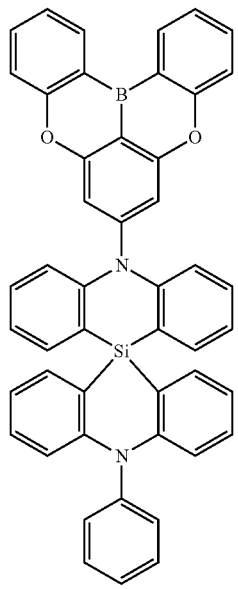

11

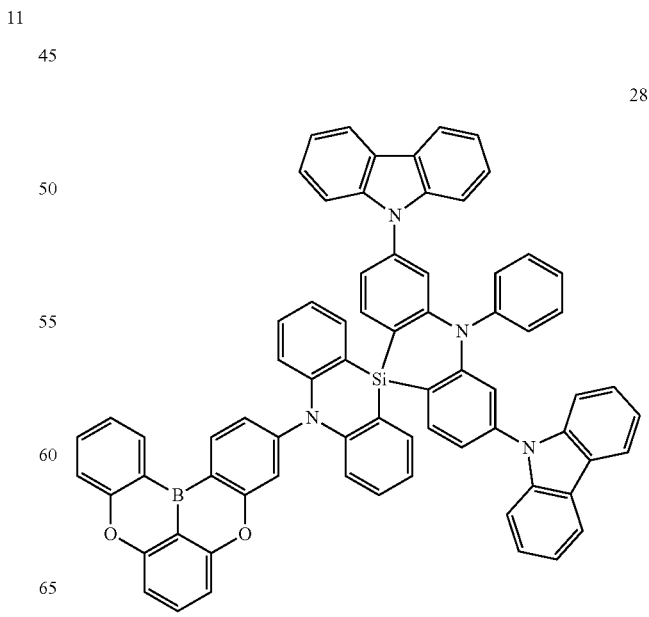

28

131
-continued
65
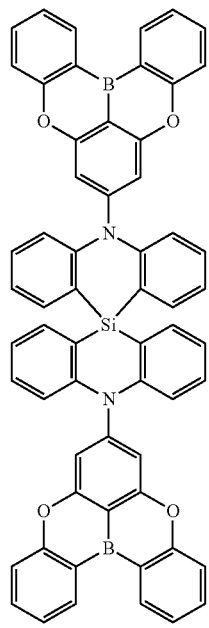
132
-continued
67
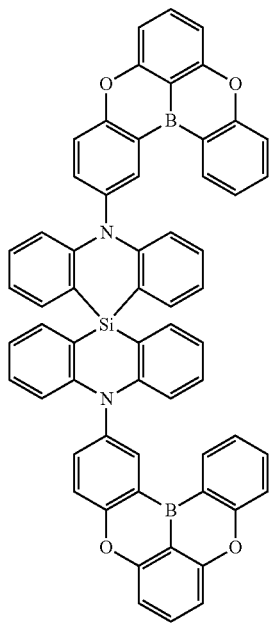
66
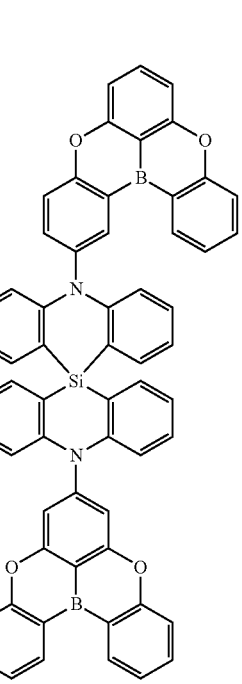
68
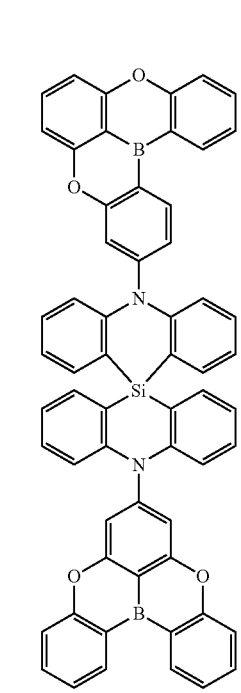

133
-continued
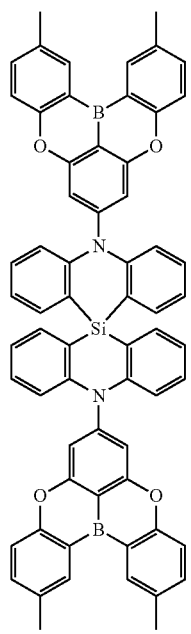
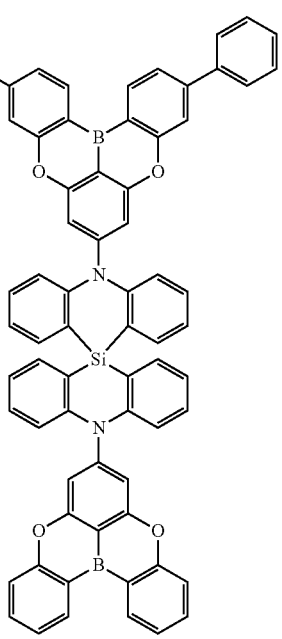
134
-continued
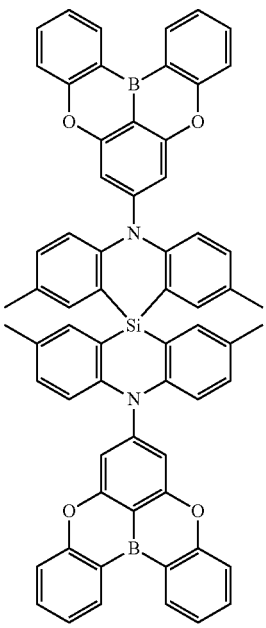
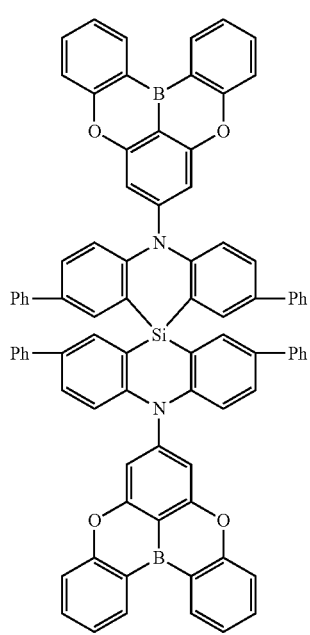

83
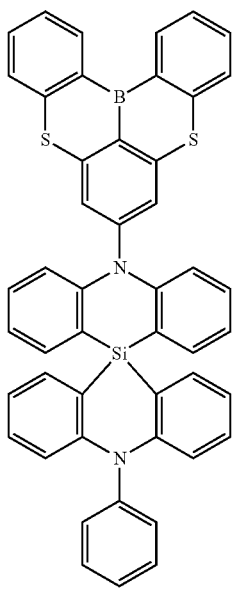
86
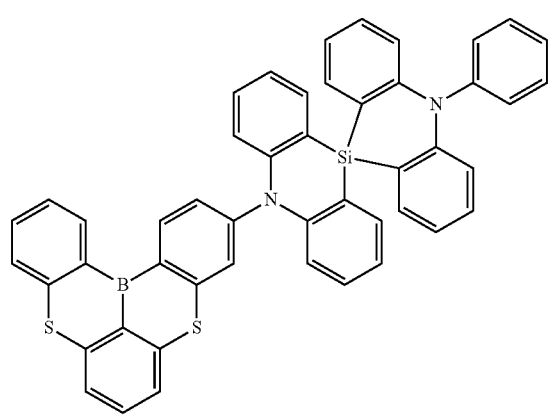
97
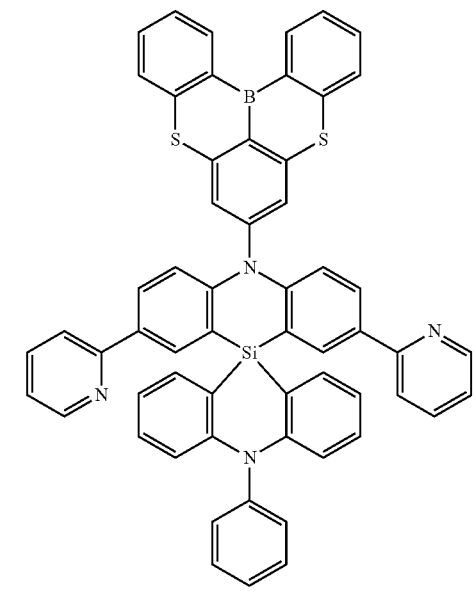
100
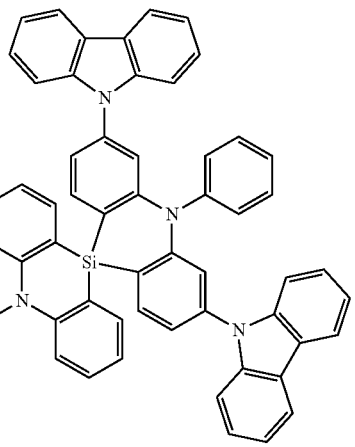
137
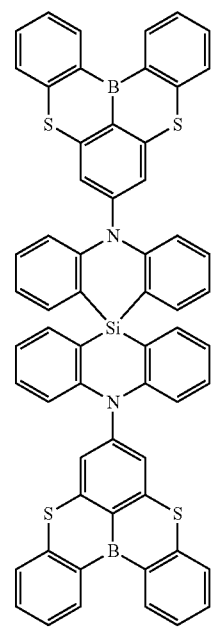

-continued
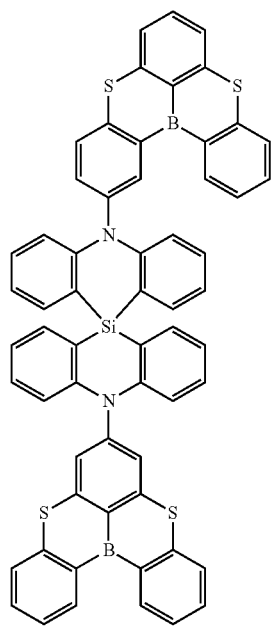
138
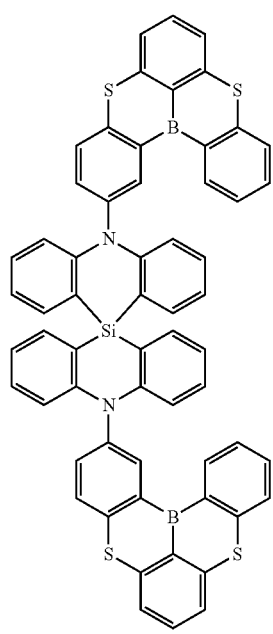
139
-continued
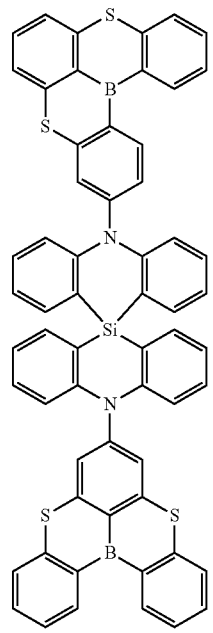
140
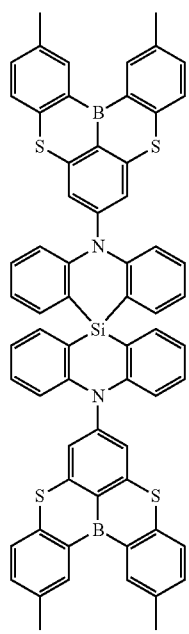
141

139
140
-continued
-continued
142
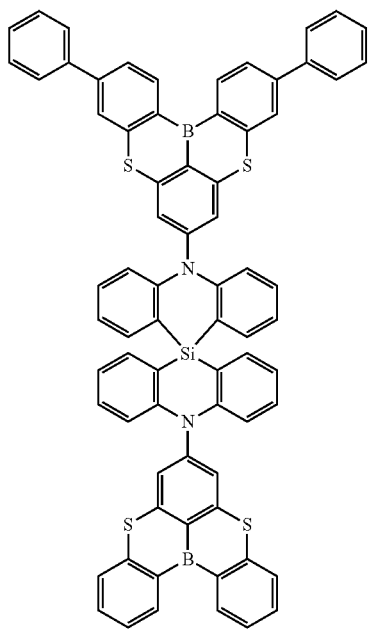
144
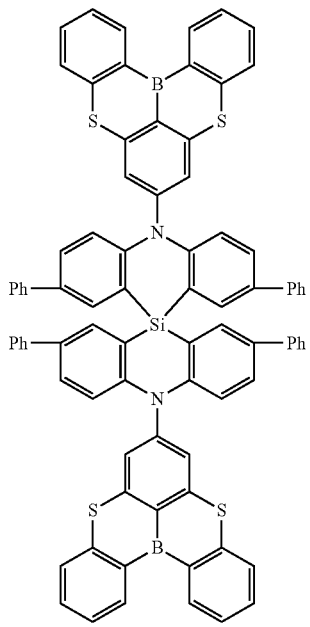
143
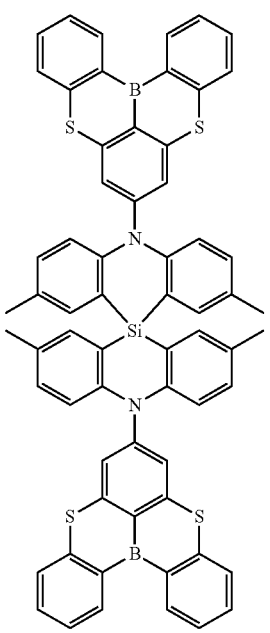
158
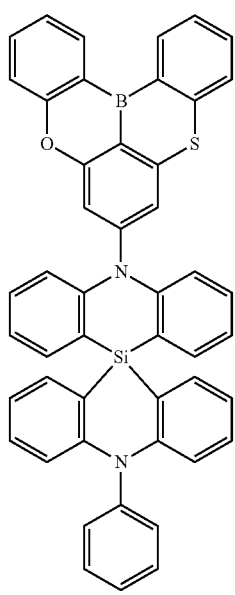
161
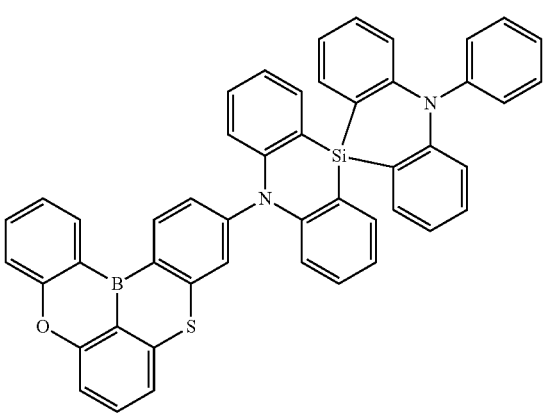

178
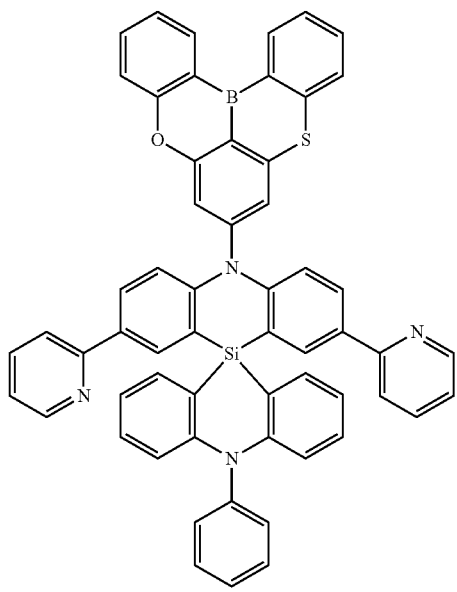
181
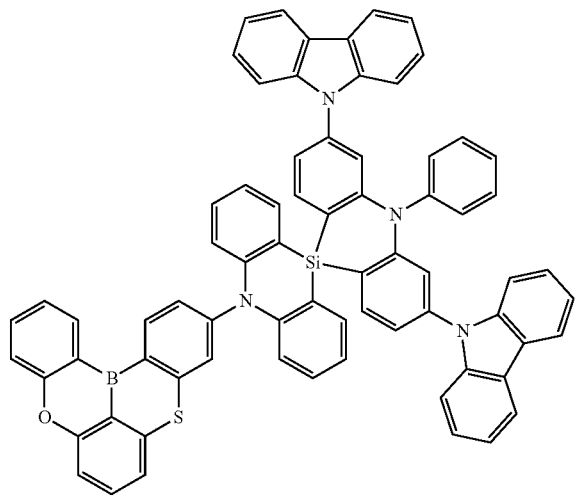
227
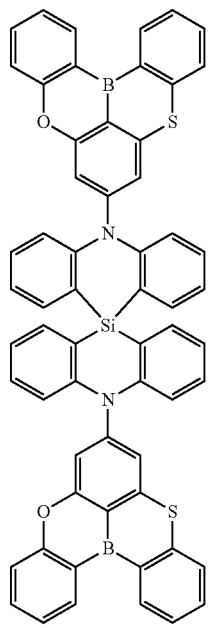
228
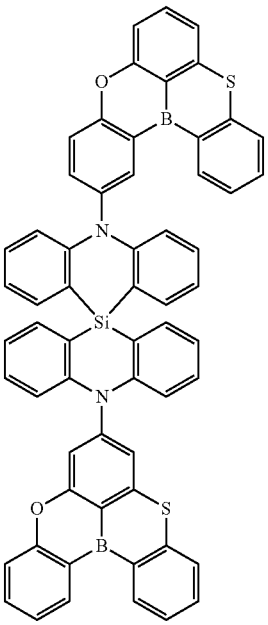

229
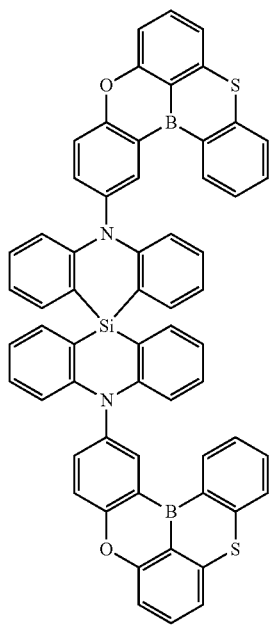
230
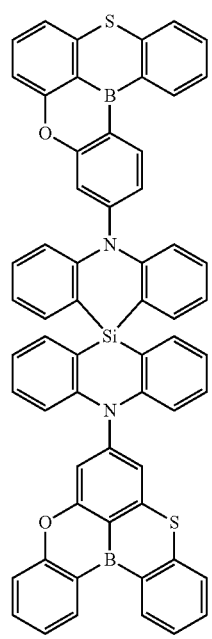
231
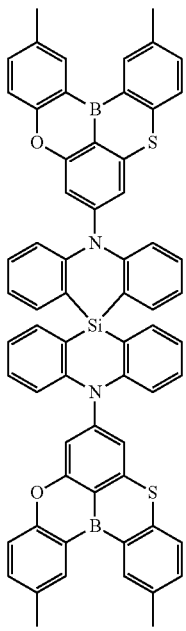
232
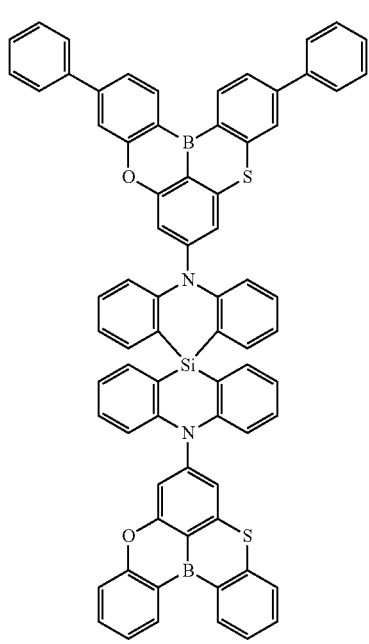

-continued

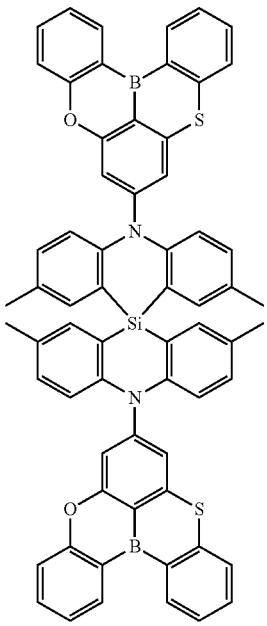

233

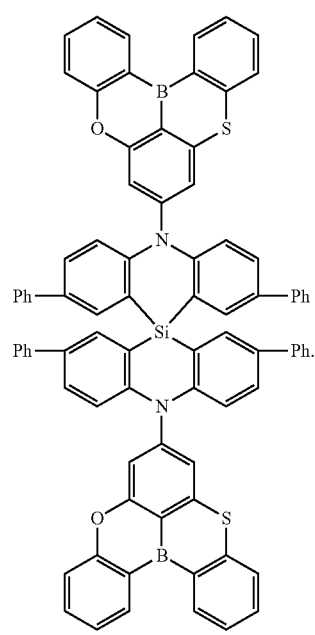

234

11. A compound represented by Formula 1:

[Formula 1]

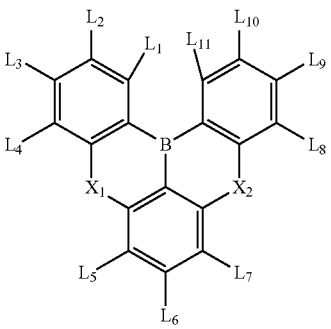

wherein in Formula 1,
$X_1$ and $X_2$ are each independently O or S, and
at least one of $L_1$ to $L_{11}$ is a substituent represented by Formula 2-b, and
the remainder of $L_1$ to $L_{11}$ are each independently a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms:

[Formula 2-b]

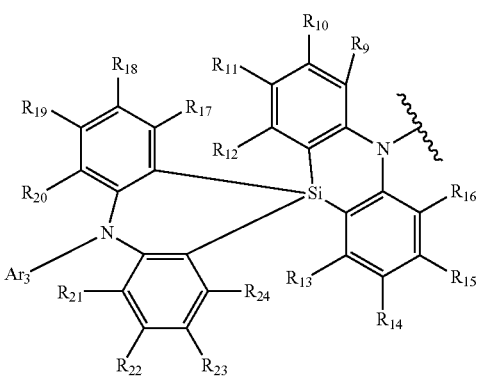

wherein in Formula 2-b,
$R_9$ to $R_{24}$ are each independently a hydrogen atom, a deuterium atom, a halogen atom, a cyano group, a substituted or unsubstituted amine group, a substituted or unsubstituted silyl group, a substituted or unsubstituted boron group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
$Ar_3$ is a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or a substituent represented by Formula 1, when Ar₃ is a substituent represented by Formula 1, $L_1$ to $L_{11}$ in Ar₃ are each independently a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and wherein the compound is a thermally activated delayed fluorescence emitting material.

12. The compound of claim 11, wherein Formula 1 is represented by one of Formula 1-1 to Formula 1-3:

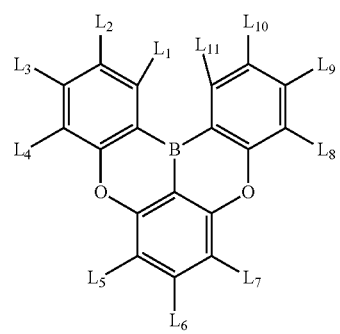

[Formula 1-1]

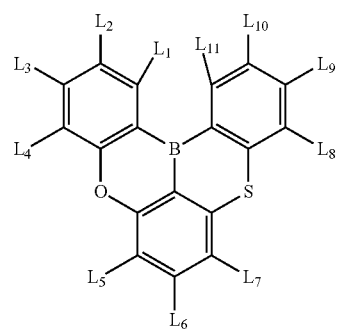

[Formula 1-2]

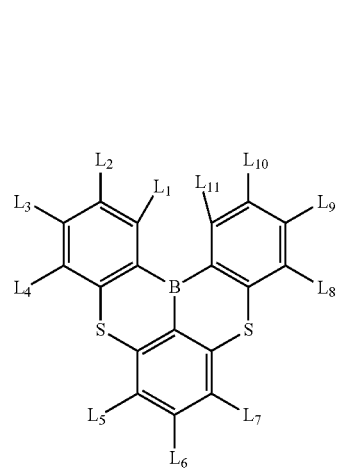

[Formula 1-3]

wherein in Formula 1-1 to Formula 1-3, $L_1$ to $L_{11}$ are the same as defined in Formula 1.

13. The compound of claim 11, wherein Formula 1 is represented by one of Formula 1A to Formula 1E:

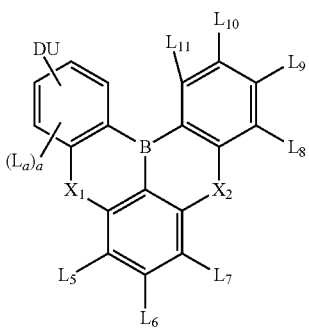

[Formula 1A]

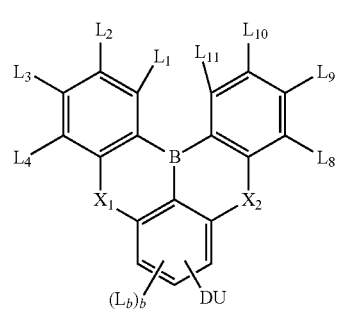

[Formula 1B]

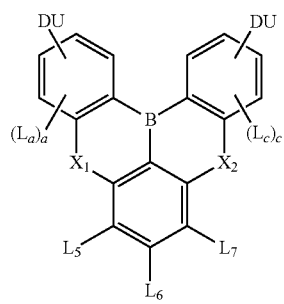

[Formula 1C]

-continued

[Formula 1D]

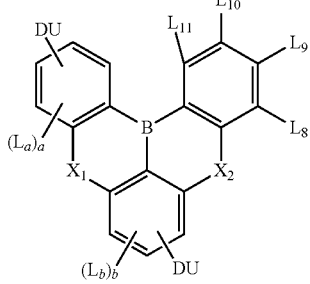

[Formula 1E]

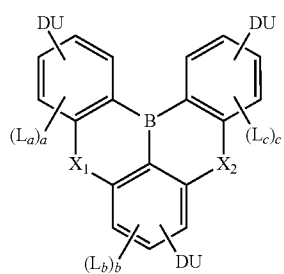

wherein in Formula 1A to Formula 1E, a to c are each independently an integer from 0 to 3, $X_1$ and $X_2$ are the same as defined in Formula 1, $L_a$ to $L_c$ and $L_1$ to $L_{11}$ are each independently a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and DU is represented by Formula 2-b.

14. The compound of claim 11, wherein Formula 1 is represented by Formula 1F:

[Formula 1F]

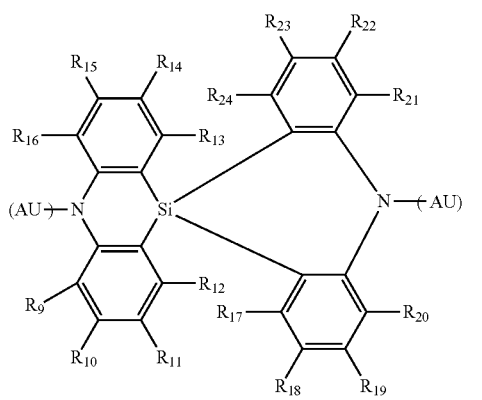

wherein in Formula 1F, $R_9$ to $R_{24}$ are the same as defined in Formula 2-b, and AU is a substituent represented by Formula 1, except that AU is not substituted with a substituent represented by Formula 2-b.

15. The compound of claim 11, wherein Formula 1 is represented by one of Formula 1F-1 to Formula 1F-3:

[Formula 1F-1]

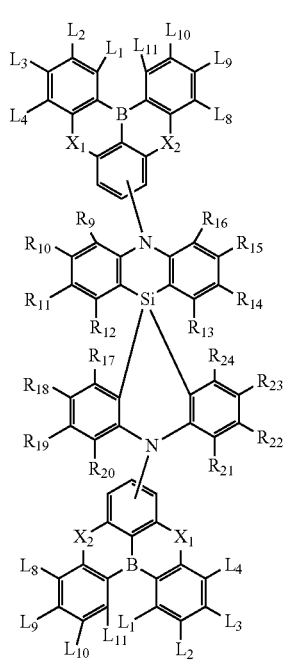

[Formula 1F-2]

-continued

[Formula 1F-3]

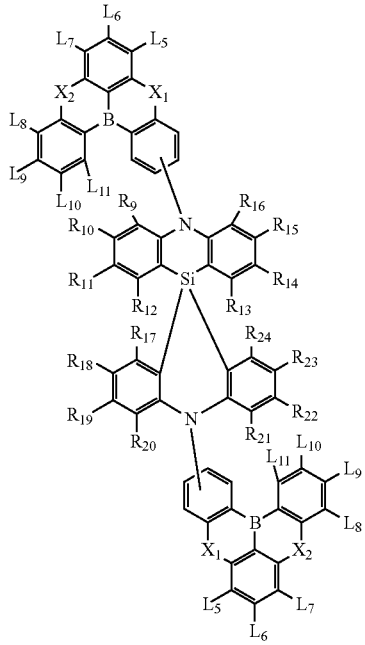

wherein in Formula 1F-1 to Formula 1F-3,

L₁ to L₁₁ are each independently a hydrogen atom, a deuterium atom, a halogen atom, a cyano group, a substituted or unsubstituted amine group, a substituted or unsubstituted silyl group, a substituted or unsubstituted boron group, a substituted or unsubstituted linear or branched alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $X_1$ and $X_2$ are the same as defined in Formula 1, and $R_9$ to $R_{24}$ are the same as defined in Formula 2-b.

16. The compound of claim 11, wherein in Formula 1, at least one hydrogen atom is substituted with a deuterium atom.

17. The compound of claim 11, wherein the compound represented by Formula 1 is a blue luminescent material.

18. The compound of claim 11, wherein a $\Delta E_{ST}$ value of the compound is 0.01 eV or less, and $\Delta E_{ST}$ value is a difference between a lowest singlet exciton energy level (S1) of the compound and a lowest triplet exciton energy level (T1) of the compound.

19. A compound that is selected from one of the compounds of Compound Group 1:

[Compound Group 1]

11

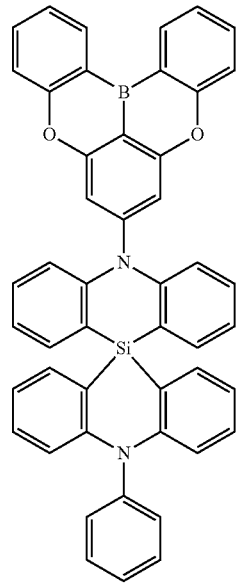

14

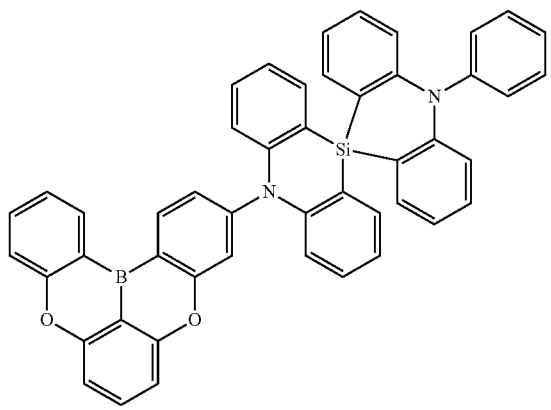

25

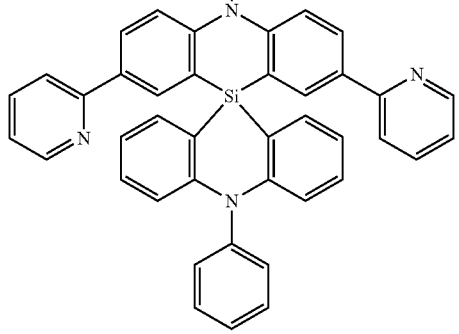

28
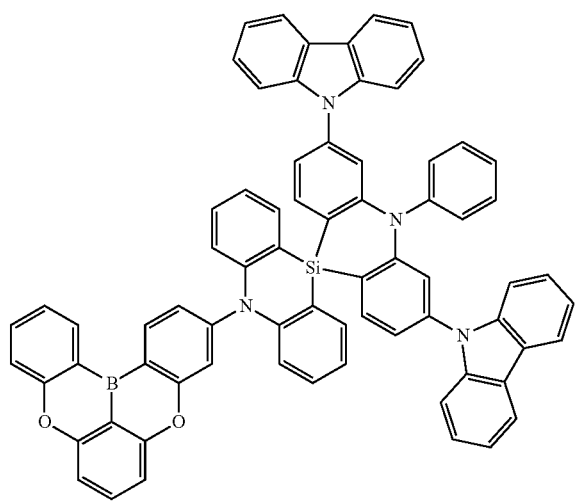
66
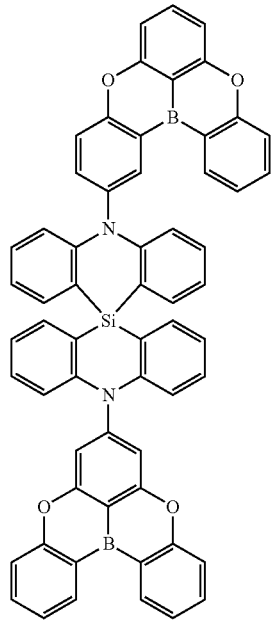
65
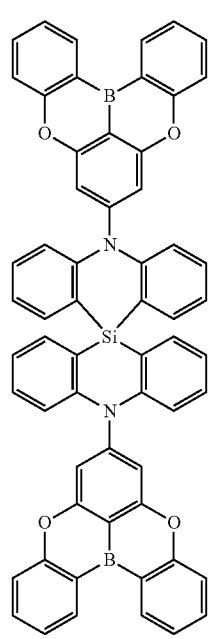
67
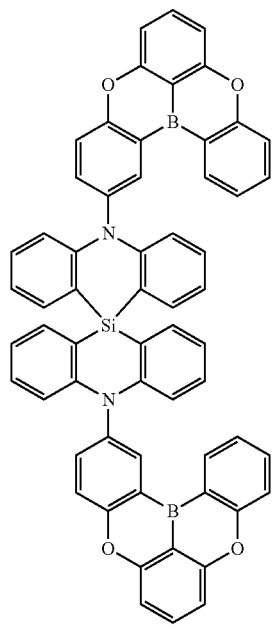

155
-continued
68
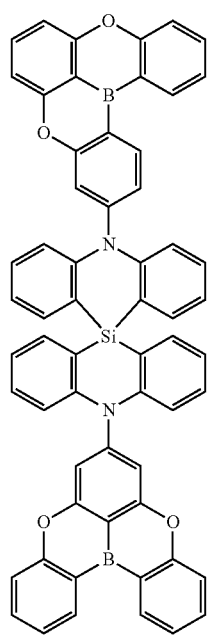
69
156
-continued
70
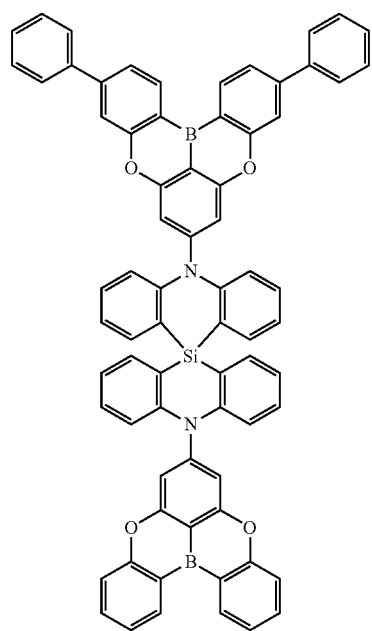
71
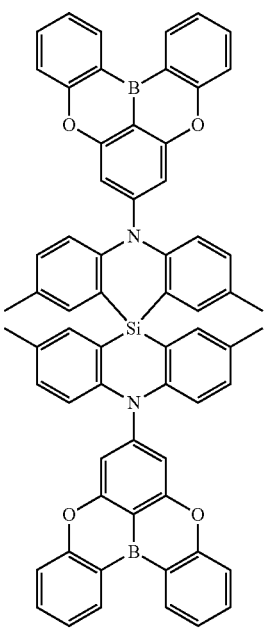

72
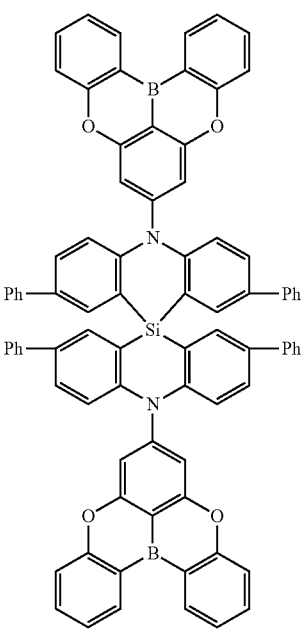
83
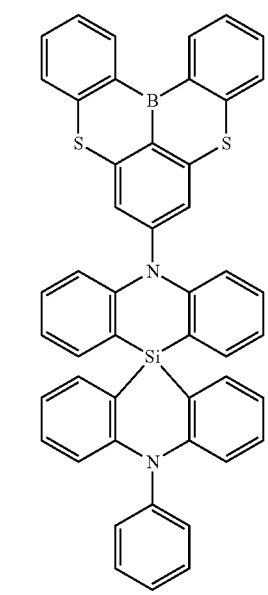
86
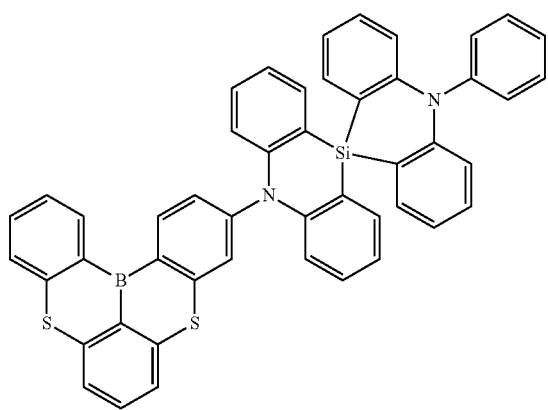
97
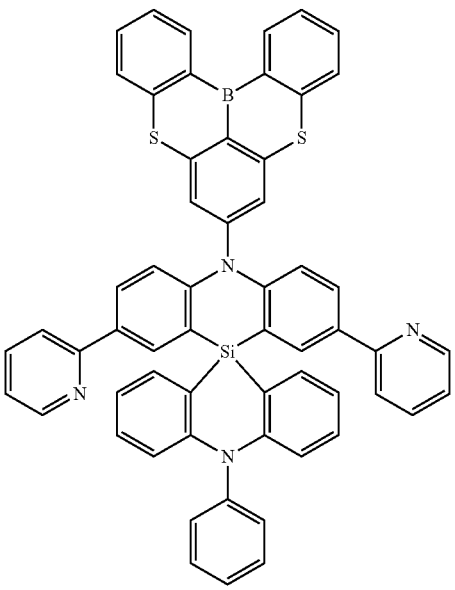
100
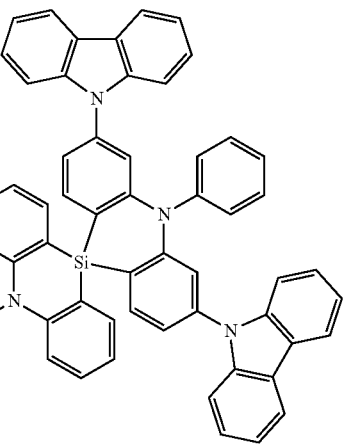

137
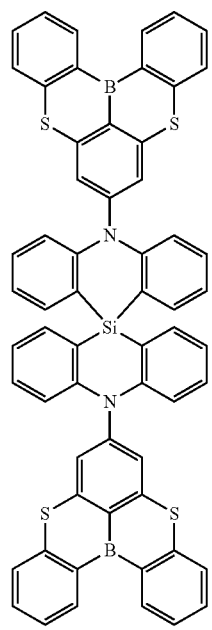
138
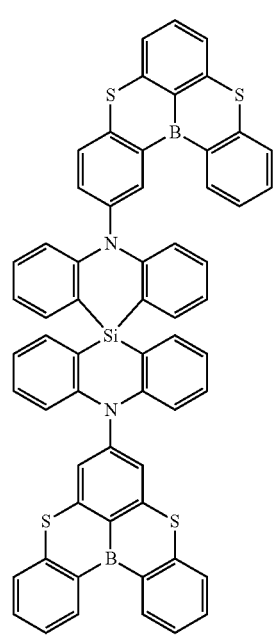
139
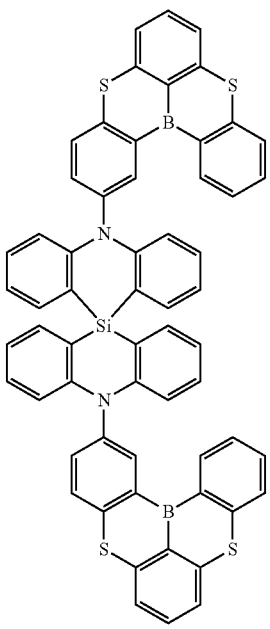
140
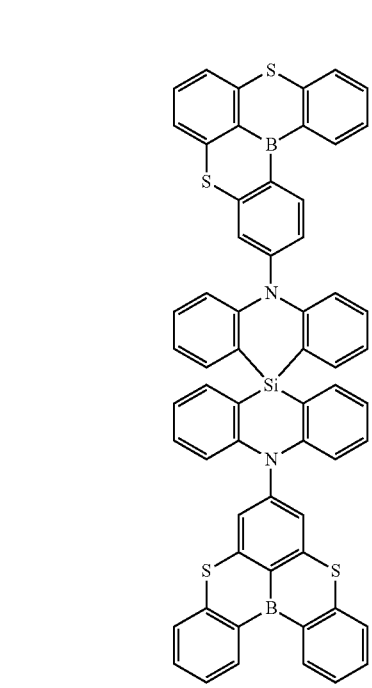

-continued
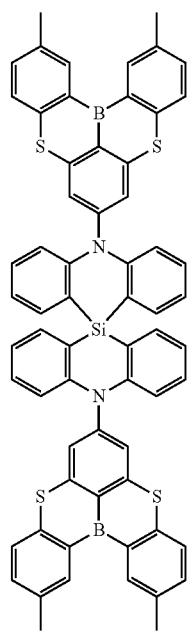
141
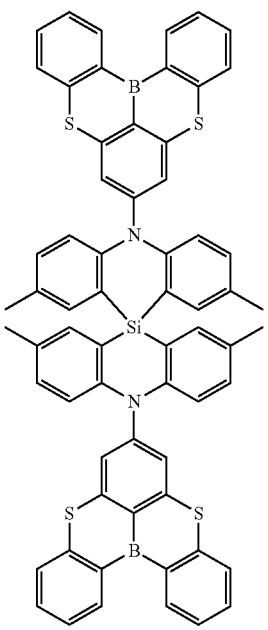
143
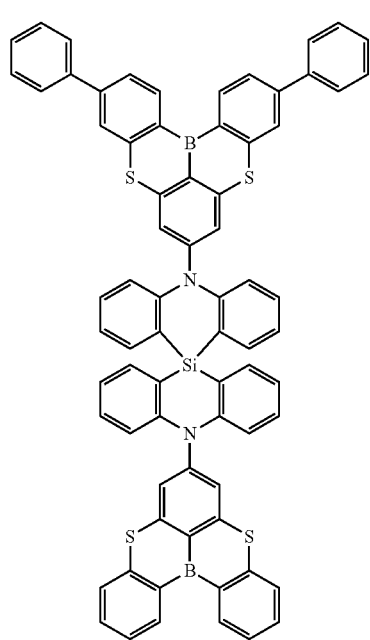
142
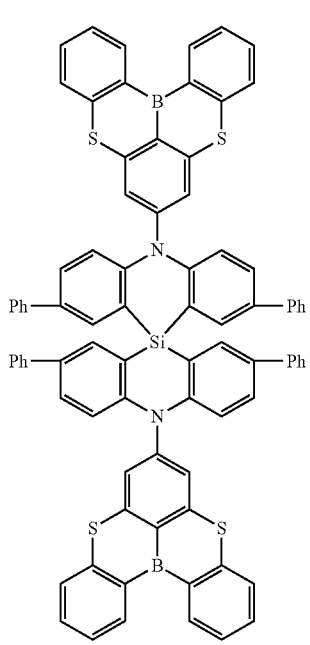
144

158
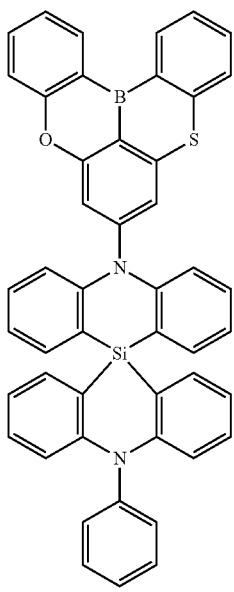
178
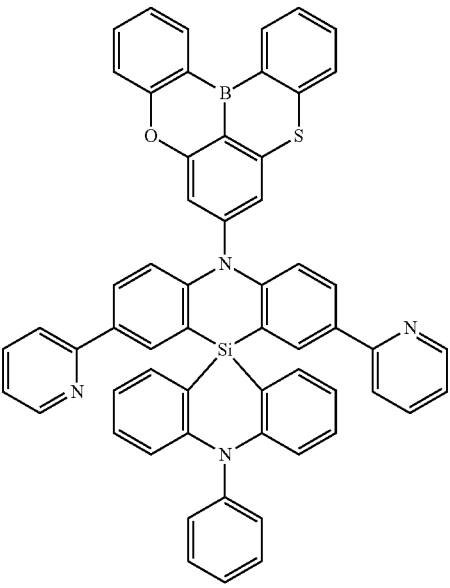
161
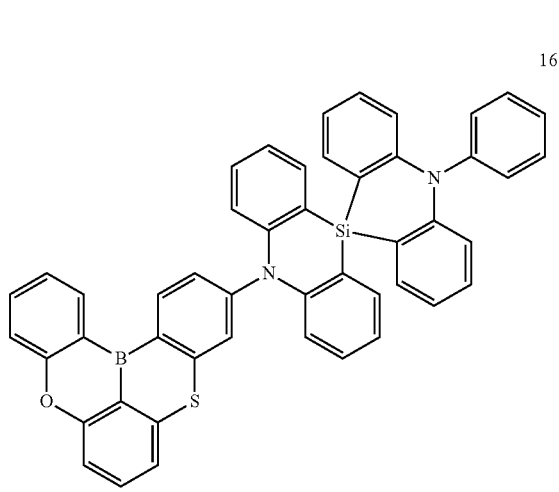
181
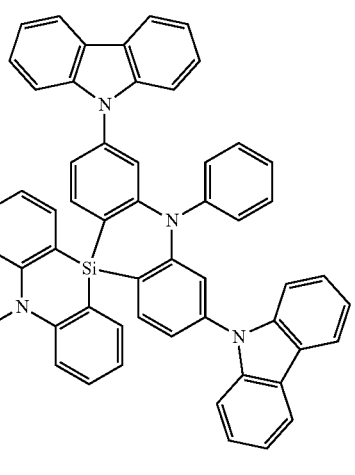

227
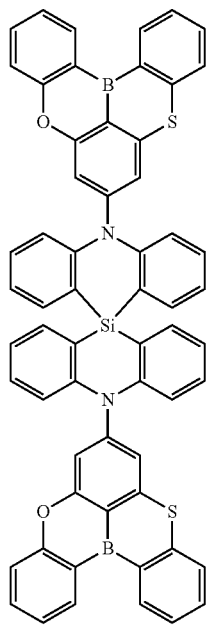
228
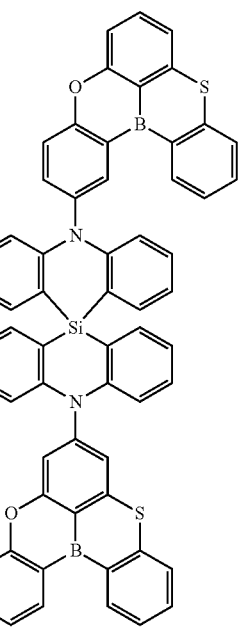
229
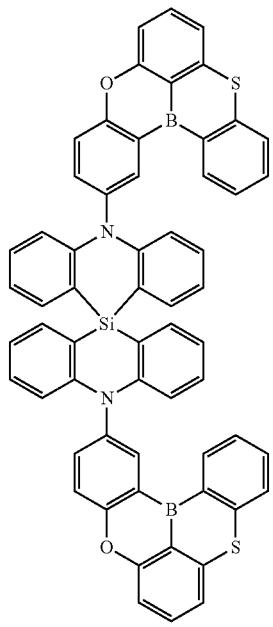
230
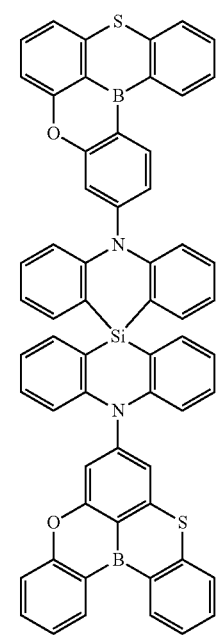

231
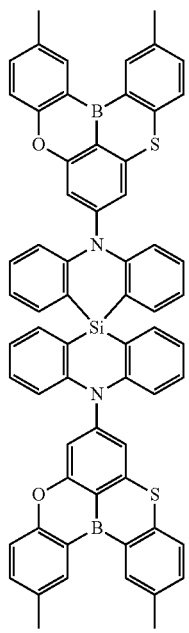
232
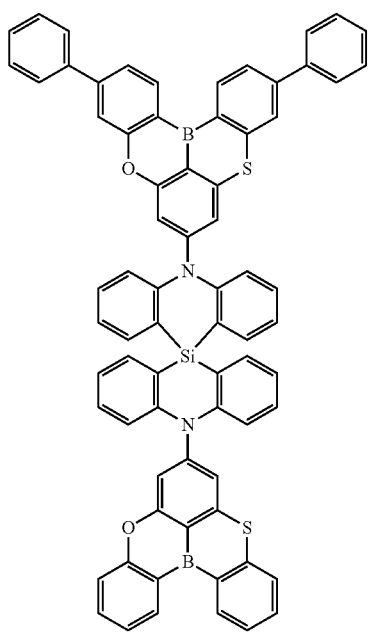
233
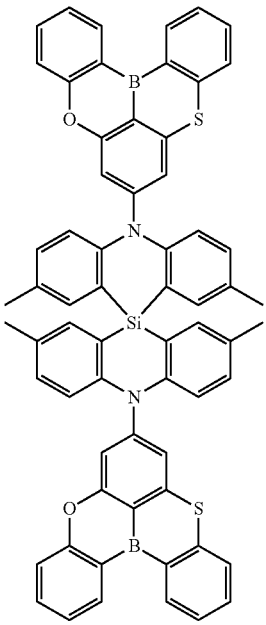
234
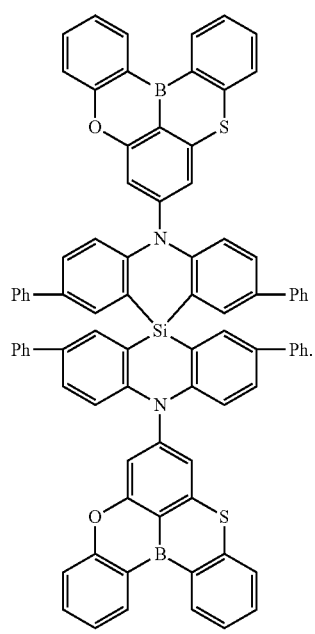
* * * * *